United States Patent
Ayzner

(10) Patent No.: US 11,682,742 B2
(45) Date of Patent: Jun. 20, 2023

(54) COMPLEMENTARY CONJUGATED POLYELECTROLYTE COMPLEXES AS ELECTRONIC ENERGY RELAYS

(71) Applicant: The Regents of the University of California, Oakland, CA (US)

(72) Inventor: Alexander Ayzner, Santa Cruz, CA (US)

(73) Assignee: The Regents of the University of California, Oakland, CA (US)

( * ) Notice: Subject to any disclaimer, the term of this patent is extended or adjusted under 35 U.S.C. 154(b) by 107 days.

(21) Appl. No.: 17/410,158

(22) Filed: Aug. 24, 2021

(65) Prior Publication Data

US 2021/0384369 A1    Dec. 9, 2021

Related U.S. Application Data

(62) Division of application No. 15/779,440, filed as application No. PCT/US2016/064212 on Nov. 30, 2016, now Pat. No. 11,101,396.

(Continued)

(51) Int. Cl.
*H01L 31/0445* (2014.01)
*H01L 51/00* (2006.01)
(Continued)

(52) U.S. Cl.
CPC ........ *H01L 31/0445* (2014.12); *B01J 19/123* (2013.01); *B01J 19/127* (2013.01); *H01G 9/2013* (2013.01); *H01L 31/04* (2013.01); *H01L 31/048* (2013.01); *H01L 51/0036* (2013.01); *H01L 51/0039* (2013.01); *H01L 51/0046* (2013.01); *H01L 51/447* (2013.01);

*C08G 2261/143* (2013.01); *C08G 2261/1426* (2013.01); *C08G 2261/312* (2013.01); *C08G 2261/3142* (2013.01);
(Continued)

(58) Field of Classification Search
CPC .................................................. H01L 31/0445
USPC .......................................................... 528/377
See application file for complete search history.

(56) References Cited

U.S. PATENT DOCUMENTS

| 7,125,578 B1 | 10/2006 | McBranch |
| 2007/0262287 A1 | 11/2007 | Kamanina |

(Continued)

FOREIGN PATENT DOCUMENTS

| WO | 02079268 A2 | 10/2002 |
| WO | 2010054304 A2 | 5/2010 |
| WO | 2017095922 A1 | 6/2017 |

OTHER PUBLICATIONS

Allbrahim et al. The Influence of the Optoelectronic Properties of poly(3-Alkylthiophenes) on the Device Parameters in Flexible Polymer Solar Cells. Org.Electron. physics, Mater. Appl. 2005, 6, pp. 65-77.

(Continued)

*Primary Examiner* — Shane Fang
(74) *Attorney, Agent, or Firm* — Carter, DeLuca & Farrell LLP

(57) ABSTRACT

The present invention generally relates to artificial photosystems and methods of their use, for example in artificial photosynthesis, wherein the artificial photosystems comprise one or more light-harvesting antenna (LHA) comprising a conjugated polyelectrolyte (CPE) complex (CPEC) comprising a donor CPE and an acceptor CPE, wherein the donor CPE and acceptor CPE are an electronic energy transfer (EET) donor/acceptor pair.

6 Claims, 28 Drawing Sheets

Related U.S. Application Data

(60) Provisional application No. 62/275,654, filed on Jan. 6, 2016, provisional application No. 62/260,862, filed on Nov. 30, 2015.

(51) Int. Cl.

| | |
|---|---|
| H01L 31/04 | (2014.01) |
| H01L 51/44 | (2006.01) |
| B01J 19/12 | (2006.01) |
| H01G 9/20 | (2006.01) |
| H01L 31/048 | (2014.01) |
| C08K 5/19 | (2006.01) |
| C08L 41/00 | (2006.01) |
| C08L 65/00 | (2006.01) |
| H10K 85/10 | (2023.01) |
| H10K 30/87 | (2023.01) |
| H10K 85/20 | (2023.01) |

(52) U.S. Cl.
CPC ........... C08G 2261/3223 (2013.01); C08G 2261/5222 (2013.01); C08G 2261/91 (2013.01); C08K 5/19 (2013.01); C08L 41/00 (2013.01); C08L 65/00 (2013.01); C08L 2203/204 (2013.01); C08L 2205/02 (2013.01); Y02E 10/549 (2013.01); Y02P 70/50 (2015.11)

(56) References Cited

U.S. PATENT DOCUMENTS

| | | |
|---|---|---|
| 2008/0087326 A1 | 4/2008 | Scholes et al. |
| 2008/0217587 A1 | 9/2008 | Gaudiana et al. |
| 2009/0101200 A1 | 4/2009 | Nakamura et al. |
| 2009/0266416 A1 | 10/2009 | Tolbert et al. |
| 2011/0294976 A1 | 12/2011 | Ling |
| 2015/0075622 A1 | 3/2015 | Bazan et al. |

OTHER PUBLICATIONS

Ayzner et al., Ultrafast Studies of Exciton Migration and Polaron Formation in Sequentially Solution-Processed Conjugated Polymer/Fullerene Quasi-Bilayer Photovoltaics. J. Phys. Chem. Lett. 2012, 3, pp. 2281-2287.
Ballottari et al., Chlorophyll Triplet Quenching and Photoprotection in the Higher Plant Monomeric Antenna Protein Lhcb5. J. Phys. Chem. B 2013, 117, pp. 11337-1134.
Barford et al., Theory of Optical Transitions in Conjugated Polymers. I. Ideal Systems. J. Chem. Phys. 2014, 141, 164101.
Barter et al., A Quantitative Structure-Function Relationship for the Photosystem II Reaction Center: Supermolecular Behavior in Natural Photosynthesis. Proc. Natl. Acad. Sci. U. S. A. 2003, 100, pp. 946-951.
Beaucage, Determination of Branch Fraction and Minimum Dimension of Mass-Fractal Aggregates. Phys. Rev. E 2004, 70, 031401-1 to 031401-10.
Bhosale et al., Supramolecular Chemistry of Protoporphyrin Ix and Its Derivatives. Eur. J. Org. Chem. 2013, 2013, pp. 3939-3954.
Biesheuvel et al., Electrostatic Free Energy of Weakly Charged Macromolecules in Solution and Intermacromolecular Complexes Consisting of Oppositely Charged Polymers. Langmuir 2004, 20, pp. 2785-2791.
Bottari et al., Towards Artificial Photosynthesis: Supramolecular, Donor-Acceptor, Porphyrin—and Phthalocyanine/Carbon Nanostructure Ensembles. Coord. Chem. Rev. 2012, 256, pp. 2453-2477.
Brotosudarmo et al., The Light Reactions of Photosynthesis as a Paradigm for Solar Fuel Production. Energy Procedia 2014, 47, pp. 283-289.
Burrows et al., Singlet Excitation Energy Harvesting and Triplet Emission in the Self-Assembled System Poly{1,4-Phenylene-[9,9-Bis (4-Phenoxy-Butylsulfonate)]fluorene-2,7-Diyl}copolymer/tris(bipyridyl)ruthenium(II)in Aqueous Solution. Adv. Mater.2009, 21, pp. 1155-1159.
Burrows et al., Aggregation of the Hairy Rod Conjugated Polyelectrolyte poly{1,4-Phenylene-[9,9-bis(4-Phenoxybutylsulfonate)]fluorene-2,7-Diyl} in Aqueous Solution: An Experimental and Molecular Modelling Study. Phys. Chem. Chem. Phys. 2008, 10, pp. 4420-4428.
Burrows et al., Solubilization of poly{1,4-Phenylene-[9,9-bis(4-Phenoxy-Butylsulfonate)]fluorene-2,7-Diyl} in Water by Nonionic Amphiphiles. Langmuir 2009, 25, pp. 5545-5556.
Burrows et al., Interplay of Electrostatic and Hydrophobic Effects with Binding of Cationic Gemini Surfactants and a Conjugated Polyanion: Experimental and Molecular Modeling Studies. J. Phys. Chem. B 2007, 111, pp. 4401-4410.
Carrillo et al., Polyelectrolytes in Salt Solutions: Molecular Dynamics Simulations. Macromolecules 2011, 44, pp. 5798-5816.
Cheng et al., Dynamics of Light Harvesting in Photosynthesis. Annu. Rev. Phys. Chem. 2009, 60, pp. 241-262.
Chollakup et al., Polyelectrolyte Molecular Weight and Salt Effects on the Phase Behavior and Coacervation of Aqueous Solutions of Poly(acrylic Acid) Sodium Salt and Poly(allylamine) Hydrochloride. Macromolecules 2013, 46, pp. 2376-2390. cited byapplicant.
Christensson et al., Origin of Long-Lived Coherences in Light-Harvesting Complexes. J. Phys. Chem. B 2012, 116, pp. 7449-7454.
Chu et al., Small-Angle X-Ray Scattering of Polymers. Chem. Rev. 2001, 101, pp. 1727-1761.
Chu et al., Dynamic Light Scattering Study of Internal Motions of Polymer Coils in Dilute Solution. Macromolecules 1991, 24, pp. 6832-6838.
Clark et al., Determining Exciton Bandwidth and Film Microstructure in Polythiophene Films Using Linear Absorption Spectroscopy. Appl. Phys. Lett. 2009, 94, 163306.
Collini et al., Coherent Intrachain Energy Migration in a Conjugated Polymer at Room Temperature. Science 2009, 323, pp. 369-373.
Combet et al., Salt-Free Aqueous Solutions of Polyelectrolytes: Small Angle X-Ray and Neutron Scattering Characterization. Eur. Phys. J. : Spec. Top. 2012, 213, pp. 243-265.
Cook et al., Singlet Exciton Transfer and Fullerene Triplet Formation in Polymer-Fullerene Blend Films. Appl. Phys. Lett. 2006, 89, 101128.
Costa et al., Aggregation Properties of P-Phenylene Vinylene Based Conjugated Oligoelectrolytes with Surfactants. Langmuir 2013, 29, pp. 10047-10058.
Croce et al., Light-Harvesting and Structural Organization of Photosystem II: From Individual Complexes to Thylakoid Membrane. J. Photochem. Photobiol. B. 2011, 104, pp. 142-153.
Croce et al., Natural Strategies for Photosynthetic Light Harvesting. Nat. Chem. Biol. 2014, 10, pp. 492-501.
Dzieciol et al., Designs for Life: Protocell Models in the Laboratory. Chem. Soc. Rev. 2012, 41, 79.
Eisfeld et al., The J—and H-Bands of Organic Dye Aggregates. Chem. Phys. 2006, 324, pp. 376-384.
Elemans et al., Molecular Materials by Self-Assembly of Porphyrins, Phthalocyanines, and Perylenes. Adv. Mater. 2006, 18, pp. 1251-1266.
Ermi et al., Model Solutions for Studies of Salt-Free Polyelectrolytes. Macromolecules 1996, 29, pp. 2701-2703.
Evans et al., Cationic Polythiophene-Surfactant Self-Assembly Complexes: Phase Transitions, Optical Response, and Sensing. Langmuir 2012, 28, pp. 12348-12356.
Fassioli et al., Photosynthetic Light Harvesting: Excitons and Coherence. J. R. Soc., Interface 2014, 11, 20130901, pp. 1-22.
Fukuzumi, Development of Bioinspired Artificial Photosynthetic Systems. Phys. Chem. Chem. Phys. 2008, 10, pp. 2283-2297.
Gan et al., Self-Assembly of Conjugated Polymers and Ds-Oligonucleotides Directed Fractal-like Aggregates. Biomacromolecules 2007, 8, pp. 1723-1729.
Glidden et al., Characterizing Gold Nanorods in Solution Using Depolarized Dynamic Light Scattering. J. Phys. Chem. C 2012, 116, pp. 8128-8137.
Goerigk et al., The Distribution of Sr 2+ Counterions around Polyacrylate Chains Analyzed by Anomalous Small-Angle X-Ray Scattering. Europhys. Lett. 2004, 66, pp. 331-337.

(56) References Cited

OTHER PUBLICATIONS

Guo et al., Evolution of Lateral Structures During the Functional Stack Build-up of P3ht:Pcbm-Based Bulk Heterojunction Solar Cells. ACS Appl. Mater. Interfaces 2013, 5, pp. 8581-8590.
Gust et al., Mimicry of Carotenoid Photoprotection in Artificial Photosynthetic Reaction Centers: Triplet-Triplet Energy Transfer by a Relay Mechanism. J. Photochem. Photobiol. B Biol. 1998, 43, pp. 209-216.
Gust et al., Mimicking Photosynthetic Solar Energy Transduction. Acc. Chem. Res. 2001, 34, pp. 40-48.
Gust et al., Solar Fuels via Artificial Photosynthesis. Acc. Chem. Res. 2009, 42, pp. 1890-1898.
Hatton et al., A Multi-Wall Carbon Nanotube-Molecular Semiconductor Composite for Bi-Layer Organic Solar Cells. Phys. E Low-Dimensional Syst. Nanostructures 2007, 37, pp. 124-127.
Hayashi et al., Antiparallel Three-Component Gradients in Double-Channel Surface Architectures. Chem. Sci. 2014, 5, pp. 4610-4614.
Hayashi et al., Complex Formation in Solutions of Oppositely Charged Polyelectrolytes at Different Polyion Compositions and Salt Content .dagger . . . J. Phys. Chem. B 2003, 107, pp. 8198-8207.
Hayes et al., Report Engineering Coherence Among Excited States in Synthetic Heterodimer Systems. Science 2013, 340, pp. 1431-1434.
Huang et al., Novel Electroluminescent Conjugated Polyelectrolytes Based on Polyfluorene. Chem. Mater. 2004, 16, pp. 708-716.
Thomas et al., Chemical Sensors Based on Amplifying Fluorescent Conjugated Polymers. Chem. Rev. 2007, 107, pp. 1339-1386.
Inal et al., Temperature-Regulated Fluorescence and Association of an Oligo(ethyleneglycol)methacrylate-Based Copolymer with a Conjugated Polyelectrolyte-the Effect of Solution Ionic Strength. J. Phys. Chem. B 2013, 117, pp. 14576-14587. cited byapplicant.
Jha et al., pH and Salt Effects on the Associative Phase Separation of Oppositely Charged Polyelectrolytes. Polymers. 2014, 6, pp. 1414-1436.
Jia et al., Dynamic Exchange of Counterions of Polystyrene Sulfonate. J. Chem. Phys. 2012, 136, 084904.
International Preliminary Report on Patentability for PCT/US2016/064212 dated Jun. 14, 2018, 10 pages.
Crabtree et al., Controlling the Functionality of Materials for Sustainable Energy. Annu. Rev. Condens. Matter Phys. 2011, 2, pp. 287-301.
Frischmann et al., Powering the Future of Molecular Artificial Photosynthesis with Light-Harvesting Metallosupramolecular Dye Assemblies. Chem. Soc. Rev. 2013, 42, pp. 1847-1870.
Chenu et al., Coherence in Energy Transfer and Photosynthesis. Annu. Rev. Phys. Chem. 2014, 66, pp. 69-96.
Gucht et al., Polyelectrolyte Complexes: Bulk Phases and Colloidal Systems. J. Colloid Interface Sci. 2011, 361, pp. 407-422.
Beaucage et al., Particle Size Distributions from Small-Angle Scattering Using Global Scattering Functions. J. Appl. Crystallogr. 2004, 37, pp. 523-535.
Ghosh et al., Artificial Photosynthetic Reaction Centers Coupled to Light-Harvesting Antennas. Phys. Rev. E 2011, 84, 061138.
Jordanides et al., Electronic Couplings and Energy Transfer Dynamics in the Oxidized Primary Electron Donor of the Bacterial Reaction Center J. Phys. Chem. B 2004, 108, pp. 1753-1765.
Lee et al., Charge Transfer State versus Hot Exciton Dissociation in Polymer-Fullerene Blended Solar Cells. J. Am. Chem. Soc 2010, 132, pp. 11878-11880.
Thomas et al., Adsorption of Organic Molecules on Rutile TiO2 and Anatase TiO2 Single Crystal Surfaces. Chem. Soc. Rev. 2012, 41, pp. 4207-4217.
Tian et al., LHCII Populations in Different Quenching States Are Present in the Thylakoid Membranes in a Ratio That Depends on the Light Conditions. J. Phys. Chem. Lett. 2015, pp. 2339-2344.
Treger et al., Tuning the Optical Properties of a Water-Soluble Cationic Poly(p. Phenylenevinylene): Surfactant Complexation with a Conjugated Polyelectrolyte. J. Phys. Chem. B 2008, 112, pp. 760-763.

Tsunashima et al., Dynamic Light Scattering Studies of Polymer Solution. 2. Translational Diffusion and Intramolecular Motions of Polystyrene in Dilute Solutions at the .crclbar. Temperature. Macromolecules 1983, 16, pp. 1184-1188. cited byapplicant.
Vella et al., Triplet Sensitization in an Anionic Poly(phenyleneethynylene) Conjugated Polyelectrolyte by Cationic Iridium Complexes. J. Phys. Chem. A 2013, 117, pp. 7818-7822.
Virgili et al., Analysis of Order Formation in Block Copolymer Thin Films Using Resonant Soft X-Ray Scattering. Macromolecules 2007, 40, pp. 2092-2099.
Wang et al., Defining the Nanostructured Morphology of Triblock Copolymers Using Resonant Soft X-Ray Scattering. Nano Lett. 2011, 11, pp. 3906-3911.
Wang et al., Biosensors from Conjugated Polyelectrolyte Complexes. Proc. Natl. Acad. Sci. U. S. A. 2002, 99, pp. 49-53.
Wang et al., The Polyelectrolyte Complex/Coacervate Continuum. Macromolecules 2014, 47, pp. 3108-3116.
Watts et al., Calibrated NEXAFS Spectra of Common Conjugated Polymers. J. Chem. Phys. 2011, 134, 024702.
Wu et al., Helical Conjugated Polyelectrolyte Aggregation Induced by Biotin-Avidin Interaction. J. Phys. Chem. Lett. 2012, 3, pp. 1711-1715.
Wurthner et al., J-Aggregates: From Serendipitous Discovery to Supramolecular Engineering of Functional Dye Materials. Angew. Chem. Int. Ed. Engl. 2011, 50, pp. 3376-3410.
Yamagata et al., Interplay between Intrachain and Interchain Interactions in Semiconducting Polymer Assemblies: The HJ-Aggregate Model. J. Chem. Phys. 2012, 136, 184901.
Yamagata et al., Vibronic Coupling in Quantum Wires: Applications to Polydiacetylene. J. Chem. Phys. 2011, 135, 054906.
Zimmerman et al., Singlet Fission in Pentacene through Multi-Exciton Quantum States. Nat. Chem. 2010, 2, pp. 648-652.
International Search Report and Written Opinion for PCT/US2016/064212 dated Apr. 12, 2017, 20 pages.
Jiang et al., Conjugated Polyelectrolytes: Synthesis, Photophysics, and Applications. Angew. Chem. Int. Ed. Engl. 2009, 48, pp. 4300-4316.
Kim et al., Comparison of the Photovoltaic Characteristics and Nanostructure of Fullerenes Blended with Conjugated Polymers with Siloxane—Terminated and Branched Aliphatic Side Chains. Chem. Mater. 2013, 25, pp. 431-440.
Knaapila et al., Structure and "Surfactochromic" Properties of Conjugated Polyelectrolyte (Cpe): Surfactant Complexes between a Cationic Polythiophene and Sds in Water. Langmuir 2010, 26, pp. 15634-15643.
Kodis et al., Synthesis and Photochemistry of a Carotene-porphyrin-fullerene Model Photosynthetic Reaction Center. J. Phys. Org. Chem. 2004, 17, pp. 724-734.
Kodis et al., Energy and Photoinduced Electron Transfer in a Wheel-Shaped Artificial Photosynthetic Antenna-Reaction Center Complex. J. Am. Chem. Soc. 2006, 128, pp. 1818-1827.
Leclercq et al., Dynamics of Polyelectrolyte Complex Formation and Stability as a Polyanion is Progressively Added to a Polycation under Modeled Physicochemical Blood Conditions. J. Bioact. Compat. Polym. 2011, 26, pp. 301-316.
Liu et al., On the Morphology of Polymer-Based Photovoltaics. J. Polym. Sci. Part B Polym. Phys. 2012, 50, pp. 1018-1044.
Liu et al., DNA Sequence-Dependent Photoluminescence Enhancement in a Cationic Conjugated Polyelectrolyte. Chem. Commun. 2014, 50, pp. 11311-11313.
Marcus et al., Theory of Optical Transitions in Conjugated Polymers. II. Real Systems. J. Chem. Phys. 2014, 141, 164102.
Marques et al., Spectroscopic Properties, Excitation, and Electron Transfer in an Anionic Water-Soluble Poly (fluorene-Alt-Phenylene)-Perylenediimide Copolymer. J. Phys. Chem. B 2012, 116, pp. 7548-7559.
Martin et al., Scattering from Fractals. J. Appl. Crystallogr. 1987, 20, pp. 61-78.
Martinez-Tome et al., Formation of Complexes between the Conjugated Polyelectrolyte poly{[9,9-bis(6'-N,N,N-Trimethylammonium)hexyl]fluorene-Phenylene} Bromide (HTMA-PFP) and Human Serum Albumin. Biomacromolecules 2010, 11, pp. 1494-1501. cited byapplicant.

(56) References Cited

OTHER PUBLICATIONS

McConnell et al., Energy Conversion in Natural and Artificial Photosynthesis. Chem. Biol. 2010, 17, pp. 434-447.
Mei et al., Siloxane-Terminated Solubilizing Side Chains: Bringing Conjugated Polymer Backbones Closer and Boosting Hole Mobilities in Thin-Film Transistors. J. Am. Chem. Soc. 2011, 133, pp. 20130-20133.
Monteserin et al., How to Change the Aggregation in the DNA/surfactant/cationic Conjugated Polyelectrolyte System through the Order of Component Addition: Anionic versus Neutral Surfactants. Langmuir 2010, 26, pp. 11705-11714.
Muren et al., Persistence Length of Polyelectrolytes with Precisely Located Charges. Soft Matter 2013, 9, 90.
Nishida et al., Structural and Electronic Properties of Columnar Supramolecular Assemblies Formed from Ionic Metal-Free Phthalocyanine on Au(111). J. Phys. Chem. C 2011, 115, pp. 16305-16314.
Oji et al., Core Hole Effect in NEXAFS Spectroscopy of Polycyclic Aromatic Hydrocarbons: Benzene, Chrysene, Perylene, and Coronene. J. Chem. Phys. 1998, 109, 10409.
Olaya-Castro et al., Energy Transfer from Forster-Dexter Theory to Quantum Coherent Light-Harvesting. Int. Rev. Phys. Chem. 2011, 30, pp. 49-77.
Overbeek et al., Phase Separation of Polyelectrolyte Solutions. Theory of Complex Coacervation. J. Cell. Phys. 1957, 49, pp. 7-26.
Perry et al., The Effect of Salt on the Complex Coacervation of Vinyl Polyelectrolytes. Polymers. 2014, 6, pp. 1756-1772.
Pfeifer et al., Chemistry in Noninteger Dimensions between Two and Three. I. Fractal Theory of Heterogeneous Surfaces. J. Chem. Phys. 1983, 79, 3558.
Phillies, Is the Polyelectrolyte Extraordinary Phase a Cluster-Forming Glass? Macromolecules 2001, 34, pp. 8745-8751.
Phillies, Neutral Polymer Slow Mode May Signify an Incipient Growth-Frustrated Domain-Forming Glass. Phys. Rev. E 2004, 69, 011801.
Pinto et al., Singlet-Singlet Energy Transfer in Self-Assembled Systems of the Cationic Poly{9,9-Bis[6-N,N,N-Trimethylammonium)Hexyl]Fluorene-Co-1,4-Phenylene} with Oppositely Charged Porphyrins. J. Phys. Chem. B 2009, 113, pp. 16093-16100. cited byapplicant.
Priftis et al., Complex Coacervation of Poly(ethylene-lmine)/polypeptide Aqueous Solutions: Thermodynamic and Rheological Characterization. J. Colloid Interface Sci. 2013, 398, pp. 39-50.
Priftis et al., Ternary, Tunable Polyelectrolyte Complex Fluids Driven by Complex Coacervation. Macromolecules 2014, 47, pp. 3076-3085.
Roehling et al., Controlling Microstructure in Poly(3-Hexylthiophene) Nanofibers. J. Mater. Chem. 2012, 22, pp. 2498-2506.
Scholes, Long-Range Resonance Energy Transfer in Molecular Systems. Annu. Rev. Phys. Chem. 2003, 54, pp. 57-87.
Scholes et al., Lessons from Nature about Solar Light Harvesting. Nat. Chem. 2011, 3, pp. 763-774.
Scholes et al., Adapting the Forster Theory of Energy Transfer for Modeling Dynamics in Aggregated Molecular Assemblies. J. Phys. Chem. B 2001, 105, pp. 1640-1651.
Scholes, Quantum-Coherent Electronic Energy Transfer: Did Nature Think of It First? J. Phys. Chem. Lett. 2001, 1, pp. 2-8.
Schumann et al., Organic Photovoltaic Devices Based on Water-Soluble Copper Phthalocyanine. J. Phys. Chem. C 2011, 115, pp. 4916-4921.
Schwartz et al., Conjugated Polymers as Molecular Materials: How Chain Conformation and Film Morphology Influence Energy Transfer and Interchain Interactions. Annu. Rev. Phys. Chem. 2003, 54, pp. 141-172.
Scotti et al., The Contin Algorithm and Its Application to Determine the Size Distribution of Microgel Suspensions. J. Chem. Phys. 2015, 142, 234905.
Sedlak, The Ionic Strength Dependence of the Structure and Dynamics of Polyelectrolyte Solutions as Seen by Light Scattering: The Slow Mode Dilemma. J. Chem. Phys. 1996, 105, 10123e.
Seo et al., Development of Water-Soluble Single-Crystalline TiO2 Nanoparticles for Photocatalytic Cancer-Cell Treatment. Small 2007, 3, pp. 850-853.
Shew et al., Hemoglobin and Alkaline Phosphatase Were Each Encapsulated in Phosphatidylcholine Liposomes Using a Dehydration-Rehydration Cycle for Liposome Formation . In This Method , liposomes Prepared by Sonication are Mixed in Aqueous Solutionwith the Solute Desi. Biochimica et Biophysica Acta 1985, 816, pp. 1-8.
Skibinska et al., Effect of Electrostatic Interactions on the Structure and Dynamics of a Model Polyelectrolyte. II. Intermolecular Correlations. J. Chem. Phys. 1999, 110, 1794.
Sorensen et al., Light Scattering by Fractal Aggregates: A Review. Aerosol Sci. Tech. 2001, 35, pp. 648-687.
Spano, The Spectral Signatures of Frenkel Polarons in H—and J-Aggregates. Acc. Chem. Res. 2010, 43, pp. 429-439.
Spano et al., Determining Exciton Coherence from the Photoluminescence Spectral Line Shape in Poly(3-Hexylthiophene) Thin Films. J. Chem. Phys. 2009, 130, 074904.
Spano et al., H—and J-Aggregate Behavior in Polymeric Semiconductors. Annu. Rev. Phys. Chem. 2014, 65, pp. 477-500.
Spiteri et al., Pearl-Necklace-Like Chain Conformation of Hydrophobic Polyelectrolytep.quadrature.: A SANS Study of Partially Sulfonated Polystyrene in Water. Macromolecules 2007, pp. 6679-6691.
Spruijt et al., Linear Viscoelasticity of Polyelectrolyte Complex Coacervates. Macromolecules 2013, 46, pp. 1633-1641.
Spruijt et al., Structure and Dynamics of Polyelectrolyte Complex Coacervates Studied by Scattering of Neutrons, X-Rays, and Light. Macromolecules 2013, 46, pp. 4596-4605.
Stirbet, Excitonic Connectivity between Photosystem II Units: What Is It, and Flow to Measure It? Photosynth. Res. 2013, 116, pp. 189-214.
Svergun et al., Small-Angle Scattering Studies of Biological Macromolecules in Solution. Reports Prog. Phys. 2003, 56, pp. 1735-1782.
Tapia et al., Interaction between the Water Soluble poly{1,4 Phenylene[9,9-bis(4-Phenoxy Butylsulfonate)] fluorene-2,7-Diyl} Copolymer and Ionic Surfactants Followed by Spectroscopic and Conductivity Measurements. J. Phys. Chem. B 2005, 109, pp. 19108-19115.
Teixeira, Small-Angle Scattering by Fractal Systems. J. Appl. Crystallogr. 1988, 21, pp. 781-785.

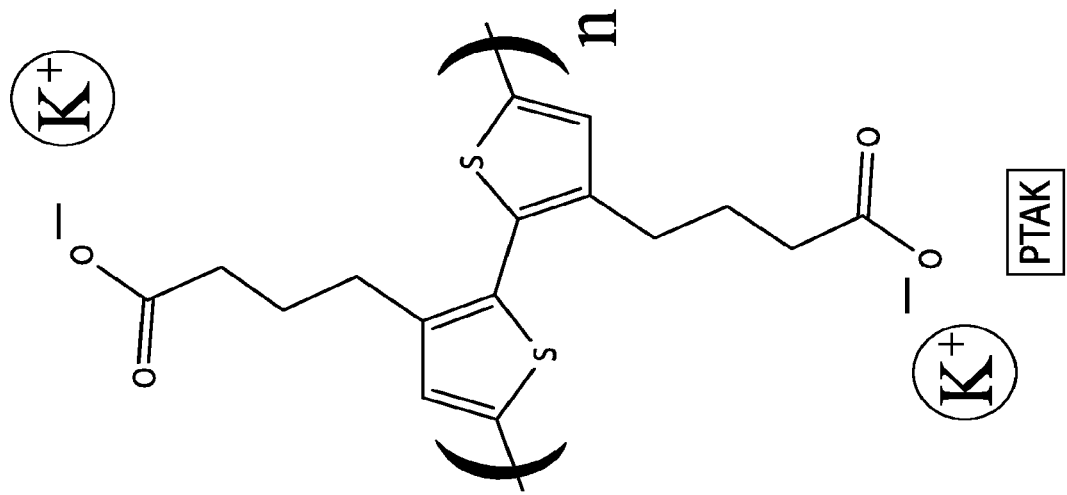
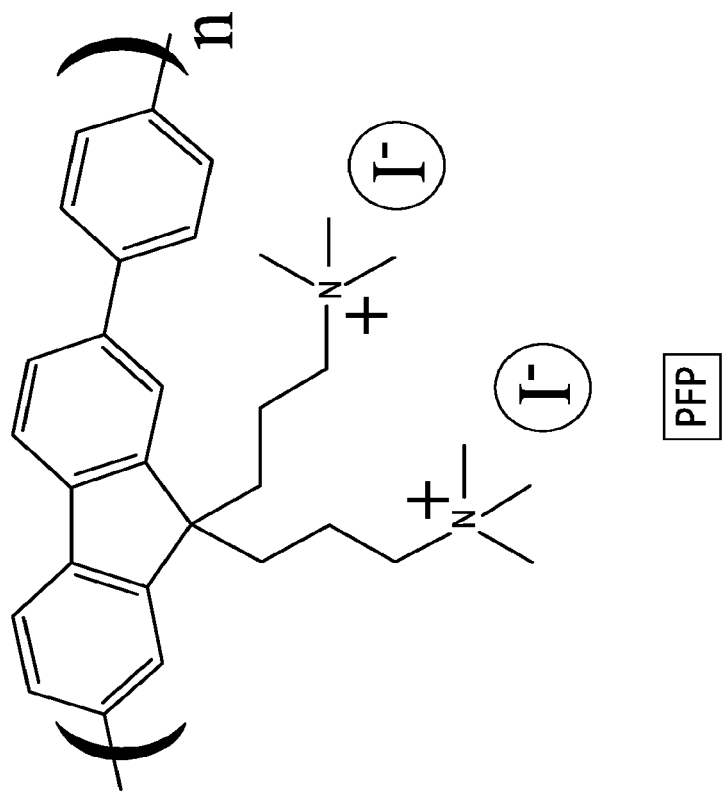
FIG. 2

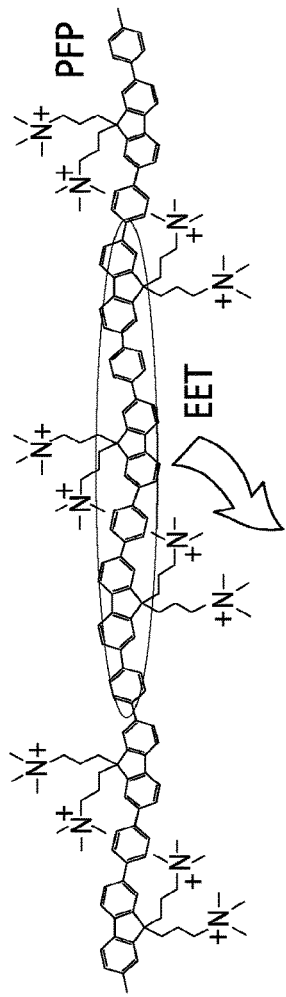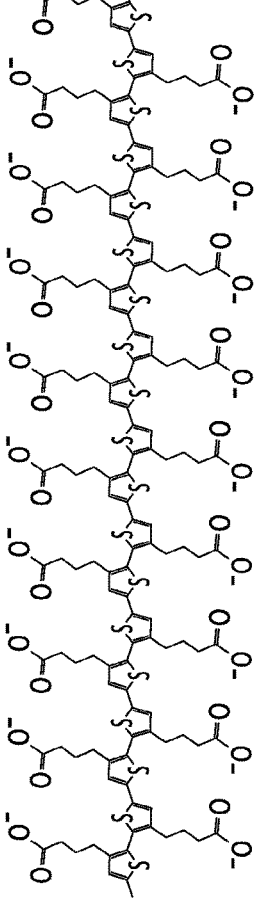
FIG. 3A
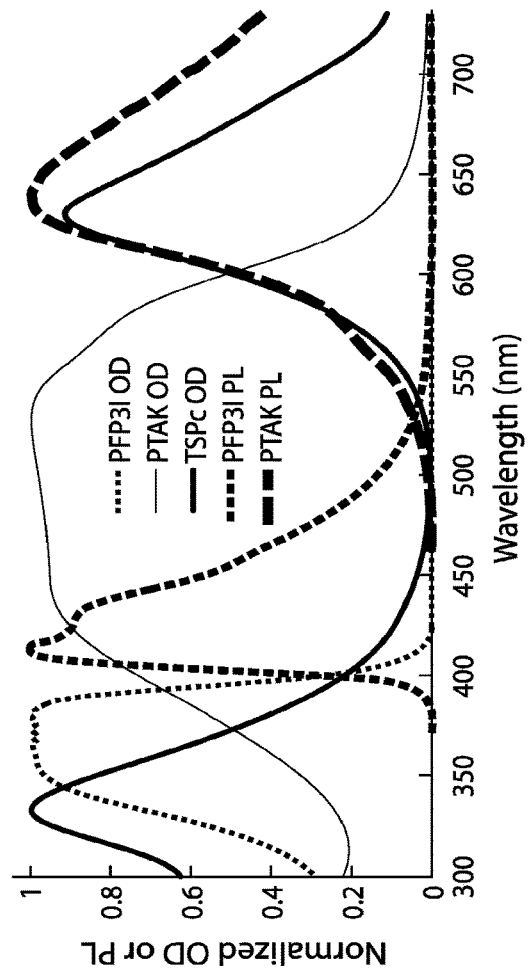
FIG. 3B

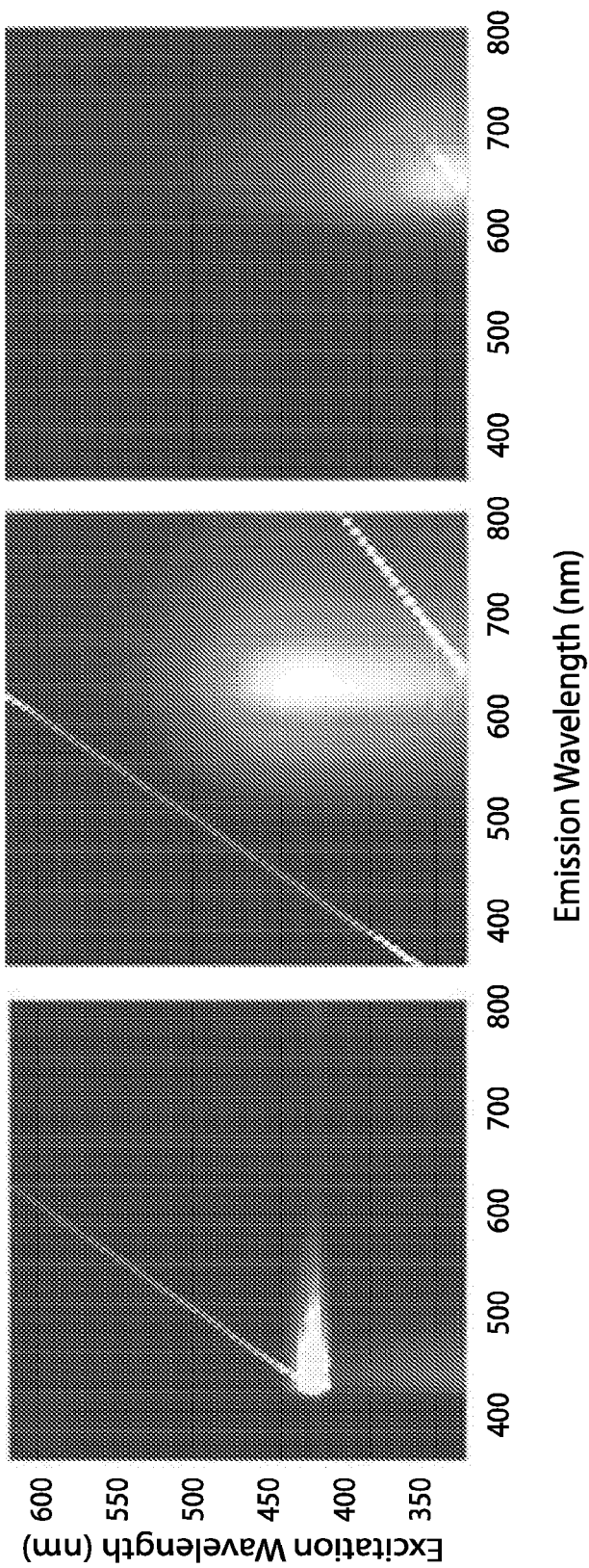

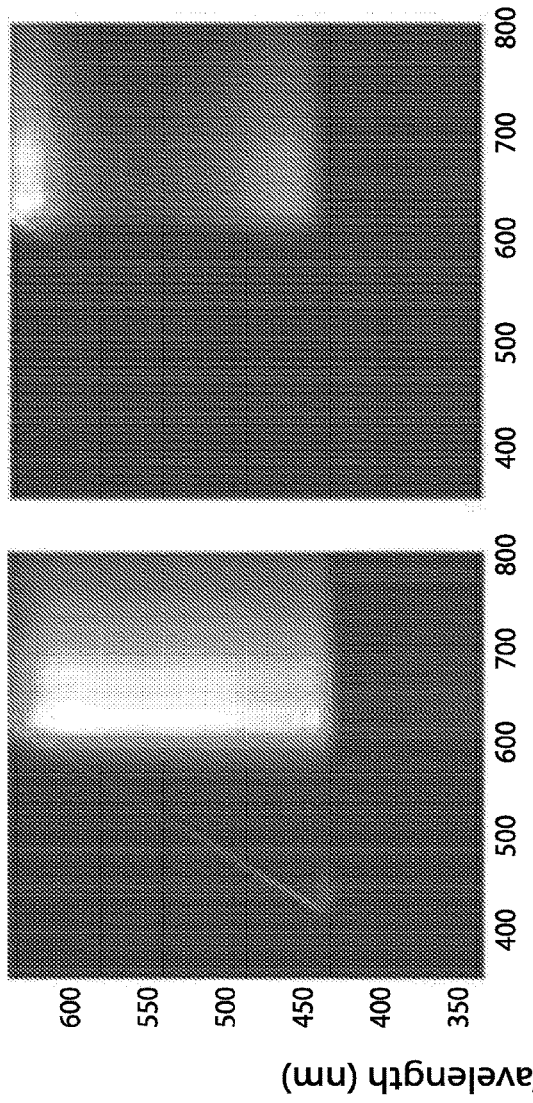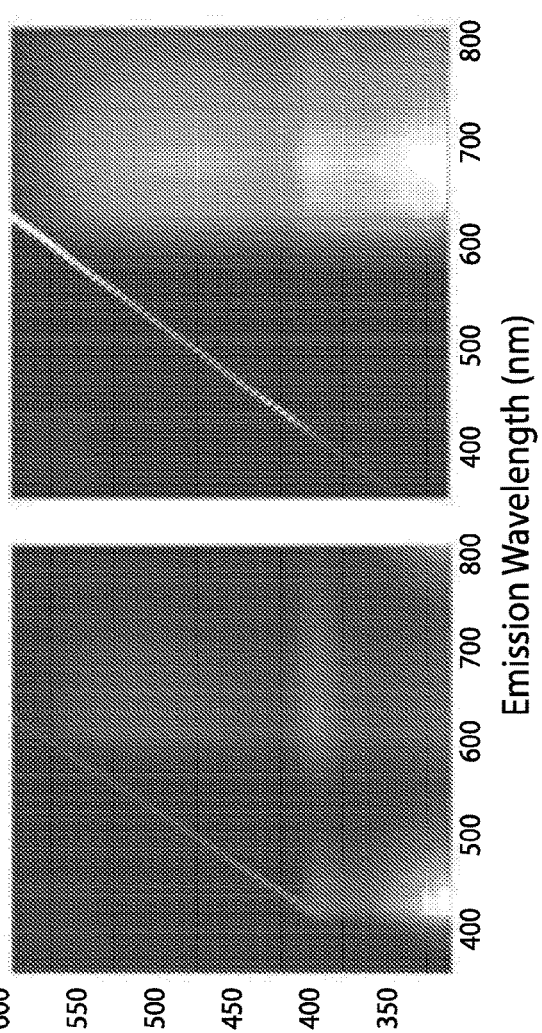

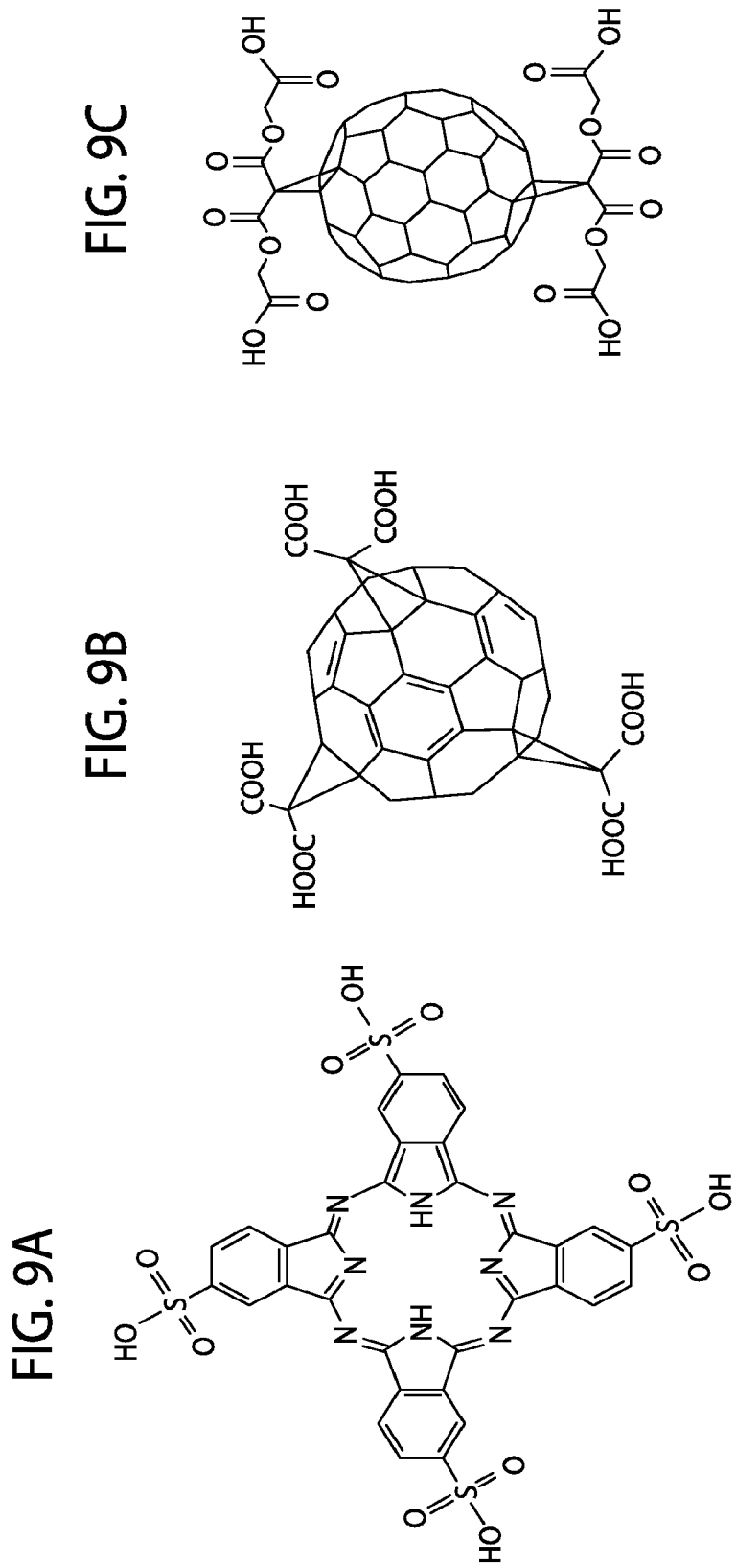

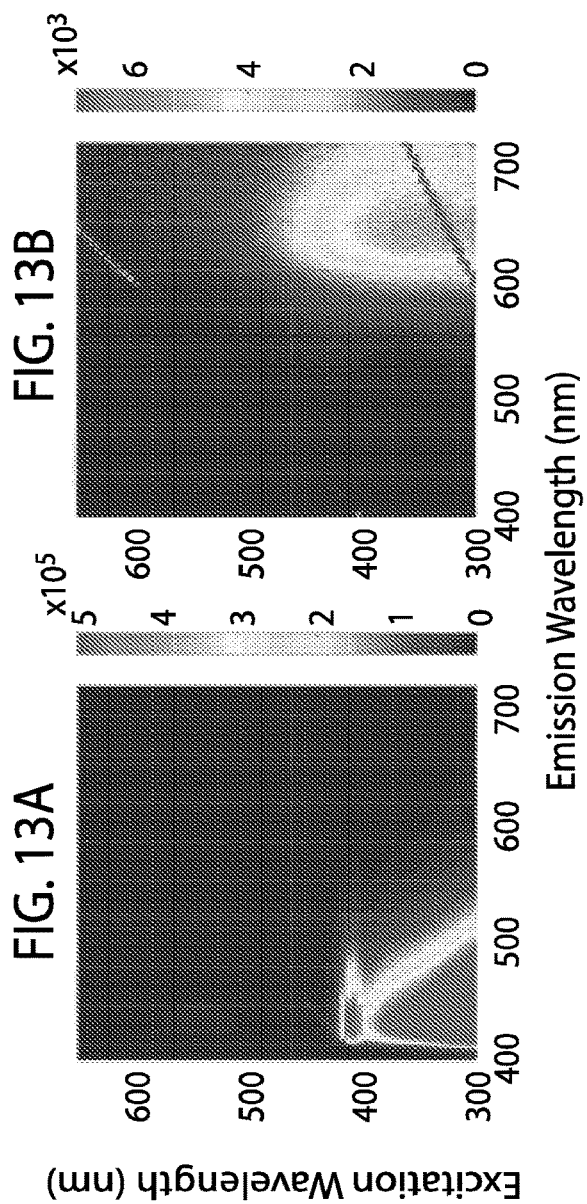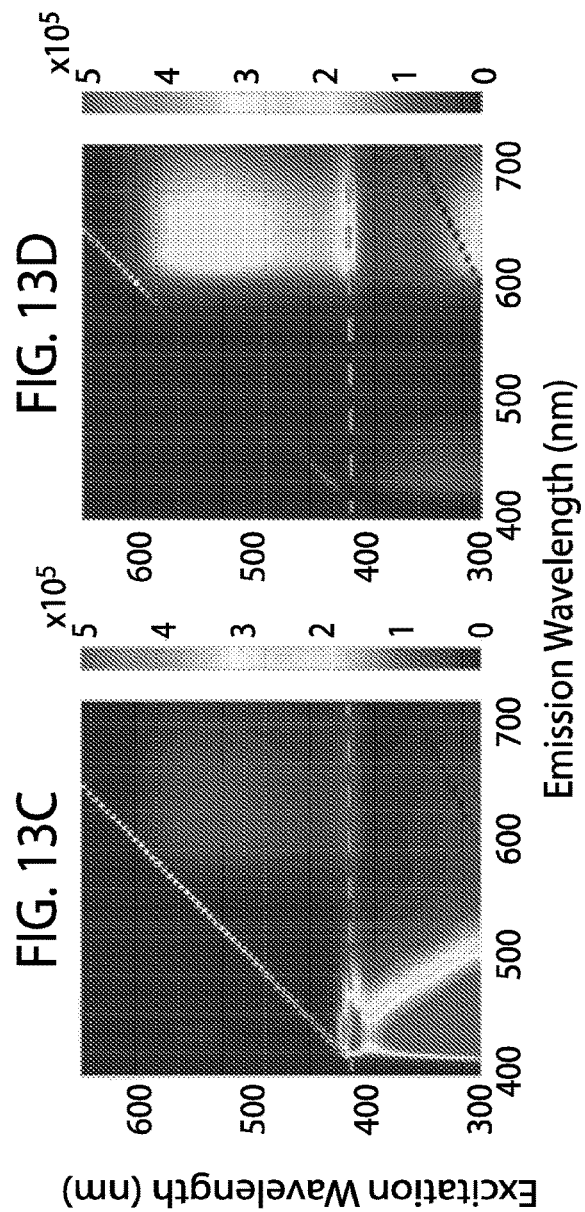

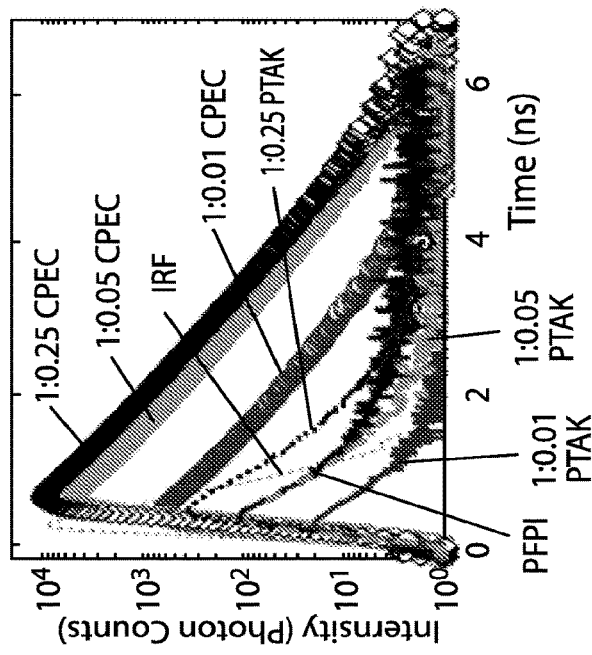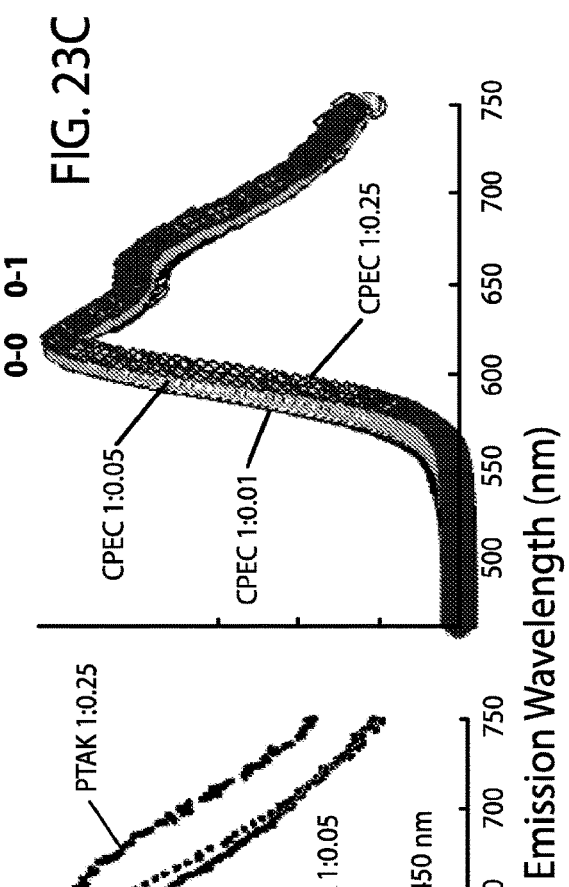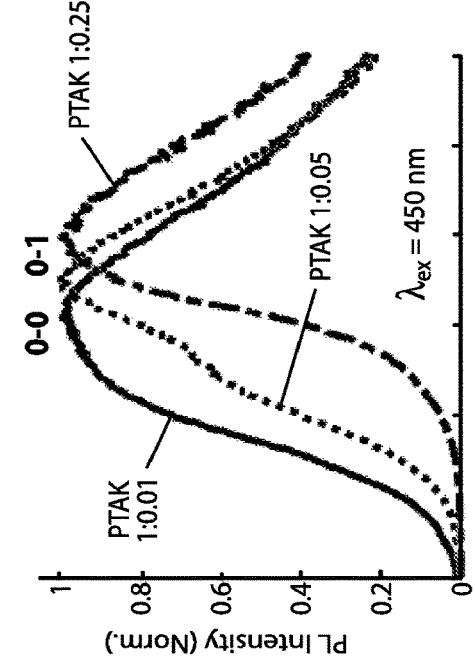
FIG. 23A
FIG. 23B
FIG. 23C

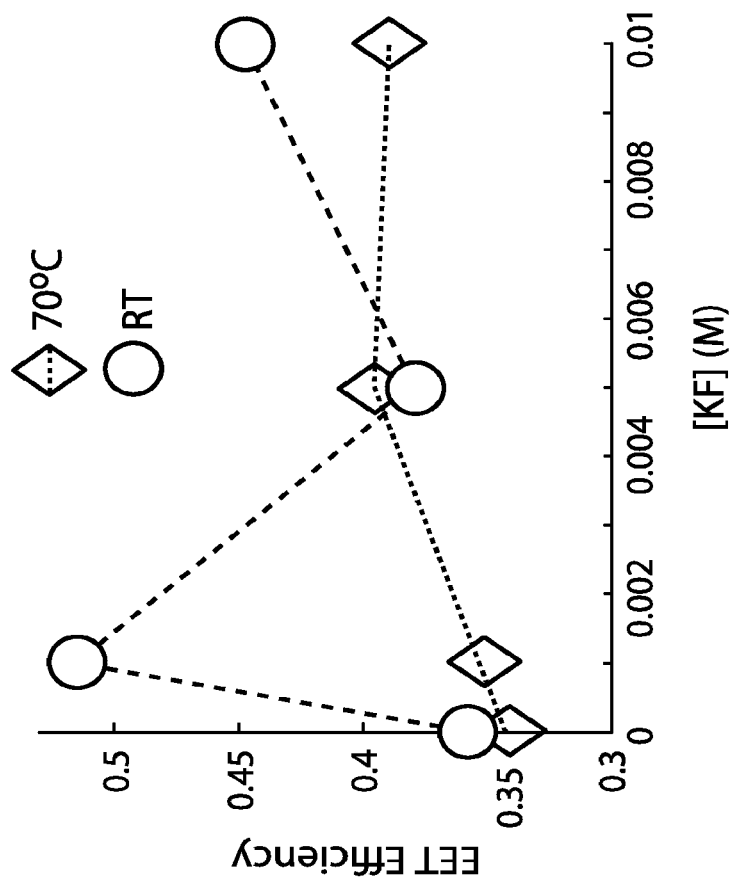

COMPLEMENTARY CONJUGATED POLYELECTROLYTE COMPLEXES AS ELECTRONIC ENERGY RELAYS

CROSS-REFERENCE TO RELATED APPLICATIONS

This application is a divisional of U.S. application Ser. No. 15/779,440, filed on May 25, 2018, which is a National Stage of International Application No. PCT/US2016/064212, filed on Nov. 30, 2016, which claims the benefit under 35. U.S.C. § 119(e) of and priority to U.S. Provisional Patent Application No. 62/260,862, filed on Nov. 30, 2015, and U.S. Provisional Patent Application No. 62/275,654, filed on Jan. 6, 2016. The entire contents of all of the foregoing applications are incorporated by reference herein.

FIELD OF THE INVENTION

The present invention generally relates to artificial photosystems and methods of their use, for example in artificial photosynthesis.

BACKGROUND

All publications herein are incorporated by reference to the same extent as if each individual publication or patent application was specifically and individually indicated to be incorporated by reference. The following description includes information that may be useful in understanding the present invention. It is not an admission that any of the information provided herein is prior art or relevant to the presently claimed invention, or that any publication specifically or implicitly referenced is prior art.

The ever-dwindling supply of fossil fuels has significantly increased the urgent need for development of alternative technologies based on sustainable energy sources. This fact has given rise to decades of research into photovoltaic devices that employ a very broad range of organic and inorganic materials. However, in order for photoelectric energy conversion to be of maximal utility, the generated electric potential energy must be stored so that it can be available at times when the incident sunlight intensity is minimal. Unfortunately, charge storage devices possess a relatively low energy density, making large-scale storage difficult. Due to its intrinsically larger energy density and its ease of energy storage, a very attractive alternative to photovoltaic power generation is direct conversion of sunlight into chemical potential energy via synthesis of fuel molecules. In fact, over billions of years, plants and bacteria have evolved exceedingly complex photosynthetic machinery based on "soft" macromolecular assemblies that conduct the four fundamental steps of photosynthesis: light absorption, energy transfer, charge transfer, and catalysis.

With the foregoing background in mind, there is a need in the art for artificial, modular, supramolecular photosystems with a tractable degree of structural complexity capable of carrying out the fundamental photosynthetic processes.

SUMMARY OF THE INVENTION

The following embodiments and aspects thereof are described and illustrated in conjunction with systems, compositions, articles of manufacture, and methods which are meant to be exemplary and illustrative, not limiting in scope.

In various embodiments, the present invention provides a light-harvesting antenna (LHA), comprising: a conjugated polyelectrolyte (CPE) complex (CPEC) comprising a donor CPE and an acceptor CPE, wherein the donor CPE and acceptor CPE are an electronic energy transfer (EET) donor/acceptor pair. In some embodiments, the LHA of claim 1, wherein the CPE complex (CPEC) further comprises a surfactant molecule. In some embodiments, the surfactant molecule is ionic, charged, zwitterionic, non-ionic, lipophilic, lipophobic, hydrophobic, hydrophilic, amphiphilic or amphipathic. In some embodiments, the CPE complex (CPEC) further comprises a second or more donor CPEs and/or a second or more acceptor CPEs. In some embodiments, the donor CPE and the acceptor CPE are oppositely charged. In some embodiments, the CPE complex (CPEC) is formed via electrostatic interactions between the donor CPE and the acceptor CPE. In some embodiments, the CPE complex (CPEC) is formed via non-covalent interactions between the donor CPE and the acceptor CPE. In some embodiments, the donor CPE is a poly([fluorene]-alt-co-[phenylene]) (PFP) or a derivative thereof. In some embodiments, the acceptor CPE is a poly(alkylcarboxythiophene) (PTAK) or a derivative thereof. In some embodiments, the acceptor CPE is a regiorandom PTAK or regioregular PTAK, or a benzodithiophene derivative of PTAK, or a combination thereof. In some embodiments, the charge ratio between the donor CPE and the acceptor CPE is about 1:0.25, 1:0.5, 1:1, or 1:2. In some embodiments, the charge ratio between the donor CPE and the acceptor CPE is about from 1:0.1 to 1:0.2, from 1:0.2 to 1:0.3, from 1:0.3 to 1:0.4, from 1:0.4 to 1:0.5, from 1:0.5 to 1:0.6, from 1:0.6 to 1:0.7, from 1:0.7 to 1:0.8, from 1:0.8 to 1:0.9, or from 1:0.9 to 1:1.0. In some embodiments, the charge ratio between the donor CPE and the acceptor CPE is about from 1:1 to 1:2, from 1:2 to 1:3, from 1:3 to 1:4, from 1:4 to 1:5, from 1:5 to 1:6, from 1:6 to 1:7, from 1:7 to 1:8, from 1:8 to 1:9, or from 1:9 to 1:10. In some embodiments, the LHA is encapsulated in a membrane, liposome, or vesicle. In some embodiments, the membrane is oleoylphosphatidycholine or a derivative thereof.

In various embodiments, the present invention provides a method of conducting photosynthesis, comprising: providing a light-harvesting antenna (LHA); and using the LHA in a photosynthetic process, thereby conducting photosynthesis; wherein the LHA comprises a conjugated polyelectrolyte (CPE) complex (CPEC) comprising a donor CPE and an acceptor CPE, wherein the donor CPE and acceptor CPE are an electronic energy transfer (EET) donor/acceptor pair. In some embodiments, the photosynthesis is artificial photosynthesis. In some embodiments, the photosynthetic process is an artificial photosynthetic process.

In various embodiments, the present invention provides a method of manufacturing a light-harvesting antenna (LHA), comprising: providing a donor CPE solution and an acceptor CPE solution, wherein the donor CPE solution comprises a donor CPE and the acceptor CPE solution comprises an acceptor CPE; mixing the donor CPE solution and the acceptor CPE solution to provide a mixture of the donor CPE solution and the acceptor CPE solution; and generating a CPE complex (CPEC) of the donor CPE and the acceptor CPE, wherein the generated CPE complex (CPEC) is the manufactured LHA. In some embodiments, the method further comprises adjusting a charge ratio between the donor CPE and the acceptor CPE. In some embodiments, the method further comprises adjusting an ionic strength in one or more of the donor CPE solution, the acceptor CPE solution, or the mixture of the donor CPE solution and the acceptor CPE solution. In some embodiments, the ionic strength is adjusted through adjusting an amount of a halogen ion, fluorine (F) ion, chlorine (Cl) ion, bromine (Br) ion, iodine (I) ion, or astatine (At) ion, or a combination thereof. In some embodiments, the ionic strength is adjusted through adjusting an amount of a salt, a halogen salt, KI, KF, KCl, KBr, or KAt, or a combination thereof. In some embodiments, the mixture of the donor CPE solution and the acceptor CPE solution comprises a liquid phase and a solid phase. In some embodiments, the method further comprises separating the liquid phase and the solid phase of the mixture. In some embodiments, the method further comprises adjusting a solvent composition of one or more of the donor CPE solution, the acceptor CPE solution, or the mixture of the donor CPE solution and the acceptor CPE solution. In some embodiments, independently one or more of the solvent composition comprises water, a nonaqueous component, or a combination thereof. In some embodiments, the method further comprises adjusting a sidechain charge density of one or more of the donor CPE or the acceptor CPE. In some embodiments, the method further comprises adjusting a pH of one or more of the donor CPE solution, the acceptor CPE solution, or the mixture of the donor CPE solution and the acceptor CPE solution. In some embodiments, the method further comprises adjusting a concentration of a surfactant molecule in one or more of the donor CPE solution, the acceptor CPE solution, or the mixture of the donor CPE solution and the acceptor CPE solution.

In various embodiments, the present invention provides a reaction center (RC) comprising a complex comprising a water-soluble phthalocyanine-based donor and a water-soluble fullerene-based acceptor. In some embodiments, the water-soluble phthalocyanine-based donor is a metal-free phthalocyanine tetrasulfonic acid (TSPc) or a derivative thereof.

In various embodiments, the present invention provides a method of conducting photosynthesis, comprising: providing a reaction center (RC); and using the RC in a photosynthetic process, thereby conducting photosynthesis; wherein the reaction center (RC) comprises a complex comprising a water-soluble phthalocyanine-based donor and a water-soluble fullerene-based acceptor. In some embodiments, the photosynthesis is artificial photosynthesis. In some embodiments, the photosynthetic process is an artificial photosynthetic process.

In various embodiments, the present invention provides an artificial photosystem, comprising: one or more light-harvesting antenna (LHA) comprising a conjugated polyelectrolyte (CPE) complex (CPEC) comprising a donor CPE and an acceptor CPE, wherein the donor CPE and acceptor CPE are an electronic energy transfer (EET) donor/acceptor pair. In some embodiments, the artificial photosystem comprises more than one LHA that form an LHA array. In some embodiments, the artificial photosystem further comprises a reaction center (RC), wherein the RC and the LHA form a supercomplex. In some embodiments, the RC is electronically linked to the LHA. In some embodiments, the artificial photosystem further comprises an oxidizing catalyst. In some embodiments, the artificial photosystem further comprises a reducing catalyst. In some embodiments, the artificial photosystem is encapsulated in a membrane, liposome, or vesicle. In some embodiments, the membrane is oleoylphosphatidycholine or a derivative thereof.

In various embodiments, the present invention provides a method of conducting photosynthesis, comprising: providing an artificial photosystem; and using the artificial photosystem in a photosynthetic process, thereby conducting photosynthesis; wherein the artificial photosystem, comprises one or more light-harvesting antenna (LHA) comprising a conjugated polyelectrolyte (CPE) complex (CPEC) comprising a donor CPE and an acceptor CPE, wherein the donor CPE and acceptor CPE are an electronic energy transfer (EET) donor/acceptor pair. In some embodiments, the photosynthesis is artificial photosynthesis. In some embodiments, the photosynthetic process is an artificial photosynthetic process.

BRIEF DESCRIPTION OF THE DRAWINGS

Exemplary embodiments are illustrated in referenced figures. It is intended that the embodiments and figures disclosed herein are to be considered illustrative rather than restrictive.

FIG. 2 depicts, in accordance with an embodiment of the invention, chemical structures of model positively-charged (PFP, left) and negatively-charged (PTAK, right) CPEs.

FIG. 3A-FIG. 3B depicts, in accordance with an embodiment of the invention, FIG. 3A, an illustration of EET between an excited PFP chromophore and PTAK. FIG. 3B, shows the optical density (OD) and 1D PL spectra of PFP, PTAK, and TSPc.

FIG. 4A-FIG. 4C depicts, in accordance with an embodiment of the invention, FIG. 4A 2D steady-state PL spectra of an isolated 1 mg/ml PFP solution. FIG. 4C same as FIG. 4B, but for isolated PTAK solutions at concentrations corresponding to the two CPEC molar charge ratios in FIG. 5A-FIG. 5D. The diagonal lines correspond to a reflection at the excitation wavelength and its second harmonic, which moves with wavelength at twice the speed of the former. Measurements were conducted in 1 cm pathlength quartz cuvettes in a right-angle collection geometry.

FIG. 5A-FIG. 5D depicts, in accordance with an embodiment of the invention, a 2D PL spectra of PFP:PTAK CPEC solutions and films. FIG. 5A, 1:0.25 solution phase. FIG. 5B, 1:1 solution phase. FIG. 5C, 1:1 solution with 0.01 M KI salt. FIG. 5D, Dried solid phase (film) of the 1:0.25 CPEC.

FIG. 6B Distributions of (apparent) diffusion coefficients extracted from inverse Laplace transformation of the DLS autocorrelation functions of varying CPEC charge ratios (at 90° scattering angle) using the CONTIN algorithm. The CONTIN regularization parameter was fixed at 0.5.

FIG. 7B Illustration of CPECs containing CPEs with rigid (left) and flexible (right) backbones.

FIG. 9A-FIG. 9C depicts, in accordance with an embodiment of the invention, commercially-available model donor and acceptor molecules for RC assembly. FIG. 9A, TSPc. FIG. 9B, Carboxylic acid-based (tris-malonate) $C_{60}$ derivative. FIG. 9C, Carboxylic acid-based $C_{70}$.

FIG. 10B Grafted fullerenes on inorganic surface further interact with TSPc in solution.

FIG. 11A, The surfactant concentration is below the critical micelle concentration and is below the equivalence point relative to the monomer concentration. FIG. 11B, Micelle formation is expected to lead to partial aggregate breakup and potentially formation of loosely-associated CPECs.

FIG. 12B optical density (OD) and photoluminescence (PL) of PFPI and PTAK solutions. The overlap of PFPI PL with OD of PTAK indicates that excitons can undergo energy transfer from the excited PFPI donor to the PTAK acceptor.

FIG. 13A-FIG. 13D depicts, in accordance with an embodiment of the invention, aqueous solution 2D PL maps of FIG. 13A PFPI at 1 mg/mL, FIG. 13B PTAK mole-matched to the 1:0.25 charge ratio CPEC, FIG. 13C 1:0.01 PFPI:PTAK CPEC, and FIG. 13D 1:0.25 CPEC. The diagonal lines are due to reflections of the excitation wavelength. The horizontal line in FIG. 13C and FIG. 13D indicates the excitation wavelength that gives rise to PFPI emission and to simultaneous PTAK emission. The sharp enhancement of the latter cannot be explained by the PTAK absorption spectrum, indicating evidence of EET from PFPI to PTAK. The same enhancement is seen at lower excitation wavelengths as well. Though isolated PTAK emits in this region as well, in a CPEC this PTAK PL is drastically more intense, as indicated by the change in scale between FIG. 13B and FIG. 13D. Measurements were conducted in 0.2 cm pathlength quartz cuvettes in a right-angle collection geometry.

FIG. 14B PL excitation (PLE) spectra collected at an emission wavelength that exclusively corresponds to PTAK PL. For comparison, PLE of PFPI in a CPEC (collected near PFPI PL peak and scaled for clarity) is also labeled as (PFPI). The PLE intensity of PTAK complexed to PFPI is orders of magnitude larger than that of PTAK on its own. The enhancement in complexed PTAK's PL at wavelengths that correspond to PFPI PL yet do not correspond to sharp PTAK OD features is strong evidence of inter-CPE EET from photoexcited PFPI to PTAK. The vertical white bar masks the specular reflection of the excitation light. PLE measurements were conducted in 1 cm pathlength quartz cuvettes in a right-angle collection geometry.

FIG. 16A $\lambda_{ex}$=420 nm and $\lambda_{em}$=442 nm. Emission is collected near the peak of PFPI PL. The inset shows PFPI and CPEC solutions plotted on a linear scale. The data show that PFPI PL is progressively quenched with increasing relative charge ratio, which we attribute to EET from PFPI to PTAK. FIG. 16B $\lambda_{ex}$=420 nm and $\lambda_{em}$=615 nm. Emission at the latter comes overwhelmingly from PTAK. The curves show that upon complexation with PFPI, PTAK emission intensity increases by ~ two orders of magnitude and lasts substantially longer than that of pure PTAK. We attribute this to emergence of extended, J-like excitonic states largely delocalized over the conjugated PTAK backbone. FIG. 16C $\lambda_{ex}$=600 nm and $\lambda_{em}$=680 nm. In this case, the lowest-energy excitons of PTAK are excited with vanishing PFPI excitation. Similar to the data shown in FIG. 16B, the decays display long-lived PL and are due to delocalized J-like excitons.

FIG. 19A 1:0.063; FIG. 19B 1:0.25. The solid was spread on a substrate as a paste and allowed to dry. PFPI PL is nearly completely quenched, and PTAK PL is enhanced in the excitation region corresponding to strong PFPI emission when PFPI is in isolation.

FIG. 20B cartoon of PFPI and PTAK chains in a solution-phase CPEC. The backbones of both CPEs are fairly extended, leading to coherent excitonic wavefunction delocalization over a large backbone segment. One consequence of this backbone planarization due to CPEC formation is a drastic increase in the PL quantum yield of PTAK (bottom CPE), consistent with emission from J-like excitonic states. Arrows indicate directional transfer of electronic energy.

FIG. 22B optical density (OD) of PFPI and photoluminescence (PL) of PTAK solutions (n~100). FIG. 22C normalized PL excitation spectra of an aqueous PFPI:PTAK complex at a 1:0.25 molar charge ratio at two fixed emission wavelengths. Black triangles with line correspond to PL due to PFPI only (440 nm), which tracks the OD of PFPI (solid black curve in FIG. 22B) well. Gray triangles without line show PL due to PTAK only (660 nm).

FIG. 23A-FIG. 23C depicts, in accordance with an embodiment of the invention, FIG. 23A time-resolved PL decays on a semi-logarithmic scale collected for a fixed time. Samples are excited at excitation wavelength within the PFPI absorption band, and emission is detected only where PTAK fluoresces. IRF stands for the instrument response function. CPEC stands for CPE complex. The +/− charge ratio is indicated in the legend. PTAK is the energy acceptor control corresponding to a given complex. FIG. 23B PL of aqueous PTAK control solutions identical in concentration to CPEC solutions in FIG. 23C. The plotted wavelength region corresponds to PTAK PL only. The 0-0 and 0-1 vibronic peaks are labeled in bold font.

FIG. 24 depicts, in accordance with an embodiment of the invention, EET efficiency from PFPI to PTAK as a function of KF concentration for complexes prepared at room temperature (RT) and at 70° C.

FIG. 25B the dynamics of CPE complex formation at 70° C. are slow; this shows the evolution of the PFPI vibronic ratio and PL intensity. The sharp peak is the excitation line.

FIG. 26B relaxation time distributions from DLS of a 1:0.25 complex as a function of SDS concentration below (SDS 0.5 mg/mL), at (SDS 2 mg/mL) and above (SDS 10 mg/mL) the nominal SDS critical micelle concentration. The CONTIN regularization parameter was fixed at 0.2 after some variation. FIG. 26C PL exciting at 410 nm of a 1:0.25 CPE complex as a function of phthalocyanine tetrasulfonic acid, which is capable of serving as the energy acceptor for both PFPI and PTAK excitons.

DETAILED DESCRIPTION OF THE INVENTION

Figure 1:
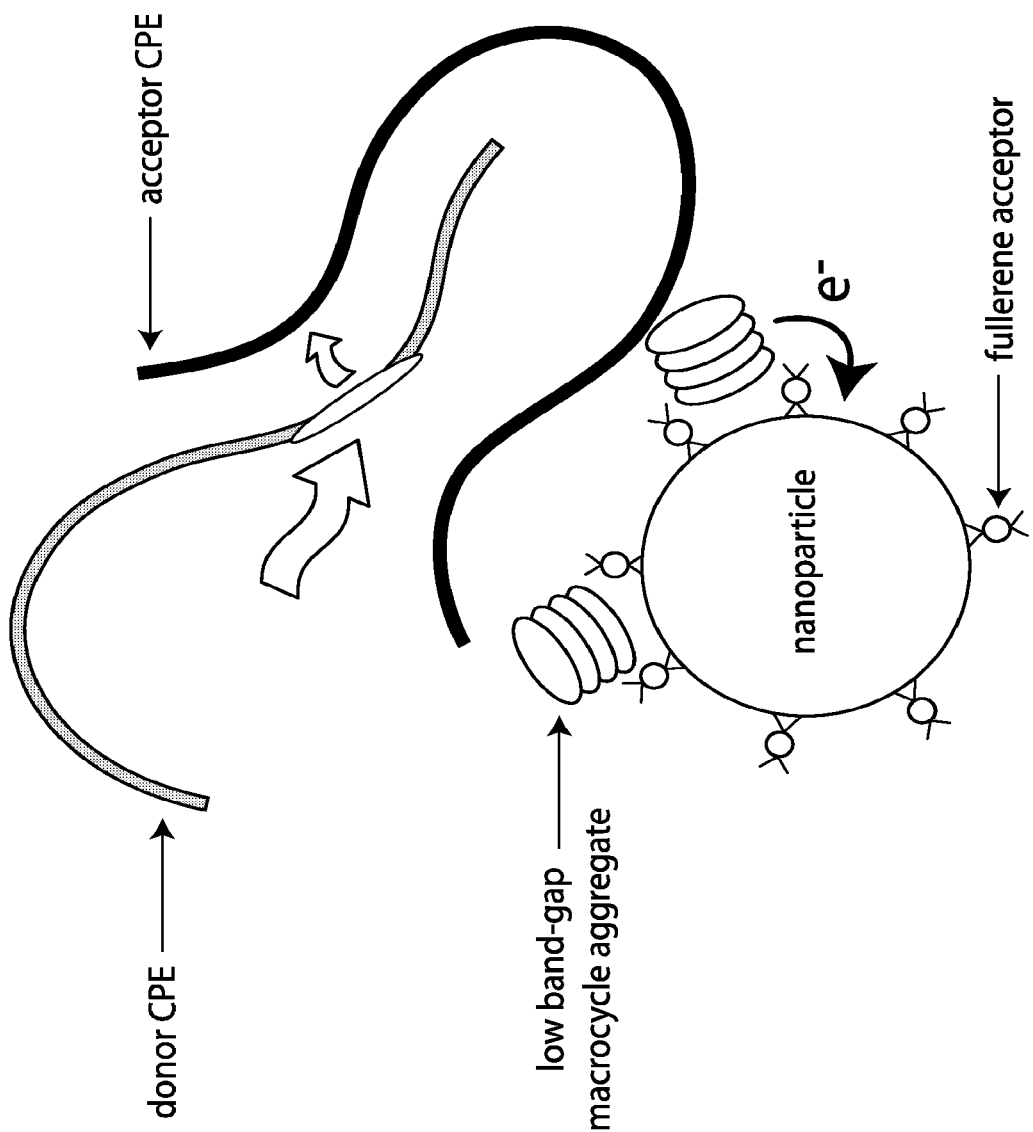
FIG. 1 depicts, in accordance with an embodiment of the invention, an illustration of a CPE-based photosystem showing donor CPE and acceptor CPE strings, low-bandgap macrocycle aggregates, and fullerene acceptors affixed to a nanoparticle. Electronic energy is directionally funneled via a bandgap gradient through the peripheral CPEs towards the macrocycle assembly, which then undergoes electron transfer.

All references cited herein are incorporated by reference in their entirety as though fully set forth. Unless defined otherwise, technical and scientific terms used herein have the same meaning as commonly understood by one of ordinary skill in the art to which this invention belongs. Hornyak et al., Introduction to Nanoscience and Nanotechnology, CRC Press (2008); Singleton and Sainsbury, Dictionary of Microbiology and Molecular Biology 3rd ed., revised ed., J. Wiley & Sons (New York, N.Y. 2006); and Smith, March's Advanced Organic Chemistry Reactions, Mechanisms and Structure 7th ed., J. Wiley & Sons (New York, N.Y. 2013), provide one skilled in the art with a general guide to many of the terms used in the present application.

One skilled in the art will recognize many methods and materials similar or equivalent to those described herein, which could be used in the practice of the present invention. Other features and advantages of the invention will become apparent from the following detailed description, taken in conjunction with the accompanying drawings, which illustrate, by way of example, various features of embodiments of the invention. Indeed, the present invention is in no way limited to the methods and materials described. For convenience, certain terms employed herein, in the specification, examples and appended claims are collected here.

Unless stated otherwise, or implicit from context, the following terms and phrases include the meanings provided below. Unless explicitly stated otherwise, or apparent from context, the terms and phrases below do not exclude the meaning that the term or phrase has acquired in the art to which it pertains. Unless otherwise defined, all technical and scientific terms used herein have the same meaning as commonly understood by one of ordinary skill in the art to which this invention belongs. It should be understood that this invention is not limited to the particular methodology, protocols, and reagents, etc., described herein and as such can vary. The definitions and terminology used herein are provided to aid in describing particular embodiments, and are not intended to limit the claimed invention, because the scope of the invention is limited only by the claims.

As used herein the term "comprising" or "comprises" is used in reference to compositions, methods, systems, articles of manufacture, and respective component(s) thereof, that are useful to an embodiment, yet open to the inclusion of unspecified elements, whether useful or not. It will be understood by those within the art that, in general, terms used herein are generally intended as "open" terms (e.g., the term "including" should be interpreted as "including but not limited to," the term "having" should be interpreted as "having at least," the term "includes" should be interpreted as "includes but is not limited to," etc.).

Unless stated otherwise, the terms "a" and "an" and "the" and similar references used in the context of describing a particular embodiment of the application (especially in the context of claims) can be construed to cover both the singular and the plural. The recitation of ranges of values herein is merely intended to serve as a shorthand method of referring individually to each separate value falling within the range. Unless otherwise indicated herein, each individual value is incorporated into the specification as if it were individually recited herein. All methods described herein can be performed in any suitable order unless otherwise indicated herein or otherwise clearly contradicted by context. The use of any and all examples, or exemplary language (for example, "such as") provided with respect to certain embodiments herein is intended merely to better illuminate the application and does not pose a limitation on the scope of the application otherwise claimed. The abbreviation, "e.g." is derived from the Latin exempli gratia, and is used herein to indicate a non-limiting example. Thus, the abbreviation "e.g." is synonymous with the term "for example." No language in the specification should be construed as indicating any non-claimed element essential to the practice of the application.

As used herein, the term "artificial photosynthesis" refers to any chemical process that is designed to replicate or mimic one or more processes of natural photosynthesis. The term "artificial photosynthesis" is generally used in the art to refer to any non-naturally occurring composition, method, process, article or manufacture, or system for capturing, storing, transferring, or converting energy from light (i.e., solar energy from sunlight). For example, in some embodiments, artificial photosynthesis utilizes a non-naturally occurring composition or article of manufacture for converting carbon dioxide and water into oxygen, a liquid fuel source, a gaseous fuel source, etc. using sunlight. In contrast, natural photosynthesis is a process used by plants and other photosynthetic organisms (e.g., algae, cyanobacteria, *euglena*) for converting light energy, (e.g., solar energy from sunlight) into chemical energy that can later be released to fuel the organism's activities. In natural photosynthesis, this chemical energy is stored in carbohydrate molecules, such as sugars, which are synthesized from carbon dioxide and water, wherein water is released as a waste product. As used herein the term "artificial photosynthesis" also means any process performed using an artificial photosystem as described herein.

As used herein, the term "artificial photosynthetic process" refers to any process performed using an artificial photosystem as described herein.

As used herein, the abbreviation "CPE" refers to conjugated polyelectrolyte.

As used herein, the term "donor CPE" refers to donor conjugated polyelectrolyte.

As used herein, the term "acceptor CPE" refers to acceptor conjugated polyelectrolyte.

As used herein, the abbreviation "CPEC" and the term "CPE complex" refer to conjugated polyelectrolyte complex. "CPEC" and "CPE complex" are used interchangeably herein.

As used herein, the abbreviation "LHA" refers to light-harvesting antenna.

As used herein, the abbreviation "EET" refers to electronic energy transfer.

As used herein, the abbreviation "PL" refers to photoluminescence.

As used herein, the abbreviation "RC" refers to reaction center.

As used herein, the abbreviation "PFP" refers to poly([fluorene]-alt-co-[phenylene]) or a derivative thereof.

As used herein, the abbreviation "PTAK" refers to poly (alkylcarboxythiophene) or a derivative thereof.

As used herein, the abbreviation "TSPc" refers to metal-free phthalocyanine tetrasulfonic acid or a derivative thereof.

As used herein, the abbreviation "OD" refers to optical density.

The terms "light-harvesting antenna", "electronic energy relay" and "electronic energy transfer relay" are used interchangeably herein.

The terms "PFP" and "PFPI" are used interchangeably herein.

In various embodiments, the present invention describes the preparation of conjugated (semiconducting), water-soluble, luminescent polyelectrolyte complexes (CPECs) containing an electronic excited state (exciton) donor and an exciton acceptor capable of undergoing electronic energy transfer (EET) from the donor to the acceptor. The complex is formed by direct introduction of separate conjugated polyelectrolyte (CPE) solutions into a common vessel, wherein electrostatic self-assembly yields a simultaneous coexistence of a dense and a dilute phase, each of which contains CPECs at different concentrations and with different luminescent properties. Any oppositely-charged CPE pair, where the absorption spectrum of one spectrally overlaps the photoluminescence (PL) spectrum of the other, is within the scope of the present invention, independent of the precise backbone CPE chemical structures. Merely by way of non-limiting examples, backbone CPE chemical structures may include both regioregular and regiorandom polyelectrolyte backbones. The backbone chemical structure can be composed of any conjugated subunit, such as a fluorene, thiophene- or phenyl-based groups, ring systems including heteroatoms, fused rings (e.g. benzodithiophene, bithiophene), as well as co-polymers that include permutations of these groups covalently linked within the monomer. By controlling the solution ionic strength, the order of CPE addition and the relative charge ratio, luminescence spectra and stability of the complexes can be broadly varied. The dense phase exhibits substantial resistance to dissolution and can be deposited as a coating. Both the dilute and the dense phases effectively lead to detection of high energy photons via lower energy luminescence, thus functioning as both a light harvester and a sensor for high energy photons. The polymeric nature of the CPEC provides the ability to process these materials either via solution deposition (e.g. spin-coating, slot-die coating, etc.), as well via elevated temperature processing of the dense phase. Since the CPEC is composed of long-chain semiconducting polymer molecules as opposed to small-molecule or oligomeric species, tuning the polymer chain microstructure can be used to tune the electronic and thus luminescent properties of the complex. For example, the relative CPEC charge ratio can be used to control the physical polyelectrolyte conformation, thus controlling the light emission spectrum as well as the photoluminescence quantum yield, thereby providing substantially more control over the light harvesting and EET characteristics than small molecules or oligomers.

Various embodiments of the present invention may find utilities in fluorescent lighting, light sensing, and down-conversion of photon energy. Moreover, one may improve the stability of the complex in solution for ease of processing; achieve sensitive control of energy transfer rates and luminescence quantum yields; assemble multi-polyelectrolyte complexes with charged small molecules to achieve spectrally-broad light harvesting and further down-conversion of the photon energy; create an artificial photosystem by interfacing the CPEC with an electron transfer interface (using, e.g., a water-soluble fullerene derivative as the electron acceptor); interface the CPEC assembly with a photocatalyst for solar fuel generation; and link two or more artificial photosystems in series using an electronic bridge.

In various embodiments, this invention provides the ability to tune the emission properties of soft-matter assemblies soluble in benign polar solvents (such as water) via control of environmental factors. Specifically, owing to the polymeric nature of the self-assembled complex and the strong coupling between the conjugated polyelectrolyte solution structure and its optical properties, the intensity and emission colors can be tuned simply by varying the environment in which the complex exists. This obviates the need to synthesize an entire new molecule if the emission spectrum must be changed. Furthermore, the complexation process can be used to change the native emission properties of the exciton donor and acceptor polyelectrolytes, thereby leading to emergent optical properties that are absent in the isolated components.

Due to the coexistence of the two phases, one may need to process a dense CPEC phase that resists further dissolution. Once deposited on a substrate, this resistance to organic and polar solvents is attractive for certain applications. In certain situations, one may retain the bulk of the CPEC in the "dilute" phase, rendering it amenable to straight-forward solution processing techniques such as spin-coating and ink jet printing, leading to a well-defined thin film coating.

Various embodiments of the present invention provide a light-harvesting antenna (LHA). In some embodiments, the LHA comprises: a conjugated polyelectrolyte (CPE) complex comprising a donor CPE and an acceptor CPE, wherein the donor CPE and acceptor CPE are an electronic energy transfer (EET) donor/acceptor pair. In other embodiments, the LHA consists of or consists essentially of: a conjugated polyelectrolyte (CPE) complex comprising a donor CPE and an acceptor CPE, wherein the donor CPE and acceptor CPE are an electronic energy transfer (EET) donor/acceptor pair. In various embodiments, the CPE complex (CPEC) further comprises a second, third or more donor CPEs and/or a second, third or more acceptor CPEs.

Various embodiments of the present invention provide a light-harvesting antenna (LHA). In some embodiments, the LHA comprises: one or more conjugated polyelectrolyte (CPE) complexes comprising one or more donor CPEs and one or more acceptor CPEs, wherein the donor CPEs and acceptor CPEs are electronic energy transfer (EET) donor/acceptor pairs. In other embodiments, the LHA consists of or consists essentially of: one or more conjugated polyelectrolyte (CPE) complexes comprising one or more donor CPEs and one or more acceptor CPEs, wherein the donor CPEs and acceptor CPEs are electronic energy transfer (EET) donor/acceptor pairs.

In various embodiments, the CPE complex (CPEC) further comprises a surfactant molecule. In various embodiments, the surfactant molecule is ionic, charged, zwitterionic, non-ionic, lipophilic, lipophobic, hydrophobic, hydrophilic, amphiphilic or amphipathic.

In various embodiments, the donor CPE and the acceptor CPE are oppositely charged. In various embodiments, the CPE complex (CPEC) is formed via electrostatic interactions between the donor CPE and the acceptor CPE. In various embodiments, the CPE complex (CPEC) is formed via non-covalent interactions between the donor CPE and the acceptor CPE.

In various embodiments, the donor CPE is a poly([fluorene]-alt-co-[phenylene]) (PFP) or a derivative thereof. In various embodiments, the donor CPE is a poly([fluorene]-alt-co-[phenylene]) (PFPI) or a derivative thereof. These derivatives can include, but are in no way limited to: a) varying lengths of the dialkyl linkers connecting the conjugated fluorene system to the charged quaternary ammonium moiety by varying the number of aliphatic carbons in the linker; b) using alkyl linkers of dissimilar lengths; c) using primary and secondary ammonium ions at the end of the linkers; d) imparting additional solubility to the sidechains by replacing the alkyl linkers with multi-ether . . . —O—C—O—C— . . . linkers; further functionalizing the phenylene unit either with polar or charged sidechains; e) exchanging the iodide counterion for other halide ions or more complex (carbon-based) counterions, or employing combinations of the above modifications.

In various embodiments, the poly([fluorene]-alt-co-[phenylene]) (PFP) or a derivative thereof has a molecular weight (MW) from 1,000 g/mol to 100,000 g/mol; from 5,000 g/mol to 100,000 g/mol; from 10,000 g/mol to 100,000 g/mol; from 15,000 g/mol to 100,000 g/mol; from 20,000 g/mol to 100,000 g/mol; from 25,000 g/mol to 100,000 g/mol; from 30,000 g/mol to 100,000 g/mol; from 35,000 g/mol to 100,000 g/mol; from 40,000 g/mol to 100,000 g/mol; from 45,000 g/mol to 100,000 g/mol; from 50,000 g/mol to 100,000 g/mol; from 55,000 g/mol to 100,000 g/mol; from 60,000 g/mol to 100,000 g/mol; from 65,000 g/mol to 100,000 g/mol; from 70,000 g/mol to 100,000 g/mol; from 75,000 g/mol to 100,000 g/mol; from 80,000 g/mol to 100,000 g/mol; from 85,000 g/mol to 100,000 g/mol; from 90,000 g/mol to 100,000 g/mol; from 95,000 g/mol to 100,000 g/mol; from 1,000 g/mol to 95,000 g/mol; from 1,000 g/mol to 90,000 g/mol; from 1,000 g/mol to 85,000 g/mol; from 1,000 g/mol to 80,000 g/mol; from 1,000 g/mol to 75,000 g/mol; from 1,000 g/mol to 70,000 g/mol; from 1,000 g/mol to 65,000 g/mol; from 1,000 g/mol to 60,000 g/mol; from 1,000 g/mol to 55,000 g/mol; from 1,000 g/mol to 50,000 g/mol; from 1,000 g/mol to 45,000 g/mol; from 1,000 g/mol to 40,000 g/mol; from 1,000 g/mol to 35,000 g/mol; from 1,000 g/mol to 30,000 g/mol; from 1,000 g/mol to 25,000 g/mol; from 1,000 g/mol to 20,000 g/mol; from 1,000 g/mol to 15,000 g/mol; from 1,000 g/mol to 10,000 g/mol; or from 1,000 g/mol to 5,000 g/mol.

In various embodiments, the poly([fluorene]-alt-co-[phenylene]) (PFP) or a derivative thereof has a molecular weight (MW) from 500 g/mol to 125,000 g/mol.

In various embodiments, the acceptor CPE is a poly (alkylcarboxythiophene) (PTAK) or a derivative thereof. The PTAK chemical structure can be derivatized in a number of ways, including, but in no way limited to: a) exchanging the alkyl linker connecting the thiophene monomer to the carboxylate anion for a multi-ether . . . —O—C—O—C— . . . linker to impart additional solubility; and/or b) by exchanging the counterion for other simple alkali earth cations or more complex (carbon-based) counterions.

In various embodiments, the poly(alkylcarboxythiophene) (PTAK) or a derivative thereof has a molecular weight (MW) from 1,000 g/mol to 100,000 g/mol; from 5,000 g/mol to 100,000 g/mol; from 10,000 g/mol to 100,000 g/mol; from 15,000 g/mol to 100,000 g/mol; from 20,000 g/mol to 100,000 g/mol; from 25,000 g/mol to 100,000 g/mol; from 30,000 g/mol to 100,000 g/mol; from 35,000 g/mol to 100,000 g/mol; from 40,000 g/mol to 100,000 g/mol; from 45,000 g/mol to 100,000 g/mol; from 50,000 g/mol to 100,000 g/mol; from 55,000 g/mol to 100,000 g/mol; from 60,000 g/mol to 100,000 g/mol; from 65,000 g/mol to 100,000 g/mol; from 70,000 g/mol to 100,000 g/mol; from 75,000 g/mol to 100,000 g/mol; from 80,000 g/mol to 100,000 g/mol; from 85,000 g/mol to 100,000 g/mol; from 90,000 g/mol to 100,000 g/mol; from 95,000 g/mol to 100,000 g/mol; from 1,000 g/mol to 95,000 g/mol; from 1,000 g/mol to 90,000 g/mol; from 1,000 g/mol to 85,000 g/mol; from 1,000 g/mol to 80,000 g/mol; from 1,000 g/mol to 75,000 g/mol; from 1,000 g/mol to 70,000 g/mol; from 1,000 g/mol to 65,000 g/mol; from 1,000 g/mol to 60,000 g/mol; from 1,000 g/mol to 55,000 g/mol; from 1,000 g/mol to 50,000 g/mol; from 1,000 g/mol to 45,000 g/mol; from 1,000 g/mol to 40,000 g/mol; from 1,000 g/mol to 35,000 g/mol; from 1,000 g/mol to 30,000 g/mol; from 1,000 g/mol to 25,000 g/mol; from 1,000 g/mol to 20,000 g/mol; from 1,000 g/mol to 15,000 g/mol; from 1,000 g/mol to 10,000 g/mol; or from 1,000 g/mol to 5,000 g/mol.

In various embodiments, the poly(alkylcarboxythiophene) (PTAK) or a derivative thereof has a molecular weight (MW) from 500 g/mol to 125,000 g/mol.

In various embodiments, the acceptor CPE is a regiorandom PTAK or regioregular PTAK, or a benzodithiophene derivative of PTAK, or a combination thereof.

In various embodiments, the charge ratio between the donor CPE and the acceptor CPE is about 1:0.25, 1:0.5, 1:1, or 1:2. The charge ratio is calculated as the total concentration of polymer positive charges in the initially-mixed solution (number of charges per monomer multiplied by the monomer concentration) relative to the total concentration of negative ions on the polymer backbone calculated in an identical manner.

In various embodiments, the charge ratio between the donor CPE and the acceptor CPE is about from 1:0.1 to 1:0.2, from 1:0.2 to 1:0.3, from 1:0.3 to 1:0.4, from 1:0.4 to 1:0.5, from 1:0.5 to 1:0.6, from 1:0.6 to 1:0.7, from 1:0.7 to 1:0.8, from 1:0.8 to 1:0.9, or from 1:0.9 to 1:1.0. In various embodiments, the charge ratio between the donor CPE and the acceptor CPE is about from 1:1 to 1:2, from 1:2 to 1:3, from 1:3 to 1:4, from 1:4 to 1:5, from 1:5 to 1:6, from 1:6 to 1:7, from 1:7 to 1:8, from 1:8 to 1:9, or from 1:9 to 1:10. In various embodiments, the charge ratio can be tuned continuously from 100% of one of the CPE's to 0% of the other (bearing the opposite charge) by simply controlling the solution concentrations prior to mixing to produce the CPEC solution.

In various embodiments, an LHA as disclosed herein is encapsulated in a membrane, liposome, or vesicle. In various embodiments, the membrane is oleoylphosphatidycholine or a derivative thereof. In some embodiments, the membrane can be, but is in no way limited to Phosphatidylinositol, Phosphatidylethanolamines, Phosphosphingolipids, or combinations thereof. In some embodiments, the membrane can be any phospholipid or any phospholipid derivative. In some embodiments, the membrane can be any phospholipid or any phospholipid derivative capable of forming lipid vesicles in water.

Various embodiments of the present invention also provide a method of manufacturing a LHA. In some embodiments, the method comprises: providing a donor CPE solution and an acceptor CPE solution; mixing the donor CPE solution and the acceptor CPE solution: and generating a CPEC of the donor CPE and the acceptor CPE, wherein the generated CPEC is the manufactured LHA. In some embodiments, the method consists of or consists essentially of: providing a donor CPE solution and an acceptor CPE solution; mixing the donor CPE solution and the acceptor CPE solution: and generating a CPEC of the donor CPE and the acceptor CPE, wherein the generated CPEC is the manufactured LHA. In accordance with the present invention, the step of mixing can be performed in a variety of ways, which may include, but are in no way limited to, introducing the donor CPE solution and the acceptor CPE solution into a common vessel; introducing the donor CPE solution into the acceptor CPE solution; and introducing the acceptor CPE solution into the donor CPE solution. In accordance with the present invention, the order and/or rate of introducing each donor or acceptor CPE solution may be varied and adjusted to achieve a desirable outcome. Additional factors that may influence outcome may include, but are in no way limited to, solution temperature, extent of ultracentrifugation, CPE backbone charge density, total solution concentration, ionic strength and dielectric environment.

In various embodiments, the mixture may contain a liquid phase and a solid phase. In accordance with the present invention, CPEC can exist in both the liquid and solid phases. In various embodiments, the method further comprises separating the liquid phase and the solid phase of the mixture.

In various embodiments, the method further comprises adjusting the charge ratio between the donor CPE and the acceptor CPE. In various embodiments, the charge ratio between the donor CPE and the acceptor CPE is adjusted to be about 1:0.25, 1:0.5, 1:1, or 1:2. In various embodiments, the charge ratio between the donor CPE and the acceptor CPE is adjusted to be about from 1:0.1 to 1:0.2, from 1:0.2 to 1:0.3, from 1:0.3 to 1:0.4, from 1:0.4 to 1:0.5, from 1:0.5 to 1:0.6, from 1:0.6 to 1:0.7, from 1:0.7 to 1:0.8, from 1:0.8 to 1:0.9, or from 1:0.9 to 1:1.0. In various embodiments, the charge ratio between the donor CPE and the acceptor CPE is about from 1:1 to 1:2, from 1:2 to 1:3, from 1:3 to 1:4, from 1:4 to 1:5, from 1:5 to 1:6, from 1:6 to 1:7, from 1:7 to 1:8, from 1:8 to 1:9, or from 1:9 to 1:10. In various embodiments, the charge ratio can be tuned continuously from 100% of one of the CPE's to 0% of the other (bearing the opposite charge) by simply controlling the solution concentrations prior to mixing to produce the CPEC solution.

In various embodiments, the method further comprises adjusting the ionic strength in the donor CPE solution and/or the acceptor CPE solution and/or the mixture of the donor CPE solution and the acceptor CPE solution. In some embodiments, the method further comprises adjusting the ionic strength in the donor CPE solution. In other embodiments, the method further comprises adjusting the ionic strength in the acceptor CPE solution. In still other embodiments, the method further comprises adjusting the ionic strength in the mixture of the donor CPE solution and the acceptor CPE solution.

In various embodiments, the ionic strength of a solution (e.g., the donor CPE solution, the acceptor CPE solution, and their mixture) is adjusted through adjusting the amount of a halogen ion, fluorine (F) ion, chlorine (Cl) ion, bromine (Br) ion, iodine (I) ion, or astatine (At) ion, or a combination thereof. Other ions that may be used include, but are in no way limited to carboxylic acid-based ions such as muconate, adipate and related derivatives.

In various embodiments, the ionic strength of a solution (e.g., the donor CPE solution, the acceptor CPE solution, and their mixture) is adjusted through adjusting the amount of a salt, a halogen salt, KI, KF, KCl, KBr, or KAt, or a combination thereof. In various embodiments, this includes other monovalent alkali earth ions such as cations of Na, Li and Rb, as well as divalent ions such as Ca.

In various embodiments, the total excess ion concentration in a solution (e.g., the donor CPE solution, the acceptor CPE solution, and their mixture) is adjusted to be about 0.01, 0.02, 0.03, 0.04, 0.05, 0.06, 0.07, 0.08, 0.09, or 0.1 M. In various embodiments, the ionic strength is adjusted to about 0.001-0.01, 0.01-0.1, 0.1-0.5, 0.5-5, 5-10.

In various embodiments, the method further comprises adjusting the solvent composition of the donor CPE solution, and/or the acceptor CPE solution, and/or the mixture of the donor CPE solution and the acceptor CPE solution. In some embodiments, the method further comprises adjusting the solvent composition of the donor CPE solution. In some embodiments, the method further comprises adjusting the solvent composition of the acceptor CPE solution. In some embodiments, the method further comprises adjusting the solvent composition of the mixture of the donor CPE solution and the acceptor CPE solution.

In various embodiments, the solvent composition of a solution (e.g., the donor CPE solution, the acceptor CPE solution, and their mixture) includes water, nonaqueous component, or a combination thereof. Examples of the nonaqueous component can include, but are not limited to, THF, dioxane, DMF, DMSO, methanol, ethanol, NMP, and combinations thereof.

In various embodiments, the ratio between water and the nonaqueous component is about from 1:0.1 to 1:0.2, from 1:0.2 to 1:0.3, from 1:0.3 to 1:0.4, from 1:0.4 to 1:0.5, from 1:0.5 to 1:0.6, from 1:0.6 to 1:0.7, from 1:0.7 to 1:0.8, from 1:0.8 to 1:0.9, or from 1:0.9 to 1:1.0. In various embodiments, the ratio between water and the nonaqueous component is about from 1:1 to 1:2, from 1:2 to 1:3, from 1:3 to 1:4, from 1:4 to 1:5, from 1:5 to 1:6, from 1:6 to 1:7, from 1:7 to 1:8, from 1:8 to 1:9, or from 1:9 to 1:10.

In various embodiments, the method further comprises adjusting the sidechain charge density of the donor CPE and/or the acceptor CPE. In some embodiments, the method further comprises adjusting the sidechain charge density of the donor CPE. In some embodiments, the method further comprises adjusting the sidechain charge density of acceptor CPE. In various embodiments, the side charge density of a donor or acceptor CPE is adjusted to be about 100% charged to 50% charged.

In various embodiments, the method further comprises adjusting the pH of the donor CPE solution, and/or the acceptor CPE solution, and/or the mixture of the donor CPE solution and the acceptor CPE solution. In some embodiments, the method further comprises adjusting the pH of the donor CPE solution. In some embodiments, the method further comprises adjusting the pH of the acceptor CPE solution. In some embodiments, the method further comprises adjusting the pH of the mixture of the donor CPE solution and the acceptor CPE solution. In various embodiments, the pH of a solution (e.g., the donor CPE solution, the acceptor CPE solution, and their mixture) is adjusted to be about 3, 4, 5, 6, 7, 8, 9, 10, or 11.

In various embodiments, the method further includes adjusting the concentration of a surfactant molecule in the donor CPE solution, and/or the acceptor CPE solution, and/or the mixture of the donor CPE solution and the acceptor CPE solution. In some embodiments, the method further comprises adjusting the concentration of a surfactant molecule in the donor CPE solution. In some embodiments, the method further comprises adjusting the concentration of a surfactant molecule in the acceptor CPE solution. In some embodiments, the method further comprises adjusting the concentration of a surfactant molecule in the mixture of the donor CPE solution and the acceptor CPE solution.

Various embodiments of the present invention also provide a method of conducting photosynthesis. The method may comprise, or may consist essentially of, or may consist of: providing a LHA as disclosed herein; and using the LHA in a photosynthetic process, thereby conducting photosynthesis. In some embodiments, the LHA is assembled into a LHA array. In various embodiments, the LHA is assembled with additional components to form an artificial photosystem. Examples of the additional components include but are not limited to reaction centers (RCs), oxidizing catalysts, and reducing catalysts. In some embodiments, and LHA array comprises two or more LHA. In some embodiments, the photosynthesis is artificial photosynthesis. In some embodiments, the photosynthetic process is an artificial photosynthetic process.

Various embodiments of the present invention also provide a reaction center (RC). In some embodiments, the RC comprises: a complex comprising a water-soluble phthalocyanine-based donor and a water-soluble fullerene-based acceptor. In other embodiments, the RC consists of or consists essentially of: a complex comprising a water-soluble phthalocyanine-based donor and a water-soluble fullerene-based acceptor.

In various embodiments, a RC as disclosed herein is encapsulated in a membrane, liposome, or vesicle. In various embodiments, the membrane is oleoylphosphatidycholine or a derivative thereof.

In various embodiments, the water-soluble phthalocyanine-based donor is a metal-free phthalocyanine tetrasulfonic acid (TSPc) or a derivative thereof. The phthalocyanine core can be derivatized by varying the charged sidechains, such as replacing the sulfonic acid sidechains with carboxylate anions or quaternary ammonium cations, as well as extending the carbon linker between the conjugated core of the molecule and the charged periphery with multi-ether . . . —O—C—O—C— . . . groups. Furthermore, the metal-free core can be occupied by a metal atom or ion, allowing for additional functionalization by coordination to the metal via, e.g., amine ligands. Additionally, the conjugated ring of the phthalocyanine may be replaced by other macrocyclic configurations, such as systems based on porphyrins and their derivatives. In some embodiments, two or more of these modifications may be employed.

Various embodiments of the present invention also provide a method of conducting photosynthesis. The method may comprise, or may consist essentially of, or may consist of: providing a RC as disclosed herein; and using the RC in a photosynthetic process, thereby conducting photosynthesis. In various embodiments, the RC is assembled with additional components to form an artificial photosystem. Examples of the additional components include, but are not limited to, LHA or LHA arrays, oxidizing catalysts, and reducing catalysts. In some embodiments, the photosynthesis is artificial photosynthesis. In some embodiments, the photosynthetic process is an artificial photosynthetic process.

Various embodiments of the present invention provide an artificial photosystem comprising: a LHA. In various embodiments, the LHA may comprise, or may consist essentially of, or may consist of a conjugated polyelectrolyte (CPE) complex comprising a donor CPE and an acceptor CPE, wherein the donor CPE and acceptor CPE are an electronic energy transfer (EET) donor/acceptor pair. In various embodiments, the artificial photosystem comprises more than one LHA that form a LHA array.

In various embodiments, the artificial photosystem further comprises a reaction center (RC), wherein the RC and LHA form a supercomplex. In various embodiments, the RC may comprise, or may consist essentially of, or may consist of a complex comprising a water-soluble phthalocyanine-based donor and a water-soluble fullerene-based acceptor. In various embodiments, the artificial photosystem comprises more than one RC. In various embodiments, the RC is electronically linked to the LHA or LHA array. In various embodiments, the RC is structurally linked to the LHA or LHA array. In various embodiments, the RC is covalently linked to the LHA or LHA array. In various embodiments, the RC is non-covalently linked to the LHA or LHA array.

In various embodiments, the artificial photosystem further includes an oxidizing catalyst. In some embodiments, the oxidizing catalyst may include, but is in no way limited to $TiO_2$, ZnO or Mn-based clusters akin to the oxygen evolving complex in plants.

In various embodiments, the artificial photosystem further comprises a reducing catalyst. In various embodiments, the reducing catalyst may include, but is in no way limited to Re-based catalysts or Ru-based catalysts.

Artificial photosystems of the present invention may be used for numerous applications. Merely by way of non-limiting examples, the artificial photosystems described herein may be imbedded in a membrane, affixed on a surface as a thin film, or used directly in the liquid phase to generate fuel molecules such as $H_2$ and methanol by photochemistry occurring at the catalytic sites following transfer of charge from photoexcited CPE-based components.

In various embodiments, an artificial photosystem as disclosed herein is encapsulated in a membrane, liposome, or vesicle. In various embodiments, the membrane is oleoylphosphatidycholine or a derivative thereof.

Various embodiments of the present invention also provide a method of conducting photosynthesis. The method may comprise, or may consist essentially of, or may consist of: providing the artificial photosystem as disclosed herein; and using the artificial photosystem in a photosynthetic process, thereby conducting photosynthesis. In some embodiments, the photosynthesis is artificial photosynthesis. In some embodiments, the photosynthetic process is an artificial photosynthetic process.

Some embodiments of the present invention can be defined as any of the following numbered paragraphs:

1. A light-harvesting antenna (LHA), comprising: a conjugated polyelectrolyte (CPE) complex (CPEC) comprising a donor CPE and an acceptor CPE, wherein the donor CPE and acceptor CPE are an electronic energy transfer (EET) donor/acceptor pair.
2. The LHA of paragraph 1, wherein the CPE complex (CPEC) further comprises a surfactant molecule.
3. The LHA of paragraph 2, wherein the surfactant molecule is ionic, charged, zwitterionic, non-ionic, lipophilic, lipophobic, hydrophobic, hydrophilic, amphiphilic or amphipathic.
4. The LHA of paragraph 1, wherein the CPE complex (CPEC) further comprises a second or more donor CPEs and/or a second or more acceptor CPEs.
5. The LHA of paragraph 1, wherein the donor CPE and the acceptor CPE are oppositely charged.
6. The LHA of paragraph 1, wherein the CPE complex (CPEC) is formed via electrostatic interactions between the donor CPE and the acceptor CPE.
7. The LHA of paragraph 1, wherein the CPE complex (CPEC) is formed via non-covalent interactions between the donor CPE and the acceptor CPE.
8. The LHA of paragraph 1, wherein the donor CPE is a poly([fluorene]-alt-co-[phenylene]) (PFP) or a derivative thereof.
9. The LHA of paragraph 1, wherein the acceptor CPE is a poly(alkylcarboxythiophene) (PTAK) or a derivative thereof.
10. The LHA of paragraph 1, wherein the acceptor CPE is a regiorandom PTAK or regioregular PTAK, or a benzodithiophene derivative of PTAK, or a combination thereof.
11. The LHA of paragraph 1, wherein the charge ratio between the donor CPE and the acceptor CPE is about 1:0.25, 1:0.5, 1:1, or 1:2.
12. The LHA of paragraph 1, wherein the charge ratio between the donor CPE and the acceptor CPE is about from 1:0.1 to 1:0.2, from 1:0.2 to 1:0.3, from 1:0.3 to 1:0.4, from 1:0.4 to 1:0.5, from 1:0.5 to 1:0.6, from 1:0.6 to 1:0.7, from 1:0.7 to 1:0.8, from 1:0.8 to 1:0.9, or from 1:0.9 to 1:1.0.
13. The LHA of paragraph 1, wherein the charge ratio between the donor CPE and the acceptor CPE is about from 1:1 to 1:2, from 1:2 to 1:3, from 1:3 to 1:4, from 1:4 to 1:5, from 1:5 to 1:6, from 1:6 to 1:7, from 1:7 to 1:8, from 1:8 to 1:9, or from 1:9 to 1:10.
14. The LHA of paragraph 1, encapsulated in a membrane, liposome, or vesicle.
15. The LHA of paragraph 14, wherein the membrane is oleoylphosphatidycholine or a derivative thereof.
16. A method of conducting photosynthesis, comprising:
   providing the LHA of paragraph 1; and
   using the LHA in a photosynthetic process, thereby conducting photosynthesis.
17. The method of paragraph 16, wherein the photosynthesis is artificial photosynthesis.
18. The method of paragraph 16, wherein the photosynthetic process is an artificial photosynthetic process.
19. A method of manufacturing a light-harvesting antenna (LHA), comprising:
   providing a donor CPE solution and an acceptor CPE solution, wherein the donor CPE solution comprises a donor CPE and the acceptor CPE solution comprises an acceptor CPE;
   mixing the donor CPE solution and the acceptor CPE solution to provide a mixture of the donor CPE solution and the acceptor CPE solution; and
   generating a CPE complex (CPEC) of the donor CPE and the acceptor CPE, wherein the generated CPE complex (CPEC) is the manufactured LHA.
20. The method of paragraph 19, further comprising adjusting a charge ratio between the donor CPE and the acceptor CPE.
21. The method of paragraph 19, further comprising adjusting an ionic strength in one or more of the donor CPE solution, the acceptor CPE solution, or the mixture of the donor CPE solution and the acceptor CPE solution.
22. The method of paragraph 21, wherein the ionic strength is adjusted through adjusting an amount of a halogen ion, fluorine (F) ion, chlorine (Cl) ion, bromine (Br) ion, iodine (I) ion, or astatine (At) ion, or a combination thereof.
23. The method of paragraph 21, wherein the ionic strength is adjusted through adjusting an amount of a salt, a halogen salt, KI, KF, KCl, KBr, or KAt, or a combination thereof.
24. The method of paragraph 19, wherein the mixture of the donor CPE solution and the acceptor CPE solution comprises a liquid phase and a solid phase.
25. The method of paragraph 24, further comprising separating the liquid phase and the solid phase of the mixture.
26. The method of paragraph 19, further comprising adjusting a solvent composition of one or more of the donor CPE solution, the acceptor CPE solution, or the mixture of the donor CPE solution and the acceptor CPE solution.
27. The method of paragraph 26, wherein independently one or more of the solvent composition comprises water, a nonaqueous component, or a combination thereof.
28. The method of paragraph 19, further comprising adjusting a sidechain charge density of one or more of the donor CPE or the acceptor CPE.
29. The method of paragraph 19, further comprising adjusting a pH of one or more of the donor CPE solution, the acceptor CPE solution, or the mixture of the donor CPE solution and the acceptor CPE solution.
30. The method of paragraph 19, further comprising adjusting a concentration of a surfactant molecule in one or more of the donor CPE solution, the acceptor CPE solution, or the mixture of the donor CPE solution and the acceptor CPE solution.
31. A reaction center (RC) comprising a complex comprising a water-soluble phthalocyanine-based donor and a water-soluble fullerene-based acceptor.
32. The RC of paragraph 31, wherein the water-soluble phthalocyanine-based donor is a metal-free phthalocyanine tetrasulfonic acid (TSPc) or a derivative thereof.
33. A method of conducting photosynthesis, comprising:
   providing the RC of paragraph 31; and
   using the RC in a photosynthetic process, thereby conducting photosynthesis.
34. The method of paragraph 33, wherein the photosynthesis is artificial photosynthesis.
35. The method of paragraph 33, wherein the photosynthetic process is an artificial photosynthetic process.

36. An artificial photosystem, comprising: one or more light-harvesting antenna (LHA) comprising a conjugated polyelectrolyte (CPE) complex (CPEC) comprising a donor CPE and an acceptor CPE, wherein the donor CPE and acceptor CPE are an electronic energy transfer (EET) donor/acceptor pair.

37. The artificial photosystem of paragraph 36, comprising more than one LHA that form an LHA array.

38. The artificial photosystem of paragraph 36, further comprising a reaction center (RC), wherein the RC and the LHA form a supercomplex.

39. The artificial photosystem of paragraph 38, wherein the RC is electronically linked to the LHA.

40. The artificial photosystem of paragraph 36, further comprising an oxidizing catalyst.

41. The artificial photosystem of paragraph 36, further comprising a reducing catalyst.

42. The artificial photosystem of paragraph 36, encapsulated in a membrane, liposome, or vesicle.

43. The artificial photosystem of paragraph 42, wherein the membrane is oleoylphosphatidycholine or a derivative thereof.

44. A method of conducting photosynthesis, comprising:
   providing the artificial photosystem of paragraph 36; and
   using the artificial photosystem in a photosynthetic process, thereby conducting photosynthesis.

45. The method of paragraph 44, wherein the photosynthesis is artificial photosynthesis.

46. The method of paragraph 44, wherein the photosynthetic process is an artificial photosynthetic process.

Many variations and alternative elements have been disclosed in embodiments of the present invention. Still further variations and alternative elements will be apparent to one of skill in the art. Various embodiments of the invention can specifically include or exclude any of these variations or elements.

In some embodiments, the numbers expressing quantities of ingredients, properties such as concentrations, reaction conditions, and so forth, used to describe and claim certain embodiments of the invention are to be understood as being modified in some instances by the term "about". Accordingly, in some embodiments, the numerical parameters set forth in the written description and attached claims are approximations that can vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the invention are approximations, the numerical values set forth in the specific examples are reported as precisely as practicable. The numerical values presented in some embodiments of the invention may contain certain errors necessarily resulting from the standard deviation found in their respective testing measurements.

Groupings of alternative elements or embodiments of the invention disclosed herein are not to be construed as limitations. Each group member can be referred to and claimed individually or in any combination with other members of the group or other elements found herein. One or more members of a group can be included in, or deleted from, a group for reasons of convenience and/or patentability. When any such inclusion or deletion occurs, the specification is herein deemed to contain the group as modified thus fulfilling the written description of all Markush groups used in the appended claims.

EXAMPLES

The disclosure is further illustrated by the following examples which are intended to be purely exemplary of the invention, and which should not be construed as limiting the invention in any way. The following examples are illustrative only, and are not intended to limit, in any manner, any of the aspects described herein. The following examples are provided to better illustrate the claimed invention and are not to be interpreted as limiting the scope of the invention. To the extent that specific materials are mentioned, it is merely for purposes of illustration and is not intended to limit the invention. One skilled in the art may develop equivalent means or reactants without the exercise of inventive capacity and without departing from the scope of the invention.

Example 1

Introduction

In some embodiments, the technology of the present application relates to the absorption, energy funneling and charge transfer functions of photosystems. The use of conjugated polyelectrolytes (CPEs)—semiconducting polymers bearing ionizable sidechains is described herein. (Iii, S. W. T.; Joly, G. D.; Swager, T. M. Chemical Sensors Based on Amplifying Fluorescent Conjugated Polymers. Chem. Rev. 2007, 107, 1339-1386; Jiang, H.; Taranekar, P.; Reynolds, J. R.; Schanze, K. S. Conjugated Polyelectrolytes: Synthesis, Photophysics, and Applications. Angew. Chem. Int. Ed. Engl. 2009, 48, 4300-4316). Due to their light-harvesting backbones and charged (or dipolar) sidechains, CPEs are uniquely positioned to simultaneously serve as electronic energy relays and macromolecular scaffolds for meso-scale electronic and excitonic donor/acceptor complexes. Using CPEs in light-harvesting assemblies obviates the need for an optically inactive scaffolding, thereby raising the density of subunits that directly contribute to excited state generation. In fact, a single CPE chain may contain a large number of quasi-independent light-absorbing units (chromophores)—a necessary requirement for facile concentration and funneling of excited states. (Scholes, G. D.; Fleming, G. R.; Olaya-Castro, A.; van Grondelle, R. Lessons from Nature about Solar Light Harvesting. Nat. Chem. 2011, 3, 763-774; Stirbet, A. Excitonic Connectivity between Photosystem II Units: What Is It, and How to Measure It? Photosynth. Res. 2013, 116, 189-214; Barter, L. M. C.; Durrant, J. R.; Klug, D. R. A Quantitative Structure-Function Relationship for the Photosystem II Reaction Center: Supermolecular Behavior in Natural Photosynthesis. Proc. Natl. Acad. Sci. U.S.A 2003, 100, 946-951; Croce, R.; van Amerongen, H. Light-Harvesting and Structural Organization of Photosystem II: From Individual Complexes to Thylakoid Membrane. J. Photochem. Photobiol. B. 2011, 104, 142-153; McConnell, I.; Li, G.; Brudvig, G. W. Energy Conversion in Natural and Artificial Photosynthesis. Chem. Biol. 2010, 17, 434-447).

Unlike covalently-linked assemblies, the CPE's ability to form modular, hierarchical super complexes via electrostatic interactions and its large chromophore density imbue these materials with significant potential for artificial, "soft" photosystem applications. Moreover, the combination of through-bond transport, by virtue of backbone wavefunction delocalization, and inter-chain coupling opens up possibilities for both efficient charge separation (due to rapid charge delocalization) and coherent electronic energy transport. (Hayes, D.; Griffin, G. B.; Engel, G. S. Report Engineering Coherence Among Excited States in Synthetic Heterodimer Systems. Science 2013, 340, 1431-1434; Scholes, G. Quantum-Coherent Electronic Energy Transfer: Did Nature Think of It First? J. Phys. Chem. Lett. 2001, 1, 2-8; Christensson, N.; Kauffmann, H. F.; Pullerits, T.; Mančal, T. Origin of Long-Lived Coherences in Light-Harvesting Complexes. J. Phys. Chem. B 2012, 116, 7449-7454; Cheng, Y.-C.; Fleming, G. R. Dynamics of Light Harvesting in Photosynthesis. Annu. Rev. Phys. Chem. 2009, 60, 241-262).

In various embodiments, the present invention is based upon addressing the following questions:

1) What are the dominant factors that dictate the equilibrium and nonequilibrium thermodynamics and, thus, the structure of light-harvesting antennae (LHA) composed of strongly-interacting CPEs that form an EET donor/acceptor pair? How do the EET dynamics reflect this underlying structure?

2) How can one form a simultaneous structural and electronic link between LHA and reaction centers (RCs) using the full range of electrostatic, π-stacking and ion-π interactions?

3) How does the local environment of donor/acceptor complexes that undergo photoexcited electron transfer (ET) in the RC determine back-ET (recombination) rates, and how can self-assembly be utilized to lead to long-lived charge-separated states?

Background, Significance and Results

Promise and Principles of Photosynthetic Energy Conversion

The natural photosynthetic process functions by converting the photon energy absorbed by organic pigments into electronic excitations, which are then transferred through a molecular scaffold to a RC. (Scholes, G. D.; Fleming, G. R.; Olaya-Castro, A.; van Grondelle, R. Lessons from Nature about Solar Light Harvesting. Nat. Chem. 2011, 3, 763-774; McConnell, I.; Li, G.; Brudvig, G. W. Energy Conversion in Natural and Artificial Photosynthesis. Chem. Biol. 2010, 17, 434-447; Cheng, Y.-C.; Fleming, G. R. Dynamics of Light Harvesting in Photosynthesis. Annu. Rev. Phys. Chem. 2009, 60, 241-262; Brotosudarmo, T. H. P.; Prihastyanti, M. N. U.; Gardiner, A. T.; Carey, A.-M.; Cogdell, R. J. The Light Reactions of Photosynthesis as a Paradigm for Solar Fuel Production. Energy Procedia 2014, 47, 283-289). The excited state is trapped at the RC, where it subsequently undergoes charge separation at a molecular donor/acceptor interface. The totality of the absorbing pigments makes up the LHA of the natural photosystem. Their function is to increase the effective absorption cross-section of the reaction center due to both the number density of chromophores and the broad spectral coverage of complimentary pigments. The LHA array and the RC together, in addition to oxidizing and reducing catalysts, make up the natural photosystem.

"Soft" Artificial Photosystems

To date, there have been a number of successfully synthesized organic LHA and RCs. The main design principles of a coupled LHA and RC were demonstrated by Gust et al. by covalently linking a carotenoid molecule to a phthalocyanine-$C_{60}$ dyad. (Gust, D.; Moore, T. a; Moore, a L. Mimicking Photosynthetic Solar Energy Transduction. Acc. Chem. Res. 2001, 34, 40-48). As an example of particularly complex covalent engineering, Matile et al. have synthesized co-axial charge transport channels with an energy level gradient to promote facile charge separation over several nm. (Hayashi, H.; Sobczuk, A.; Bolag, A.; Sakai, N.; Matile, S. Antiparallel Three-Component Gradients in Double-Channel Surface Architectures. Chem. Sci. 2014, 5, 4610-4614). The primary drawback of the above approaches stems from the covalent linkage between the antennae and the RC. To date, a number of non-covalent interactions have been explored in attempts to generate self-assembled antennae and reaction centers. However, few investigators have tried to tackle the problem of assembling a complete modular organic artificial photosystem holistically, including linking an RC to an array of LHA—an architecture necessary to ensure large extinction coefficients.

The combination of a conjugated (semiconducting) backbone and ionic sidechains instills CPEs with particular promise for forming stable, excitonically-coupled artificial photosystem arrays. Previous work has demonstrated that CPEs can interact with charged and neutral macromolecules, such as surfactants, saturated synthetic polymers, proteins and nucleic acids. (Martinez-Tomé, M. J.; Esquembre, R.; Mallavia, R.; Mateo, C. R. Formation of Complexes between the Conjugated Polyelectrolyte poly{[9,9-bis(6'-N,N,N-Trimethylammonium)hexyl]fluorene-Phenylene} Bromide (HTMA-PFP) and Human Serum Albumin. Biomacromolecules 2010, 11, 1494-1501; Knaapila, M.; Evans, R. C.; Garamus, V. M.; Almásy, L.; Székely, N. K.; Gutacker, A.; Scherf, U.; Burrows, H. D. Structure and "Surfactochromic" Properties of Conjugated Polyelectrolyte (CPE): Surfactant Complexes between a Cationic Polythiophene and SDS in Water. Langmuir 2010, 26, 15634-15643; Liu, Z.; Wang, H.-L.; Cotlet, M. DNA Sequence-Dependent Photoluminescence Enhancement in a Cationic Conjugated Polyelectrolyte. Chem. Commun. 2014, 50, 11311-11313; Inal, S.; Chiappisi, L.; Kölsch, J. D.; Kraft, M.; Appavou, M.-S.; Scherf, U.; Wagner, M.; Hansen, M. R.; Gradzielski, M.; Laschewsky, A.; et al. Temperature-Regulated Fluorescence and Association of an Oligo(ethyleneglycol)methacrylate-Based Copolymer with a Conjugated Polyelectrolyte—the Effect of Solution Ionic Strength. J. Phys. Chem. B 2013, 117, 14576-14587; Wu, D.; Feng, F.; Xie, D.; Chen, Y.; Tan, W.; Schanze, K. S. Helical Conjugated Polyelectrolyte Aggregation Induced by Biotin-Avidin Interaction. J. Phys. Chem. Lett. 2012, 3, 1711-1715; Wang, D.; Gong, X.; Heeger, P. S.; Rininsland, F.; Bazan, G. C.; Heeger, A. J. Biosensors from Conjugated Polyelectrolyte Complexes. Proc. Natl. Acad. Sci. U.S.A. 2002, 99, 49-53; Treger, J. S.; Ma, V. Y.; Gao, Y.; Wang, C.-C.; Wang, H.-L.; Johal, M. S. Tuning the Optical Properties of a Water-Soluble Cationic Poly(p-Phenylenevinylene): Surfactant Complexation with a Conjugated Polyelectrolyte. J. Phys. Chem. B 2008, 112, 760-763). However, there has been no understanding of what governs multi-CPE donor/acceptor configurations, what determines the stability of their assembly, or how energy transfer can be combined with electron transfer and charge separation using self-assembly. In one aspect, a purpose of the present invention is to understand the intricacies of non-covalent interactions in CPEs and their super complexes so as to rationally direct the formation of a modular, multi-component artificial photosystem.

Results

The first set of questions to answer were: what determines the thermodynamic stability and solution-phase microstructure of oppositely-charged, water-soluble CPEs, and how does the energy transfer efficiency reflect this microstructure? Although oppositely charged, non-conjugated polyelectrolytes continue to be an area of active work, essentially nothing was known about the solution thermodynamics of assembled CPE complexes (CPECs). (Priftis, D.; Xia, X.; Margossian, K. O.; Perry, S. L.; Leon, L.; Qin, J.; de Pablo, J. J.; Tirrell, M. Ternary, Tunable Polyelectrolyte Complex Fluids Driven by Complex Coacervation. Macromolecules 2014, 47, 3076-3085; Leclercq, L.; Boustta, M.; Vert, M.

Dynamics of Polyelectrolyte Complex Formation and Stability as a Polyanion Is Progressively Added to a Polycation under Modeled Physicochemical Blood Conditions. J. Bioact. Compat. Polym. 2011, 26, 301-316; Spruijt, E.; Cohen Stuart, M. a.; van der Gucht, J. Linear Viscoelasticity of Polyelectrolyte Complex Coacervates. Macromolecules 2013, 46, 1633-1641; Spruijt, E.; Leermakers, F. a. M.; Fokkink, R.; Schweins, R.; van Well, A. a.; Cohen Stuart, M. a.; van der Gucht, J. Structure and Dynamics of Polyelectrolyte Complex Coacervates Studied by Scattering of Neutrons, X-Rays, and Light. Macromolecules 2013, 46, 4596-4605; Wang, Q.; Schleno, J. B. The Polyelectrolyte Complex/Coacervate Continuum. Macromolecules 2014, 47, 3108-3116; Biesheuvel, P. M.; Cohen Stuart, M. a. Electrostatic Free Energy of Weakly Charged Macromolecules in Solution and Intermacromolecular Complexes Consisting of Oppositely Charged Polymers. Langmuir 2004, 20, 2785-2791; Perry, S.; Li, Y.; Priftis, D.; Leon, L.; Tirrell, M. The Effect of Salt on the Complex Coacervation of Vinyl Polyelectrolytes. Polymers. 2014, 6, 1756-1772; Priftis, D.; Megley, K.; Laugel, N.; Tirrell, M. Complex Coacervation of Poly(ethylene-Imine)/polypeptide Aqueous Solutions: Thermodynamic and Rheological Characterization. J. Colloid Interface Sci. 2013, 398, 39-50; Chollakup, R.; Beck, J. B.; Dirnberger, K.; Tirrell, M.; Eisenbach, C. D. Polyelectrolyte Molecular Weight and Salt Effects on the Phase Behavior and Coacervation of Aqueous Solutions of Poly(acrylic Acid) Sodium Salt and Poly(allylamine) Hydrochloride. Macromolecules 2013, 46, 2376-2390; Hayashi, Y.; Ullner, M.; Linse, P. Complex Formation in Solutions of Oppositely Charged Polyelectrolytes at Different Polyion Compositions and Salt Content †. J. Phys. Chem. B 2003, 107, 8198-8207). A supramolecular CPEC, consisting of CPEs that form an EET donor/acceptor (D/A) pair, represents a chromophore-dense superstructure that shows significant promise for formation of a viable LHA array, and, as such, can form the foundation of an inventive LHA. In certain embodiments, the focus was on a representative pair of commercially-available oppositely-charged CPEs based on a poly(alkylcarboxythiophene) derivative (PTAK, MW~15,000 g/mol) and poly([fluorene]-alt-co-[phenylene]) derivative (PFP, MW~50,000 g/mol). Their chemical structures are shown in FIG. 2. The photoluminescence (PL) spectrum of PFP spectrally overlaps the absorption spectrum of PTAK, which without being bound by theory implies that EET from PFP to PTAK is thermodynamically allowed. This can be seen in FIG. 3B.

FIG. 3B shows the optical density (OD) and 1D PL spectra of PFP and PTAK. 2D PL spectra from an isolated PFP solution are shown in FIG. 4A. Interestingly, the PL of PFP exhibits two distinct regions: weak PL that comes from excitation within the main absorption band and a much stronger PL band that originates from excitation in the red tail of the OD (~425 nm). It was suspected that the latter feature is due to formation of J-aggregate-like species known for their enhanced PL quantum yield. (Würthner, F.; Kaiser, T. E.; Saha-Möller, C. R. J-Aggregates: From Serendipitous Discovery to Supramolecular Engineering of Functional Dye Materials. Angew. Chem. Int. Ed. Engl. 2011, 50, 3376-3410; Yamagata, H.; Spano, F. C. Interplay between Intrachain and Interchain Interactions in Semiconducting Polymer Assemblies: The HJ-Aggregate Model. J. Chem. Phys. 2012, 136, 184901; Spano, F. C. The Spectral Signatures of Frenkel Polarons in H- and J-Aggregates. Acc. Chem. Res. 2010, 43, 429-439; Scholes, G. D.; Jordanides, X. J.; Fleming, G. R. Adapting the Förster Theory of Energy Transfer for Modeling Dynamics in Aggregated Molecular Assemblies. J. Phys. Chem. B 2001, 105, 1640-1651; Eisfeld, a.; Briggs, J. S. The J- and H-Bands of Organic Dye Aggregates. Chem. Phys. 2006, 324, 376-384). FIG. 4B and FIG. 4C show PL spectra of isolated PTAK solutions corresponding to the CPEC charge ratios in FIG. 5A-FIG. 5D. In both PTAK solutions, excitation at the red edge of the OD results in negligible PL, and only blue wavelengths give rise to (diminished) PL at the higher concentration. While not wishing to be bound by any one particular theory, it is likely that a combination of self-absorption and π-stacked, aggregated inter-chain electronic states leads to quenching of the PL; the density of such states is expected to increase at higher concentrations.

It was determined that, when oppositely-charged PFP and PTAK are combined from their respective solutions, the resulting solution separates into two phases: a liquid phase and a precipitate/coacervate-like phase, depending on the solution ionic strength. There is precedent for this type of phase behavior from work on non-conjugated polyelectrolyte complexes. FIG. 5A shows 2D PL spectra of the 1:0.25 PFP:PTAK charge ratio CPEC solution phase. Remarkably, the solution PL spectrum resembles neither that of the isolated PFP nor PTAK solutions. The blue emission band of PFP is gone, the J-like state being barely visible, even though there is strong PFP absorption (not shown). The PTAK spectral region (~600-800 nm) now exhibits strong PL when exciting at the red edge of PTAK absorption, in stark contrast to the isolated CPE. Perhaps more surprisingly, the 1:1 CPEC solution phase (FIG. 5B) shows that excitation wavelengths between ~450-550 nm (that lead to substantial PTAK emission in the 1:025 CPEC) now lead to negligible PL.

It was determined that small amounts of excess KI lead to dramatic changes in CPEC thermodynamics. The concentration of both CPE's in the solution phase of the biphasic system drops substantially, and the morphology of the precipitate/coacervate phase changes visibly, becoming significantly more diffuse. It was determined that even at excess salt concentrations as large as 1 M, there is little evidence that a single solution phase is beginning to emerge—behavior that differs qualitatively from non-conjugated polyelectrolyte solutions. (Priftis, D.; Xia, X.; Margossian, K. O.; Perry, S. L.; Leon, L.; Qin, J.; de Pablo, J. J.; Tirrell, M. Ternary, Tunable Polyelectrolyte Complex Fluids Driven by Complex Coacervation. Macromolecules 2014, 47, 3076-3085; Wang, Q.; Schleno, J. B. The Polyelectrolyte Complex/Coacervate Continuum. Macromolecules 2014, 47, 3108-3116; Chollakup, R.; Beck, J. B.; Dirnberger, K.; Tirrell, M.; Eisenbach, C. D. Polyelectrolyte Molecular Weight and Salt Effects on the Phase Behavior and Coacervation of Aqueous Solutions of Poly(acrylic Acid) Sodium Salt and Poly(allylamine) Hydrochloride. Macromolecules 2013, 46, 2376-2390; Jha, P. K.; Desai, P. S.; Li, J.; Larson, R. G. pH and Salt Effects on the Associative Phase Separation of Oppositely Charged Polyelectrolytes. Polymers. 2014, 6, 1414-1436; Overbeek, J. T. G.; Voorn, M. J. Phase Separation of Polyelectrolyte Solutions. Theory of Complex Coacervation. J. Cell. Phys. 1957, 49, 7-26). The 2D PL spectrum of a 1:1 PTAK:PFP solution with a 0.01 M excess KI concentration is shown in FIG. 5C. The FIG. 5C shows that there is substantial PFP emission from the main absorption band and a small amount of J-like luminescence. PTAK emission is fairly weak; however, interestingly, there is enhancement in PTAK emission upon excitation of the J-like-band of PFP. Such enhancement in PTAK PL in the presence of PFP only is unambiguous proof of PFP:PTAK complex formation leading to EET from PFP to PTAK. It was determined that the solution PL spectrum evolves in a complex manner as a function of KI concentration.

FIG. 5D displays 2D PL spectra of the dried solid phase obtained from the 1:0.25 charge ratio mixture. There is no visible PL from PFP, and once again an enhancement in PTAK emission can be seen when exciting precisely at the wavelengths that give rise to PFP's J-like emission band in isolation. Thus, in the solid state, excited states of PFP transfer to PTAK with high efficiency. Though not identical, qualitatively this 2D PL shape is representative of solid films made from solutions of varying charge ratio (with no added salt). These data demonstrate that EET from PFP to PTAK in the CPEC is efficient, and that the emission characteristics of the two phases may be tuned using both the charge ratio and the solution ionic strength.

Figure 6A:
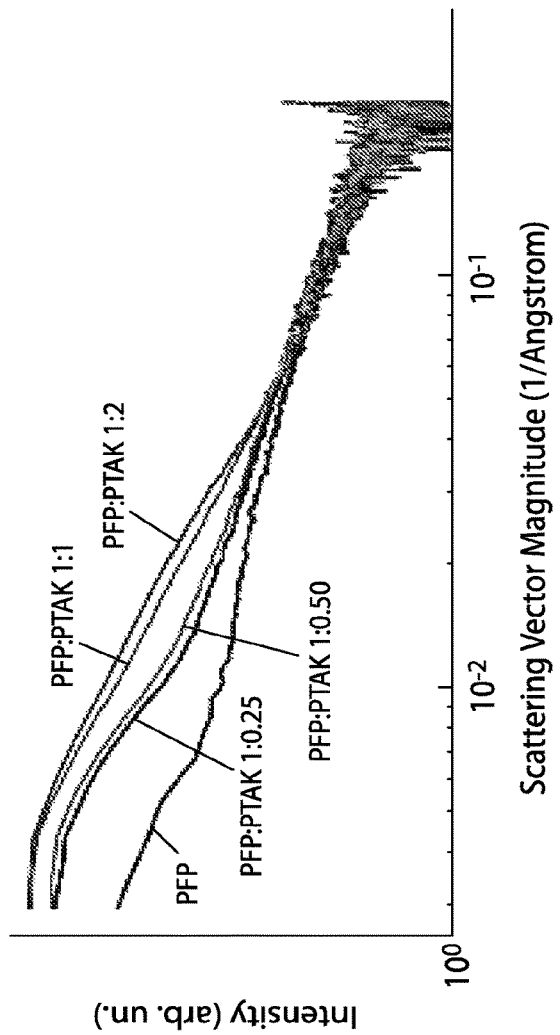
FIG. 6A-FIG. 6B depicts, in accordance with an embodiment of the invention, FIG. 6A SAXS curves of CPEC solutions with varying charge ratios.
Figure 6B:
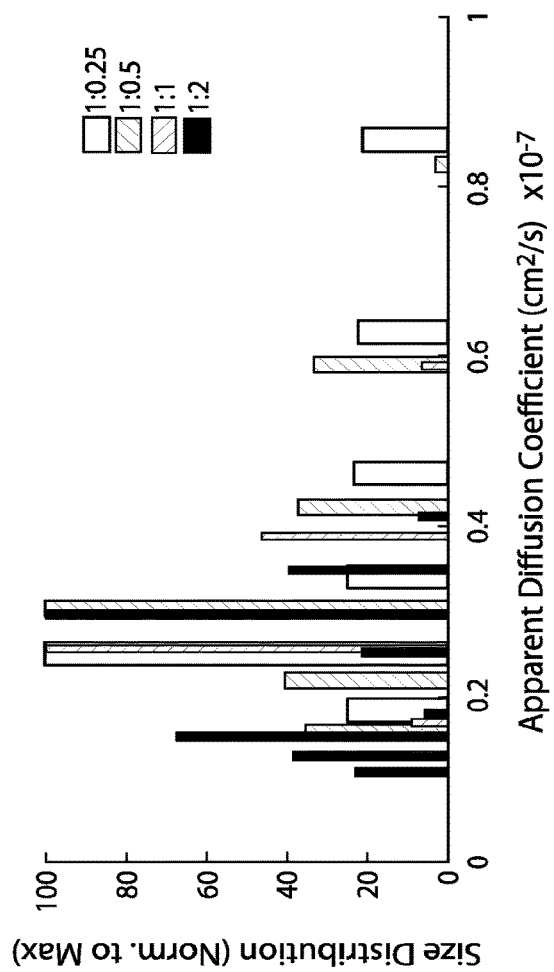

FIG. 6A shows solution small-angle X-ray scattering (SAXS) curves for isolated PFP and varying PFP:PTAK charge ratios. It is clear that the SAXS profile changes qualitatively, demonstrating that the solution microstructure evolves with charge ratio towards what appears to be a less defined characteristic length scale, as judged from the progressive "washing out" of the Guinier plateau below 10-2 Å-1.44,45 FIG. 6B demonstrates the distribution of diffusion coefficients obtained via dynamic light scattering (DLS). It can be seen that CPEC solutions of higher charge ratios lead to a clustering of the distribution around smaller diffusion coefficients (larger aggregate sizes), while at lower charge ratios, there is an additional significant distribution of smaller sizes.

It is also noted that CPEC solutions appear to exhibit substantial metastability. Although when mixed, the CPEC solution separates into what appear to be two equilibrium phases, removal of the solution phase following centrifugation can result in negligible additional precipitate formation months after separation of the two phases. To summarize, it was determined that CPECs based on PFP and PTAK form efficient EET relays, that the solution microstructure and PL characteristics can be tuned with charge ratio and ionic strength, and that CPEC solutions can exhibit complex, nonequilibrium thermodynamics.

Example 2

Donor/Acceptor CPE Complexes

To gain a comprehensive understanding of CPEC formation and stability, the initial focus can be on the PFP:PTAK CPEC. This model CPE pair can be used to determine the relationship between EET and its dependence on the structure of both the solution and solid/coacervate phases.

Salt Free PFP:PTAK CPECs

A number of questions about salt-free PFP:PTAK are important to consider: How does the microstructure of the CPEC evolve as a function of total polymer concentration and charge ratio, particularly in the vicinity of the gelation point? While not wishing to be bound by one particular theory, as the interconnected CPE network densifies, it is expected that the EET dynamics will reflect the local and long-range connectivity of the donor and acceptor polymers. What is responsible for the evolution of the PTAK PL spectrum within a PFP:PTAK CPEC as the PTAK concentration is increased? While not wishing to be bound by one particular theory, one possibility is that certain PTAK chain lengths (corresponding to a specific excitation wavelength region) preferentially complex with PFP. What is the relative efficiency of EET when exciting within the main absorption band vs. preferentially exciting the J-aggregate-like band? How does the chromophore wavefunction extent dictate the wavelength-dependent EET rate?

Probing Inter-CPE EET

To probe the spectral characteristics and dynamics of singlet EET on picosecond (ps) timescales, a combination of steady-state and time-resolved PL (TRPL) may be used. The latter may be obtained using time-correlated single photon counting, using a broad-band picosecond (ps) laser as the excitation source and a monochromator coupled with a low-noise hybrid photomultiplier detector. By varying the relative polarization of the excitation and emission photons, the time-dependence of the PL anisotropy can be measured. (Cheng, Y.-C.; Fleming, G. R. Dynamics of Light Harvesting in Photosynthesis. Annu. Rev. Phys. Chem. 2009, 60, 241-262; Kodis, G.; Terazono, Y.; Liddell, P. a; Andréasson, J.; Garg, V.; Hambourger, M.; Moore, T. a; Moore, A. L.; Gust, D. Energy and Photoinduced Electron Transfer in a Wheel-Shaped Artificial Photosynthetic Antenna-Reaction Center Complex. J. Am. Chem. Soc. 2006, 128, 1818-1827). This quantity carries information on the timescale of reorientation of the transition dipole moment, which is related to the dynamics of inter-chromophore energy transfer. The polarization- and wavelength-dependent dynamics may be used to build a comprehensive picture of singlet EET. Changes in the different lifetime components and their relative contributions to the total PL dynamics will provide additional input for the CPEC EET model.

To distinguish between singlet and triplet dynamics, pump/probe transient absorption measurements may be performed. Singlet and triplet excitons in conjugated polymers are known to exhibit different dynamical and spectral pump/probe signatures. (Cook, S.; Ohkita, H.; Durrant, J. R.; Kim, Y.; Benson-Smith, J. J.; Nelson, J.; Bradley, D. D. C. Singlet Exciton Transfer and Fullerene Triplet Formation in Polymer-Fullerene Blend Films. Appl. Phys. Lett. 2006, 89, 101128; Vella, J. H.; Parthasarathy, A.; Schanze, K. S. Triplet Sensitization in an Anionic Poly(phenyleneethynylene) Conjugated Polyelectrolyte by Cationic Iridium Complexes. J. Phys. Chem. A 2013, 117, 7818-7822; Zimmerman, P. M.; Zhang, Z.; Musgrave, C. B. Singlet Fission in Pentacene through Multi-Exciton Quantum States. Nat. Chem. 2010, 2, 648-652; Burrows, H. D.; Fonseca, S. M.; Dias, F. B.; de Melo, J. S.; Monkman, A. P.; Scherf, U.; Pradhan, S. Singlet Excitation Energy Harvesting and Triplet Emission in the Self-Assembled System Poly{1,4-Phenylene-[9,9-Bis (4-Phenoxy-Butylsulfonate)]fluorene-2,7-Diyl}copolymer/tris(bipyridyl)ruthenium(II) in Aqueous Solution. Adv. Mater. 2009, 21, 1155-1159). Since triplet energy transfer is suspected to take part in the photo protection mechanisms of natural light-harvesting organisms, (Scholes, G. D.; Fleming, G. R.; Olaya-Castro, A.; van Grondelle, R. Lessons from Nature about Solar Light Harvesting. Nat. Chem. 2011, 3, 763-774; Ballottari, M.; Mozzo, M.; Girardon, J.; Hienerwadel, R.; Bassi, R. Chlorophyll Triplet Quenching and Photoprotection in the Higher Plant Monomeric Antenna Protein Lhcb5. J. Phys. Chem. B 2013, 117, 11337-1134; Gust, D.; Moore, T. a.; Moore, A. L.; Kuciauskas, D.; Liddell, P. a.; Halbert, B. D. Mimicry of Carotenoid Photoprotection in Artificial Photosynthetic Reaction Centers: Triplet-Triplet Energy Transfer by a Relay Mechanism. J. Photochem. Photobiol. B Biol. 1998, 43, 209-216; Tian, L.; Dinc, E.; Croce, R. LHCII Populations in Different Quenching States Are Present in the Thylakoid Membranes in a Ratio That Depends on the Light Conditions. J. Phys. Chem. Lett. 2015, 2339-2344) it is important to determine the yield and dynamics of triplets, particularly as a function of incident light intensity.

Characterizing the CPEC Microstructure

In order to characterize the equilibrium and nonequilibrium nm-scale and Å-scale structure of both CPEC solution and solid phases, one option is to combine synchrotron small-angle and wide-angle X-ray scattering (SAXS and WAXS, respectively) with resonant elastic X-ray scattering (REXS). Since SAXS provides information about the structure averaged over the electron density of CPEC components, (Chu, B.; Hsiao, B. S. Small-Angle X-Ray Scattering of Polymers. Chem. Rev. 2001, 101, 1727-1761) energy-dependent REXS performed around the C, N and O K-edges will allow for additional scattering contrast variation resulting from the energy dependence of the near-edge X-ray absorption cross-section in the vicinity of the absorption edge. (Wang, C.; Lee, D. H.; Hexemer, A.; Kim, M. I.; Zhao, W.; Hasegawa, H.; Ade, H.; Russell, T. P. Defining the Nanostructured Morphology of Triblock Copolymers Using Resonant Soft X-Ray Scattering. Nano Lett. 2011, 11, 3906-3911; Virgili, J. M.; Tao, Y.; Kortright, J. B.; Balsara, N. P.; Segalman, R. a. Analysis of Order Formation in Block Copolymer Thin Films Using Resonant Soft X-Ray Scattering. Macromolecules 2007, 40, 2092-2099; Kim, D. H.; Ayzner, A. L.; Appleton, A. L.; Schmidt, K.; Mei, J.; Toney, M. F.; Bao, Z. Comparison of the Photovoltaic Characteristics and Nanostructure of Fullerenes Blended with Conjugated Polymers with Siloxane-Terminated and Branched Aliphatic Side Chains. Chem. Mater. 2013, 25, 431-440; Liu, F.; Gu, Y.; Jung, J. W.; Jo, W. H.; Russell, T. P. On the Morphology of Polymer-Based Photovoltaics. J. Polym. Sci. Part B Polym. Phys. 2012, 50, 1018-1044). Phenyl and thiophene C absorption can be spectrally distinguished; in the case of N and O, only one of the two components contains the corresponding heteroatom. (Watts, B.; Swaraj, S.; Nordlund, D.; Lüning, J.; Ade, H. Calibrated NEXAFS Spectra of Common Conjugated Polymers. J. Chem. Phys. 2011, 134, 024702). Thus, structure in the vicinity of the each component can be studied using REXS. Additionally, NIST can be used to perform neutron scattering experiments, which may allow for additional contrast variation via solvent deuteration.

While not wishing to be bound by one particular theory, generally, the polymer coil and complex structure is expected to resemble fractal aggregates, leading to power-law scaling of the intensity with scattering vector. (Chu, B.; Hsiao, B. S. Small-Angle X-Ray Scattering of Polymers. Chem. Rev. 2001, 101, 1727-1761; Martin, J. E.; Hurd, a. J. Scattering from Fractals. J. Appl. Crystallogr. 1987, 20, 61-78; Pfeifer, P.; Avnir, D. Chemistry in Noninteger Dimensions between Two and Three. I. Fractal Theory of Heterogeneous Surfaces. J. Chem. Phys. 1983, 79, 3558; Beaucage, G. Determination of Branch Fraction and Minimum Dimension of Mass-Fractal Aggregates. Phys. Rev. E 2004, 70, 031401; Gan, H.; Li, Y.; Liu, H.; Wang, S.; Li, C.; Yuan, M.; Liu, X.; Wang, C.; Jiang, L.; Zhu, D. Self-Assembly of Conjugated Polymers and Ds-Oligonucleotides Directed Fractal-like Aggregates. Biomacromolecules 2007, 8, 1723-1729; Teixeira, J. Small-Angle Scattering by Fractal Systems. J. Appl. Crystallogr. 1988, 21, 781-785; Carrillo, J.-M. Y.; Dobrynin, A. V. Polyelectrolytes in Salt Solutions: Molecular Dynamics Simulations. Macromolecules 2011, 44, 5798-5816). The scaling exponent is related to the mass and surface fractal dimension and, thus, to intra-complex diffusivity and inter-chain connectivity—quantities that likely have a direct effect on EET dynamics. WAXS may be used to obtain information on local correlations on the Å-scale, such as a previously-observed "polyelectrolyte peak". (Spiteri, M. N.; Williams, C. E.; Boue, F. Pearl-Necklace-Like Chain Conformation of Hydrophobic Polyelectrolyte: A SANS Study of Partially Sulfonated Polystyrene in. 2007, 6679-6691).

To further characterize the solution microstructure, a combination of static light scattering and dynamic light scattering (SLS and DLS, respectively) may be used. SLS effectively expands the range of scattering vectors and thus length scales probed by SAXS to larger sizes, whereas DLS provides information on the diffusive modes of the CPE solutions. In particular, it is known that for polyelectrolyte solutions, the DLS autocorrelation must be analyzed at different scattering vectors, and the scattering vector dependence of the diffusion coefficients carries information on the nature of the particular diffusive mode. (Sedlák, M. The Ionic Strength Dependence of the Structure and Dynamics of Polyelectrolyte Solutions as Seen by Light Scattering: The Slow Mode Dilemma. J. Chem. Phys. 1996, 105, 10123; Skibinska, L.; Gapinski, J.; Liu, H.; Patkowski, A.; Fischer, E. W.; Pecora, R. Effect of Electrostatic Interactions on the Structure and Dynamics of a Model Polyelectrolyte. II. Intermolecular Correlations. J. Chem. Phys. 1999, 110, 1794; Phillies, G. D. J. Is the Polyelectrolyte Extraordinary Phase a Cluster-Forming Glass? Macromolecules 2001, 34, 8745-8751; Ermi, B. D.; Amis, E. J. Model Solutions for Studies of Salt-Free Polyelectrolytes. Macromolecules 1996, 29, 2701-2703). Particular diffusive modes may be associated with the interaction between the ionosphere of small ions with those of the polyions.

Using the Stanford Soft Materials Laboratory, zeta potential measurements may be used to obtain the net charge on the soluble aggregates, and viscoelastic measurements would allow for an evaluation of the dynamic moduli of the solid phases.

Since both CPEC components absorb light strongly, the composition of the liquid and solid phases may be determined quantitatively via fitting of the absorption and emission spectra to a linear combination of the isolated components of known concentrations. The solid component may be isolated using ultracentrifugation. While not wishing to be bound by any one particular theory, it is anticipated that in certain cases, the CPE UV-Visible absorption spectra of the CPEC may depart significantly from the isolated components due to changes in chromophore extent, which may complicate quantitative analysis. In this case, since the near-edge X-ray absorption cross-sections differ for phenyl and thiophene C atoms as a function of energy but are independent of chromophore length, it is expected that a linear combination fit of transmission X-ray absorption spectra may allow for sidestepping the above complication. (Oji, H.; Mitsumoto, R.; Ito, E.; Ishii, H.; Ouchi, Y.; Seki, K.; Yokoyama, T.; Ohta, T.; Kosugi, N. Core Hole Effect in NEXAFS Spectroscopy of Polycyclic Aromatic Hydrocarbons: Benzene, Chrysene, Perylene, and Coronene. J. Chem. Phys. 1998, 109, 10409).

Clarifying the Role of Conjugated Backbone Rigidity

Since the wavefunction extent along the CPE backbone will modulate its electronic structure, it is important to determine how the backbone rigidity/average planarity affect the EET rate. Förster theory, modified to account for finite wavefunction extent, shows that the spatial relationship between the donor and acceptor excitonic wavefunctions can have a significant effect on EET. (Scholes, G. D.; Fleming, G. R.; Olaya-Castro, A.; van Grondelle, R. Lessons from Nature about Solar Light Harvesting. Nat. Chem. 2011, 3, 763-774; Scholes, G. D.; Jordanides, X. J.; Fleming, G. R. Adapting the Forster Theory of Energy Transfer for Modeling Dynamics in Aggregated Molecular Assemblies. J.

Phys. Chem. B 2001, 105, 1640-1651; Scholes, G. D. Long-Range Resonance Energy Transfer in Molecular Systems. Annu. Rev. Phys. Chem. 2003, 54, 57-87). Moreover, while not wishing to be bound by any one particular theory, it is possible that rigid systems may ultimately lead to enhanced coherent energy transfer, in addition to incoherent Förster-like hops. However, studying coherent transport involves spectroscopic techniques that go beyond TRPL and two-pulse pump/probe experiments. (Cheng, Y.-C.; Fleming, G. R. Dynamics of Light Harvesting in Photosynthesis. Annu. Rev. Phys. Chem. 2009, 60, 241-262; Scholes, G. D.; Fleming, G. R.; Olaya-Castro, A.; van Grondelle, R. Lessons from Nature about Solar Light Harvesting. Nat. Chem. 2011, 3, 763-774).

Figure 7A:
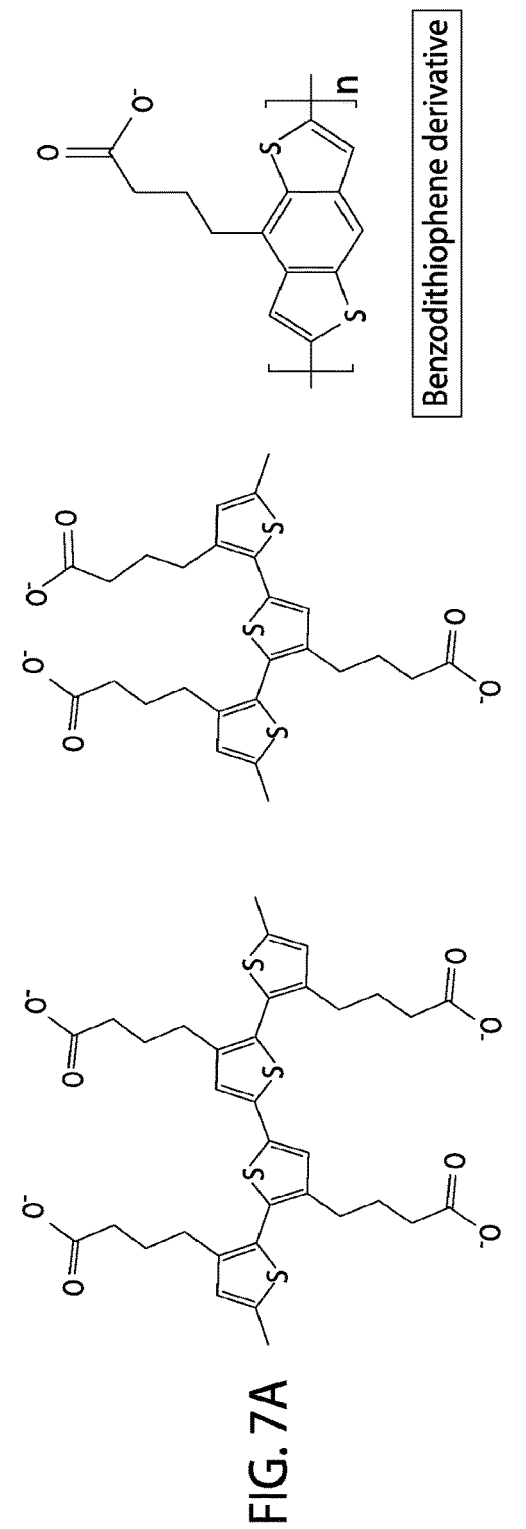
FIG. 7A-FIG. 7B depicts, in accordance with an embodiment of the invention, FIG. 7A Regioregular PTAK (left), regiorandom PTAK (middle), benzodithiophene derivative (right).
Figure 7B:
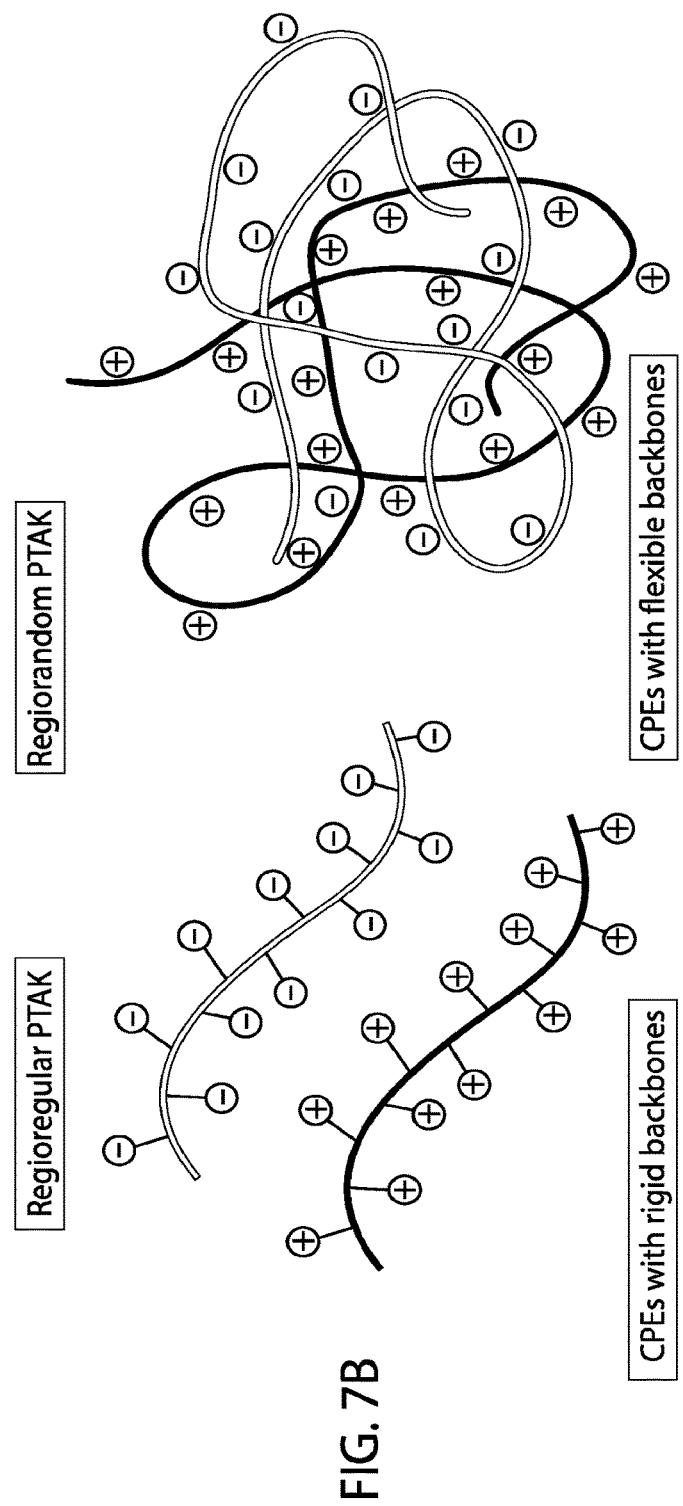

With PFP fixed, it is possible to compare the microstructure and EET characteristics of the following partial thiophene-based backbone chemical series: regiorandom PTAK, regioregular PTAK, and its benzodithiophene analogue. The relevant chemical structures are shown in FIG. 7A. Regioregular polythiophene has a longer average conjugated length than its regiorandom analogue. The benzodithiophene derivative—a more rigid monomer than single thiophene—may be synthesized. Regiorandom and regioregular PTAK are commercially-available. While not wishing to be bound by any one particular theory, it is expected that the inter-CPEC EET rate will differ substantially depending on the average chromophore length and hence mean backbone planarity.

Role of Solution Dielectric Constant in CPEC Thermodynamics

Figure 8:
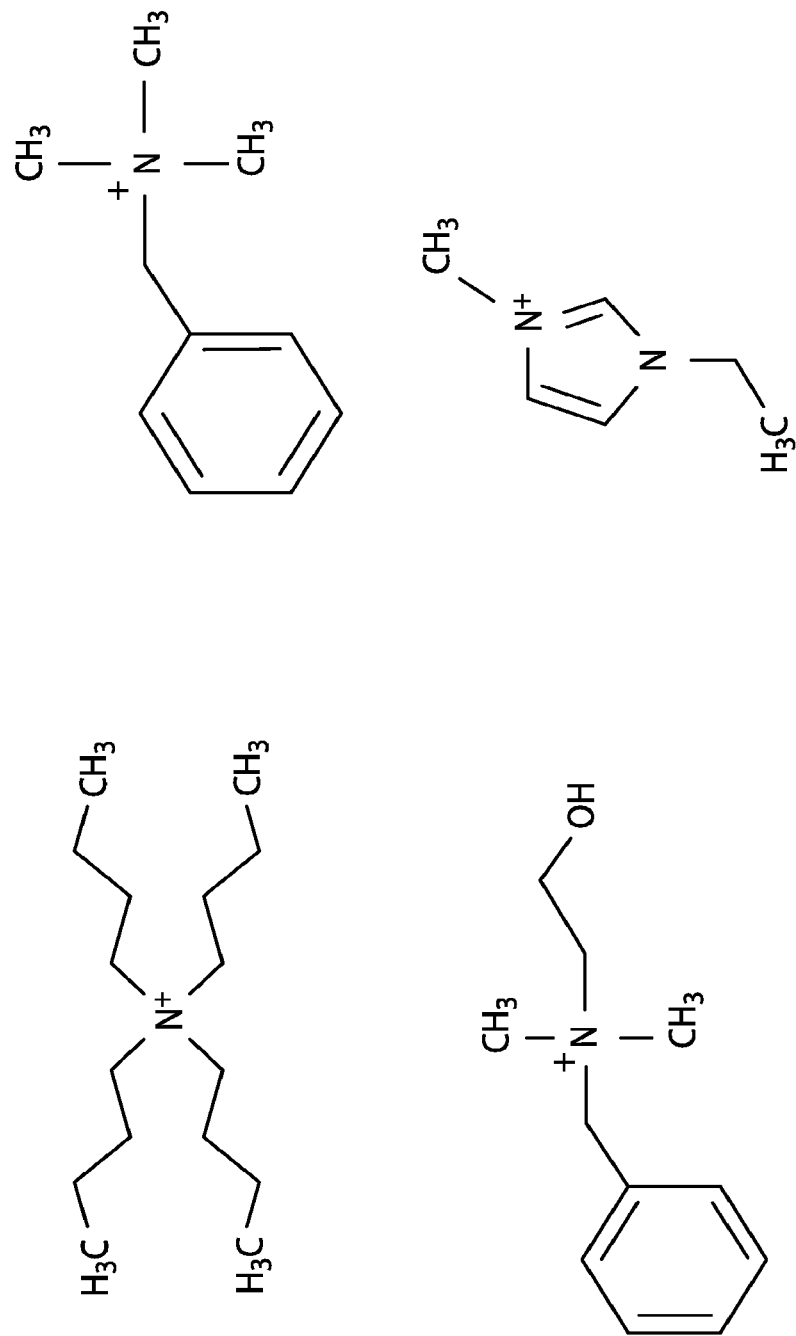
FIG. 8 depicts, in accordance with an embodiment of the invention, representative cations of varying hydrophobicity.

As discussed in the herein, the ionosphere is an important factor in determine both the partitioning of the two CPEC phases as well as the resulting photophysics. To build on this knowledge, it is important to consider the following questions: 1. How does the chemical structure of the excess salt affect complex solution stability and thin film morphology? It is well-known that in equilibrium a fraction of counterions will condense onto the polyion. (Carrillo, J.-M. Y.; Dobrynin, A. V. Polyelectrolytes in Salt Solutions: Molecular Dynamics Simulations. Macromolecules 2011, 44, 5798-5816; Skibinska, L.; Gapinski, J.; Liu, H.; Patkowski, A.; Fischer, E. W.; Pecora, R. Effect of Electrostatic Interactions on the Structure and Dynamics of a Model Polyelectrolyte. II. Intermolecular Correlations. J. Chem. Phys. 1999, 110, 1794; Jia, P.; Yang, Q.; Gong, Y.; Zhao, J. Dynamic Exchange of Counterions of Polystyrene Sulfonate. J. Chem. Phys. 2012, 136, 084904; Goerigk, G.; Schweins, R.; Huber, K.; Ballauff, M. The Distribution of Sr 2+ Counterions around Polyacrylate Chains Analyzed by Anomalous Small-Angle X-Ray Scattering. Europhys. Lett. 2004, 66, 331-337). While not wishing to be bound by one particular theory, this is expected to modulate the charge density and, thus, the interaction with the oppositely-charged CPE. It is important to examine the effect of the halogen series, as well as a series of ions with varying hydrophilic/hydrophobic fragment ratios on complex formation between the two CPEs. While not wishing to be bound by any one particular theory, it is expected that the changes relative interaction strength of the ion with water, the polar CPE sidechain terminus and the nonpolar backbone will lead to nontrivial microstructural changes. Representative examples of electrolytes with varying hydrophobicity are shown in FIG. 8. Initial focus will be on monovalent ions. It is believed likely that the solution metastability will be a sensitive function of the nature of the excess salt. Using simple salts, the validity of the wide-spread Voorn and Overbeek (VO) model in describing CPEC phase composition can be tested. (Priftis, D.; Xia, X.; Margossian, K. O.; Perry, S. L.; Leon, L.; Qin, J.; de Pablo, J. J.; Tirrell, M. Ternary, Tunable Polyelectrolyte Complex Fluids Driven by Complex Coacervation. Macromolecules 2014, 47, 3076-3085; Perry, S.; Li, Y.; Priftis, D.; Leon, L.; Tirrell, M. The Effect of Salt on the Complex Coacervation of Vinyl Polyelectrolytes. Polymers. 2014, 6, 1756-1772; Overbeek, J. T. G.; Voorn, M. J. Phase Separation of Polyelectrolyte Solutions. Theory of Complex Coacervation. J. Cell. Phys. 1957, 49, 7-26). Poor agreement will likely indicate the importance of accounting for the monomer-monomer interaction, which is absent in the VO model. 2. What is the role of solvent composition, i.e., how does the CPEC evolve with increasing mole fraction of the non-aqueous solvent component? Particularly important are solvent mixtures where the nonaqueous component is expected to preferentially solvate the backbone, while water solvates the sidechains. Initial focus may be on THF and dioxane; as the latter has been demonstrated to stabilize single-component CPE solutions. (Marques, A. T.; Burrows, H. D.; Seixas de Melo, J. S.; Valente, A. J. M.; Justino, L. L. G.; Scherf, U.; Fron, E.; Rocha, S.; Hofkens, J.; Snedden, E. W.; et al. Spectroscopic Properties, Excitation, and Electron Transfer in an Anionic Water-Soluble Poly(fluorene-Alt-Phenylene)-Perylenediimide Copolymer. J. Phys. Chem. B 2012, 116, 7548-7559; Burrows, H. D.; Fonseca, S. M.; Silva, C. L.; Pais, A. a C. C.; Tapia, M. J.; Pradhan, S.; Scherf, U. Aggregation of the Hairy Rod Conjugated Polyelectrolyte poly{1,4-Phenylene-[9,9-bis(4-Phenoxybutylsulfonate)]fluorene-2,7-Diyl} in Aqueous Solution: An Experimental and Molecular Modelling Study. Phys. Chem. Chem. Phys. 2008, 10, 4420-4428). Experimental results suggest that the fraction of THF in water can be used to tune both the absorption and emission spectra of the PFP:PTAK CPEC solution (not shown). 3. What is the effect of varying sidechain charge density along the PTAK chain? (Murnen, H. K.; Rosales, A. M.; Dobrynin, A. V.; Zuckermann, R. N.; Segalman, R. a. Persistence Length of Polyelectrolytes with Precisely Located Charges. Soft Matter 2013, 9, 90). Since the enthalpic driving force for CPEC formation is related to the charge density along the backbone, it is anticipated that controlling the extent of the PTAK's alkylcarboxylate sidechain ionization will provide a knob to tune the relative propensity for complex formation. Fractional PTAK sidechain ionization may be controlled by varying the solution pH with either HCl or $H_3PO_4$, neither of which dope the conjugated backbone while protonating the carboxylates.

A panchromatic LHA array may be formed, consisting of lower bandgap CPEs and likely more than two CPE components. "Push-pull" copolymer CPE derivatives, based on established electron-rich and electron-poor monomers, may be synthesized in order to push the absorption profile further to the near-IR and, thus, expand the spectral light-harvesting range of the supramolecular assembly. (Mei, J.; Kim, D. H.; Ayzner, A. L.; Toney, M. F.; Bao, Z. Siloxane-Terminated Solubilizing Side Chains: Bringing Conjugated Polymer Backbones Closer and Boosting Hole Mobilities in Thin-Film Transistors. J. Am. Chem. Soc. 2011, 133, 20130-20133).

Example 3

RC Formation and Interaction with LHA

In natural photosystems, the RC is composed of a special pair consisting of a donor chromophore that differs from peripheral LHA and a photoexcited electron acceptor. The LHA complexes funnel their excited states directionally to the special donor chromophore, which then transfers an electron to the acceptor. The spatially separated electron/hole pair is the precursor state to fuel-generating photochemistry. (Gust, D.; Moore, T. a; Moore, a L. Mimicking Photosynthetic Solar Energy Transduction. Acc. Chem. Res. 2001, 34, 40-48; Kodis, G.; Liddell, P. a.; Moore, A. L.; Moore, T. a.; Gust, D. Synthesis and Photochemistry of a Carotene-porphyrin-fullerene Model Photosynthetic Reaction Center. J. Phys. Org. Chem. 2004, 17, 724-734; Gust, D.; Moore, T. a; Moore, A. L. Solar Fuels via Artificial Photosynthesis. Acc. Chem. Res. 2009, 42, 1890-1898). One option is to mimic the RC special pair with a water-soluble phthalocyanine-based donor and fullerene-based water-soluble acceptors (FIG. 9A-FIG. 9C). One option is to use metal-free phthalocyanine tetrasulfonic acid (TSPc) as the special pair donor, due to a) the excellent spectral overlap between the emission of PTAK and the absorption of TSPc, making TSPc an EET acceptor with respect to PTAK emission (as shown in FIG. 3B), and b) because electron transfer between phthalocyanines and $C_{60}$ is known to be highly efficient. It is also important to consider substitution patterns of the macrocycle periphery to tune the interaction strength with both fullerene and CPE derivatives.

Assembly of RC Special Pair

Solution Coupling

The carboxylic acid groups of the fullerene may be used as anchors to form dynamic hydrogen-bonds with the nitrogen atoms of the macrocycle interior as well as the peripheral sulfonic acid/sulfonate groups, especially as the solution dielectric constant and pH are varied. It was determined that the state of TSPc solution aggregation—likely due to π-stacked self assembly—can be controlled with solvent mixtures similar to those described in section herein, as well as by varying the concentration. Previous results have shown that pH can serve the same role. (Nishida, K. R. a.; Wiggins, B.; Hipps, K. W.; Mazur, U. Structural and Electronic Properties of Columnar Supramolecular Assemblies Formed from Ionic Metal-Free Phthalocyanine on Au(111). J. Phys. Chem. C 2011, 115, 16305-16314). The solution interaction between monomeric TSPc and its assemblies with fullerene derivatives may be compared. Successful coupling of the TSPc rod-like assembly and the fullerene acceptor will help diminish charge recombination. This is because, once the interfacial electron/hole pair is generated, the delocalization of the hole wavefunction along the π-stacked TSPc assembly is expected to lower the recombination probability and, thus, assist in charge separation.

Quenching of TSPc PL and appearance of charged state absorption in pump/probe experiments will signify proximal coupling between the two components. Charges have a qualitatively different absorption spectra in conjugated organic systems than excited-state absorption of neutral excitons. Thus, the two states can be distinguished in a pump/probe experiment. (Ayzner, A. L.; Doan, S. C.; Tremolet de Villers, B.; Schwartz, B. J. Ultrafast Studies of Exciton Migration and Polaron Formation in Sequentially Solution-Processed Conjugated Polymer/Fullerene Quasi-Bilayer Photovoltaics. J. Phys. Chem. Lett. 2012, 3, 2281-2287). Electron/hole recombination rates may be studied with TRPL. Recombination of the electron/hole pair leads to weak but measurable near-IR PL. The dynamics of this near-IR emission band will reflect the rate of charge recombination. Of importance is relating the microstructure of the RC complex and its chemical environment to the forward and back ET.

Assembly Templated by Graphene Oxide

Figure 10A:
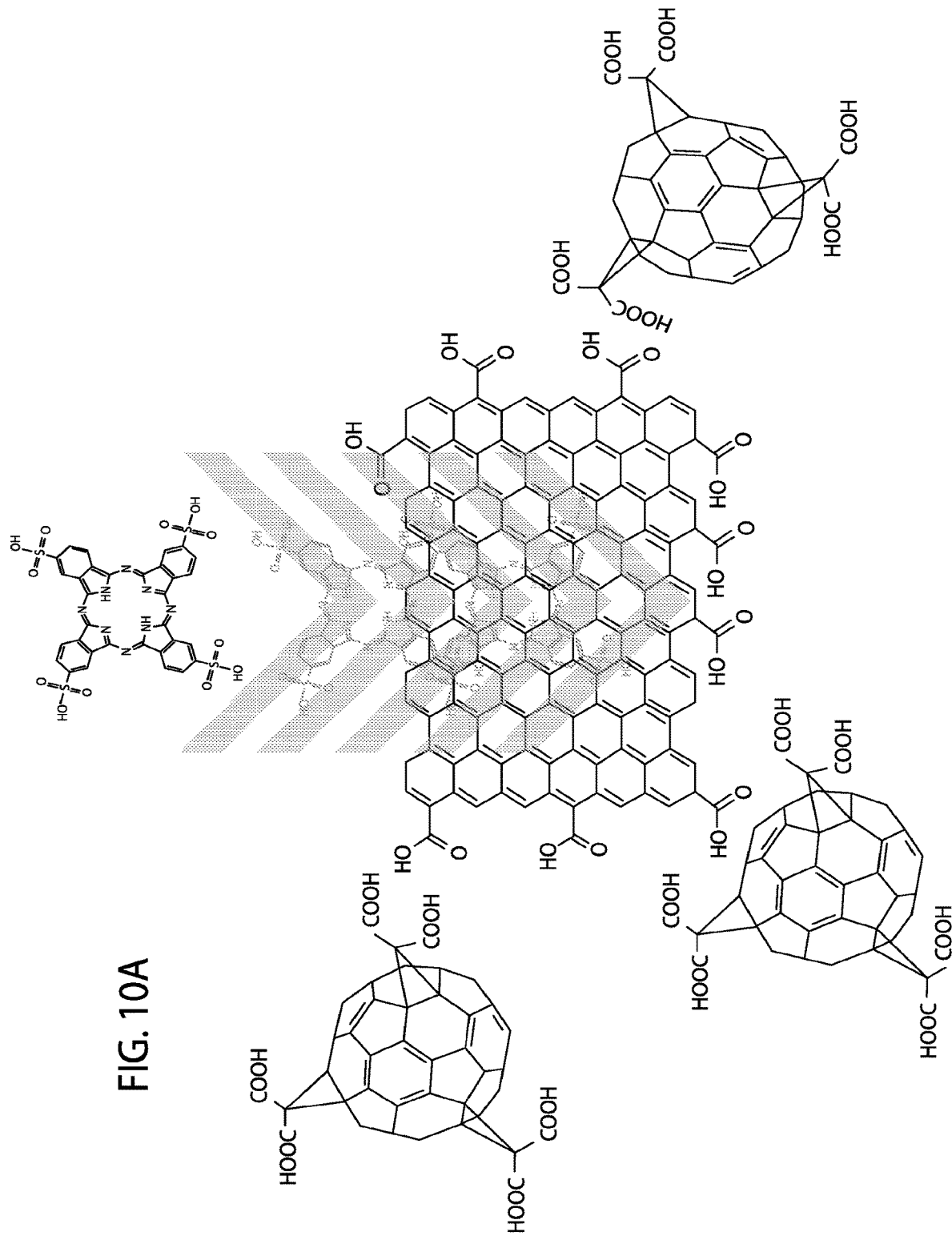
FIG. 10A-FIG. 10B depicts, in accordance with an embodiment of the invention, FIG. 10A Illustration of TSPc assembly template off a graphene oxide nanoribbon, with fullerene malonate derivatives interacting with the polar defect states of the ribbon.

Previous work in the field has shown that phthalocyanines can be templated to grow vertically off of strongly-interacting surfaces, such as metals and graphite. Commercially-available ribbons of graphene oxide are particularly interesting for this purpose, since they contain patches of π-electron-rich regions as well as regions containing carboxylic acid defects (FIG. 10A). Thus, it is believed that simultaneously grafting of water soluble fullerenes and TSPc may be accomplished. The formation of associated complexes of TSPc, fullerene and graphene oxide may be probed using SAXS and DLS. In principle, the molecular form factor and, thus, the SAXS intensity will differ considerably between nearly spherical and cylindrical aggregates, (Svergun, D. I.; Koch, M. H. J. Small-Angle Scattering Studies of Biological Macromolecules in Solution. Reports Prog. Phys. 2003, 66, 1735-1782) providing a means to identify aggregate solution morphology. Depolarized DLS may also be attempted to obtain rotational diffusion coefficients, although the smallness of the depolarized scattered component likely make unambiguous microstructure determination challenging. (Skibinska, L.; Gapinski, J.; Liu, H.; Patkowski, A.; Fischer, E. W.; Pecora, R. Effect of Electrostatic Interactions on the Structure and Dynamics of a Model Polyelectrolyte. II. Intermolecular Correlations. J. Chem. Phys. 1999, 110, 1794; Glidden, M.; Muschol, M. Characterizing Gold Nanorods in Solution Using Depolarized Dynamic Light Scattering. J. Phys. Chem. C 2012, 116, 8128-8137; Phillies, G. Neutral Polymer Slow Mode May Signify an Incipient Growth-Frustrated Domain-Forming Glass. Phys. Rev. E 2004, 69, 011801).

In the event that TSPc interacts weakly with carboxylic-acid functionalized fullerenes, the ability of nonaqueous co-solvents to force hydrogen bonding between the fullerene acid and TSPc may be considered. One option is to bypass the TSPc component and proceed directly to coupling CPEC LHA to either freely diffusion fullerenes or those affixed to an inorganic surface.

Fullerene-Functionalized $TiO_2$ Nanoparticle Surfaces

Figure 10B:
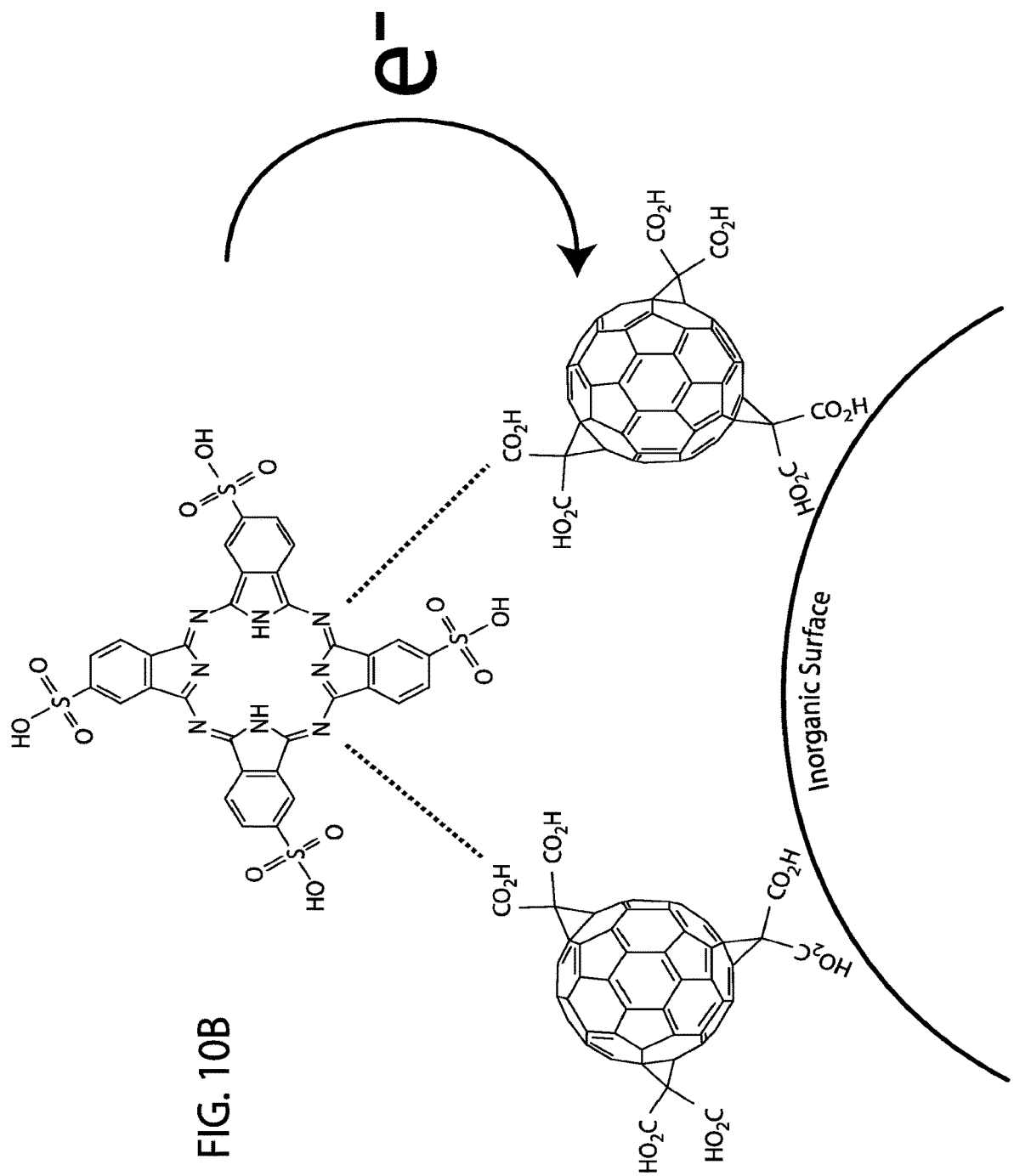

The general formation of organic/inorganic interfaces capable of ET are of interest for linking charge-separated states with further chemical reactions catalyzed by the inorganic. The first important motif is a fullerene malonate derivative bound to a $TiO_2$ surface using the strong carboxyl linkage, as shown in FIG. 10B. (Thomas, A. G.; Syres, K. L. Adsorption of Organic Molecules on Rutile TiO2 and Anatase TiO2 Single Crystal Surfaces. Chem. Soc. Rev. 2012, 41, 4207-4217). Binding may be studied with XPS and X-ray absorption spectroscopy. Charge transfer across the fullerene/$TiO_2$ interface will assist in separation of the electron/hole pair generated at the TSPc/fullerene interface. Important compositions include both nanoparticulate $TiO_2$ thin films prepared by pyrolysis of Ti isopropoxide in air, (Sorensen, C. M. Light Scattering by Fractal Aggregates: A Review. Aerosol Sci. Tech. 2001, 35, 648-687) as well as via preparation of water-soluble, stable $TiO_2$ nanoparticles as detailed by Seo et al. (Seo, J. W.; Chung, H.; Kim, M. Y.; Lee, J.; Choi, I. H.; Cheon, J. Development of Water-Soluble Single-Crystalline TiO2 Nanoparticles for Photocatalytic Cancer-Cell Treatment. Small 2007, 3, 850-853), both of which are hereby incorporated herein by reference in their entirety as though fully set forth.

Coupling CPEC LHA with RC

Once a stable RC assembly is formed, CPEC LHA may be interfaced with the RC. The HOMO of PTAK will be higher in energy than that of TSPc, thereby ensuring that holes experience a thermodynamic driving force to migrate away from the TSPc/fullerene interface towards PTAK. (Hatton, R. a.; Blanchard, N. P.; Miller, A. J.; Silva, S. R. P. A Multi-Wall Carbon Nanotube-Molecular Semiconductor Composite for Bi-Layer Organic Solar Cells. Phys. E Low-Dimensional Syst. Nanostructures 2007, 37, 124-127; Huang, F.; Wu, H.; Wang, D.; Yang, W.; Cao, Y. Novel Electroluminescent Conjugated Polyelectrolytes Based on Polyfluorene. Chem. Mater. 2004, 16, 708-716; Schumann, S.; Hatton, R. a.; Jones, T. S. Organic Photovoltaic Devices Based on Water-Soluble Copper Phthalocyanine. J. Phys. Chem. C 2011, 115, 4916-4921; Al-Ibrahim, M.; Roth, H. K.; Schroedner, M.; Konkin, A.; Zhokhavets, U.; Gobsch, G.; Scharff, P.; Sensfuss, S. The Influence of the Optoelectronic Properties of poly(3-Alkylthiophenes) on the Device Parameters in Flexible Polymer Solar Cells. Org. Electron. physics, Mater. Appl. 2005, 6, 65-77). This will help further diminish the electron/hole recombination rate. By carefully controlling the net charge on the CPEC, hydrogen-bonding and anion-π interactions may be used to assemble the CPEC-RC supercomplex. Combining EET, ET and near-IR PL94 dynamics with diverse structural characterization tools allows for analyzing the complexity of the supercomplex. While not wishing to be bound by any one particular theory, given the propensity of CPECs to form metastable structures, it is believed that the order of species addition may play a major role. This was previously shown to the case for CPE/DNA/surfactant systems. (Monteserín, M.; Burrows, H. D.; Mallavia, R.; Di Paolo, R. E.; Maçanita, A. L.; Tapia, M. J. How to Change the Aggregation in the DNA/surfactant/cationic Conjugated Polyelectrolyte System through the Order of Component Addition: Anionic versus Neutral Surfactants. Langmuir 2010, 26, 11705-11714).

The formation of the supercomplex is expected to be associated with a significant increase in mean aggregate size in both the solution and the solid state. The optical signature of RC-LHA supercomplex formation will be efficient quenching of PTAK PL upon PFP excitation followed by a concomitant increase in the transient absorption signal due to polaronic charge states following ET. Diffusion-driven ET between LHA and RC will be too slow to lead to appreciable charged state absorption. It is important to monitor and compare changes in PL dynamics (decay component lifetimes and amplitudes) and spectral position between the LHA/RC supersystem and the components in isolation. Furthermore, temperature-dependent SAXS and SLS intensities may be used to study changes in complexation. If the LHA and RC have a propensity to self-organize with a driving force exceeding kbT, the size distribution is expected to evolve towards decreased particle sizes with increasing T. In circumstances in which strong coupling between LHA and RCs does not occur, one option is to trap the different components in mutual proximity within either the inside compartment or within the membrane of a liposome, as described in more detail below.

Example 4

Stabilization and Encapsulation with Surfactants

Figure 11B:
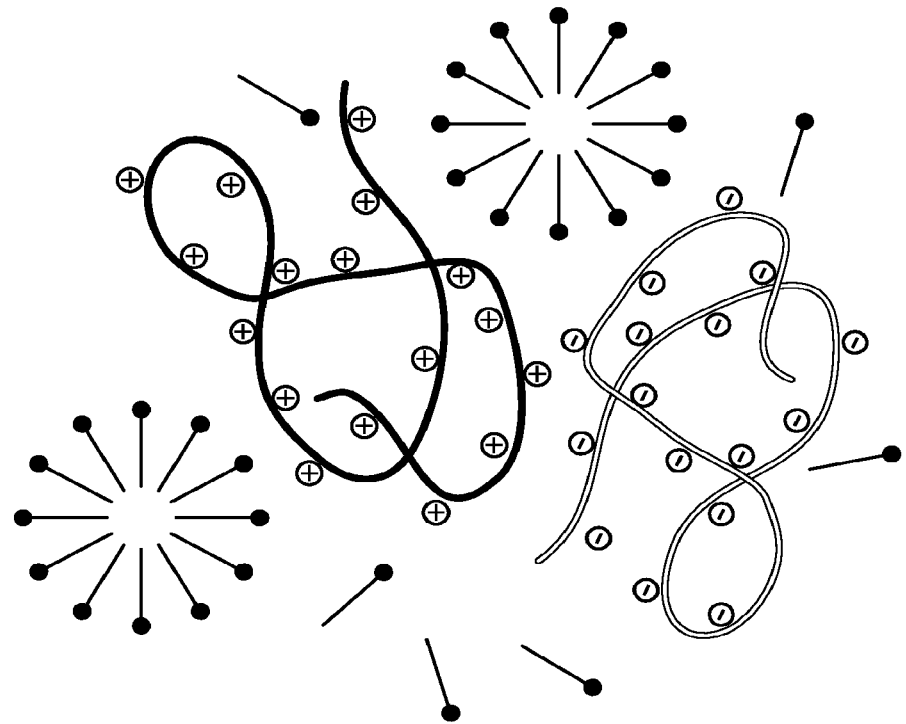
FIG. 11A-FIG. 11B depicts, in accordance with an embodiment of the invention, a schematic of CPECs interaction with ionic surfactants.
Figure 11A:
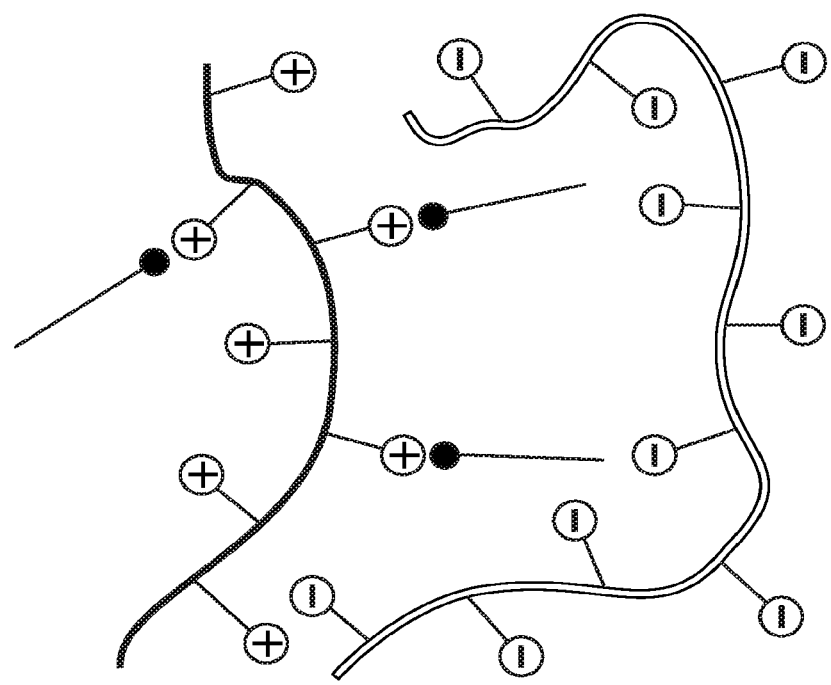

CPEs can interact with both ionic and nonionic surfactant molecules, which have a strong effect on CPE chain conformation and thermodynamic stability. (Tapia, M. J.; Burrows, H. D.; Valente, a J. M.; Pradhan, S.; Scherf, U.; Lobo, V. M. M.; Pina, J.; Seixas de Melo, J. Interaction between the Water Soluble poly{1,4-Phenylene-[9,9-bis(4-Phenoxy Butylsulfonate)]fluorene-2,7-Diyl} Copolymer and Ionic Surfactants Followed by Spectroscopic and Conductivity Measurements. J. Phys. Chem. B 2005, 109, 19108-19115; Burrows, H. D.; Tapia, M. J.; Silva, C. L.; Pais, A. a C. C.; Fonseca, S. M.; Pina, J.; de Melo, J. S.; Wang, Y.; Marques, E. F.; Knaapila, M.; et al. Interplay of Electrostatic and Hydrophobic Effects with Binding of Cationic Gemini Surfactants and a Conjugated Polyanion: Experimental and Molecular Modeling Studies. J. Phys. Chem. B 2007, 111, 4401-4410; Knaapila, M.; Evans, R. C.; Garamus, V. M.; Almasy, L.; Székely, N. K.; Gutacker, A.; Scherf, U.; Burrows, H. D. Structure and "Surfactochromic" Properties of Conjugated Polyelectrolyte (CPE): Surfactant Complexes between a Cationic Polythiophene and SDS in Water. Langmuir 2010, 26, 15634-15643; Burrows, H. D.; Tapia, M. J.; Fonseca, S. M.; Pradhan, S.; Scherf, U.; Silva, C. L.; Pais, A. a C. C.; Valente, A. J. M.; Schillén, K.; Alfredsson, V.; et al. Solubilization of poly{1,4-Phenylene-[9,9-bis(4-Phenoxy-Butylsulfonate)]fluorene-2,7-Diyl} in Water by Nonionic Amphiphiles. Langmuir 2009, 25, 5545-5556). One option is to use CPE-surfactant interactions to tune the microstructure and stability of CPECs. A cartoon of this system with an anionic surfactant is shown in FIG. 11A-FIG. 11B.

Single-Chain Amphiphiles

For cationic CPE complexes interacting with double-stranded DNA, it has been shown that not only the molecular structure of the surfactant, but also the order of species-addition, (Monteserín, M.; Burrows, H. D.; Mallavia, R.; Di Paolo, R. E.; Maçanita, A. L.; Tapia, M. J. How to Change the Aggregation in the DNA/surfactant/cationic Conjugated Polyelectrolyte System through the Order of Component Addition: Anionic versus Neutral Surfactants. Langmuir 2010, 26, 11705-11714) determines the final state microstructure and optical properties, with the surfactant concentration playing a major role. While not wishing to be bound by one particular theory, given that surfactants are known for their stabilizing effects on CPEs in aqueous solutions, it is believed that a ternary anionic CPE/cationic CPE/surfactant assembly holds promise for also stabilizing the CPEC. It is worth investigating the role of charged, zwitterionic and nonionic surfactants on the optical properties and microstructure of the CPEC as a function of D/A polymer mole ratio and total polymer concentration. While not wishing to be bound by one particular theory, it is believed that whether the charge on one CPE is fully or incompletely compensated by the charge on the surfactant component will have a significant effect on CPEC conformations and phase behavior. Initial structural studies with surfactants previously used to stabilize isolated CPEs suggest that the solution phase of a CPEC system depends sensitively on the nature of surfactant, with ionic vs. nonionic amphiphiles leading to substantial differences in phase partitioning (not shown). It is believed that the change in solution microstructure, and by extension CPEC photophysics, will evolve in a nontrivial manner as the micellization phase transition is approached. It is also believed that the presence of amphiphiles may assist in stabilizing and tuning the structure, EET and ET dynamics of RC-LHA assemblies.

Vesicle Formation and Encapsulation with Double-Chain Amphiphiles

One important technical application is to construct a "soft" light-harvesting unit that contains multiple electronically-coupled artificial photosystems working in parallel to drive solar fuel generation, akin to natural photosynthesis in the chloroplast's thylakoid. One of the primary requirements for a quasi-independent light-harvesting unit is encapsulation and compartmentalization, which in Nature is achieved via membrane enclosures. (Croce, R.; van Amerongen, H. Light-Harvesting and Structural Organization of Photosystem II: From Individual Complexes to Thylakoid Membrane. J. Photochem. Photobiol. B. 2011, 104, 142-153). One option is forming vesicles with double-chain phospholipids in the presence of CPE-based LHA and RCs with the objective of encapsulating the primary components in a membrane. This will form the basis for an artificial light-harvesting protocell. (Dzieciol, A. J.; Mann, S. Designs for Life: Protocell Models in the Laboratory. Chem. Soc. Rev. 2012, 41, 79). Deamer et al. showed that a commercially-available derivative of oleoylphosphatidycholine readily formed closed liposomes upon drying and rehydrating. (Shew, R. L.; Deamer, D. W. Hemoglobin and Alkaline Phosphatase Were Each Encapsulated in Phosphatidylcholine Liposomes Using a Dehydration-Rehydration Cycle for Liposome Formation. In This Method, Iiposomes Prepared by Sonication Are Mixed in Aqueous Solution with the Solute Desi. 1985, 816, 1-8). SLS, transmission/grazing incidence SAXS and light microscopy may be used to study vesicle formation. Incorporation may be studied with light and fluorescence microscopy with the objective of observing membrane boundaries and PL that originates from within the boundary.

Light-harvesting machinery may be contained on the inside of the vesicle or the CPEC-based assembly may be incorporated into the membrane. It is possible that changes in the chemical structure of the phospholipid, the pH and the mixing temperature can encourage closed liposome formation in the presence of LHA-RC assemblies.

At the interface between energy science, optical spectroscopy and polymer physical chemistry, this invention may help improve utilization of solar energy by constructing light-weight, supramolecular photon-harvesting units, thus addressing the problem of diminishing fossil fuel resources.

Example 5

Introduction

Photosynthetic organisms have mastered the use of "soft" macromolecular assemblies for light absorption and concentration of electronic excitation energy. Nature's design centers on an optically-inactive protein-based backbone that acts as a host matrix for an array of light-harvesting pigment molecules. The pigments are organized in space such that excited states can migrate between molecules, ultimately delivering the energy to the reaction center. Here we report our investigation of an artificial light-harvesting energy transfer antenna based on complexes of oppositely charged conjugated polyelectrolytes (CPEs). The conjugated backbone and the charged sidechains of the CPE lead to an architecture that simultaneously functions as a structural scaffold and an electronic energy "highway". We find that the process of ionic complex formation leads to a remarkable change in the excitonic wavefunction of the energy acceptor, which manifests in a dramatic increase in the fluorescence quantum yield. Without being bound by theory, we argue that the extended backbone of the donor CPE effectively templates a planarized acceptor polymer, leading to excited states that are highly delocalized along the polymer backbone.

Over billions of years, natural organisms such as bacteria and plants have evolved the exceedingly complex, supramolecular light-harvesting machinery to ensure efficient conversion of sunlight to chemical potential energy. (Barter, L. M.; Durrant, J. R.; Klug, D. R. A Quantitative Structure-Function Relationship for the Photosystem II Reaction Center: Supermolecular Behavior in Natural Photosynthesis. Proc. Natl. Acad. Sci. USA 2003, 100, 946-51; Croce, R.; van Amerongen, H. Natural Strategies for Photosynthetic Light Harvesting. Nat. Chem. Biol. 2014, 10, 492-501; McConnell, I.; Li, G.; Brudvig, G. W. Energy Conversion in Natural and Artificial Photosynthesis. Chem. Biol. 2010, 17, 434-47; Scholes, G. D.; Fleming, G. R.; Olaya-Castro, A.; van Grondelle, R. Lessons from Nature About Solar Light Harvesting. Nat. Chem. 2011, 3, 763-7). Given the nearly inexhaustible source of solar photons and the success of natural photosynthesis, light-harvesting architectures based on the general principles employed by Nature are attractive for solar generation of chemical fuels. This involves directionally funneling photogenerated electronic excited states (excitons) to a molecular interface, where generation of electron/hole pairs and their subsequent spatial separation takes place. Upon separation, charges cascade down an electron transport chain to the protein assemblies that subsequently drive fuel-generating biochemical reactions. (Blankenship, R. E. Molecular Mechanisms of Photosynthesis; Wiley, 2014).

The elegance of natural supramolecular organization and its associated efficiency of light harvesting inspires us to mimic this photosynthetic machinery in the laboratory. We seek to construct a modular, "soft" artificial photosystem capable of efficient light absorption, electronic energy transfer (EET) and long-lived charge generation. This goal requires creating a supramolecular assembly with subunits capable of carrying out the above photophysical processes. To increase the effective absorption cross-section of the photosystem, Nature uses an array of peripheral proteins that serve as an optically-inactive structural scaffolding for pigment molecules. These complexes are collectively known as light-harvesting antennae (LHA). Excitons generated in pigments within LHA are directionally funneled via a combination of coherent and incoherent EET to a "reaction center", where the exciton is energetically trapped prior to generation of electron/hole pairs via electron transfer. Thus, efficient EET is of paramount importance for LHA function. (Scholes, G. D.; Fleming, G. R.; Olaya-Castro, A.; van Grondelle, R. Lessons from Nature About Solar Light Harvesting. Nat. Chem. 2011, 3, 763-74; Fassioli, F.; Dinshaw, R.; Arpin, P. C.; Scholes, G. D. Photosynthetic Light Harvesting: Excitons and Coherence. J. R. Soc., Interface 2014, 11, 20130901; Olaya-Castro, A.; Scholes, G. D. Energy Transfer from Förster-Dexter Theory to Quantum Coherent Light-Harvesting. Int. Rev. Phys. Chem. 2011, 30, 49-77; Scholes, G. D. Long-Range Resonance Energy Transfer in Molecular Systems. Annu. Rev. Phys. Chem. 2003, 54, 57-87; Stirbet, A. Excitonic Connectivity between Photosystem IX Units: What Is It, and How to Measure It? Photosynth. Res. 2013, 116, 189-214).

A large body of work exists describing the synthesis of covalently-linked LHA and reaction centers. Fairly large porphyrin arrays coupled to fullerene electron acceptors, (Bhosale, S. V.; Bhosale, S. V.; Shitre, G. V.; Bobe, S. R.; Gupta, A. Supramolecular Chemistry of Protoporphyrin Ix and Its Derivatives. Eur. J. Org. Chem. 2013, 2013, 3939-3954; Bottari, G.; Trukhina, O.; Ince, M.; Torres, T. Towards Artificial Photosynthesis: Supramolecular, Donor-Acceptor, Porphyrin- and Phthalocyanine/Carbon Nanostructure Ensembles. Coord. Chem. Rev. 2012, 256, 2453-2477; Elemans, J. A. A. W.; van Hameren, R.; Nolte, R. J. M.; Rowan, A. E. Molecular Materials by Self-Assembly of Porphyrins, Phthalocyanines, and Perylenes. Adv. Mater. 2006, 18, 1251-1266; Fukuzumi, S. Development of Bioinspired Artificial Photosynthetic Systems. Phys. Chem. Chem. Phys. 2008, 10, 2283-97) as well as more exotic systems containing built-in energy gradients have been prepared to date, (Hayashi, H.; Sobczuk, A.; Bolag, A.; Sakai, N.; Matile, S. Antiparallel Three-Component Gradients in Double-Channel Surface Architectures. *Chem. Sci.* 2014, 5, 4610-4614) among many others. However, it has been recognized that modularity in Nature is key for successful photosystem function. (Croce, R.; van Amerongen, H. Natural Strategies for Photosynthetic Light Harvesting. *Nat. Chem. Biol.* 2014, 10, 492-501). Thus, self-organization appears to be a more attractive avenue for construction of "soft" photosystems. This is because assembly of modular subunits allows for greater flexibility and optimization of the individual parts, as opposed to the need to synthesize the entire collection "from scratch" if the system must be altered in one or more of its functions to suit a particular energetic, structural or stability requirement.

A particularly attractive candidate to serve as the cornerstone for a supramolecular LHA assembly is the conjugated polyelectrolyte (CPE)—an amphiphilic polymer with a conjugated backbone and ionized (or ionizable) sidechains. (Jiang, H.; Taranekar, P.; Reynolds, J. R.; Schanze, K. S. Conjugated Polyelectrolytes: Synthesis, Photophysics, and Applications. *Angew. Chem. Int. Ed. Engl.* 2009, 48, 4300-16). Due to their π-electron-rich backbones and ionic sidechains, CPEs hold great promise as electronic energy highways and macromolecular scaffolds. (Costa, T.; Garner, L. E.; Knaapila, M.; Thomas, A. W.; Rogers, S. E.; Bazan, G. C.; Burrows, H. D. Aggregation Properties of P-Phenylene Vinylene Based Conjugated Oligoelectrolytes with Surfactants. *Langmuir* 2013, 29, 10047-58; Evans, R. C.; Knaapila, M.; Willis-Fox, N.; Kraft, M.; Terry, A.; Burrows, H. D.; Scherf, U. Cationic Polythiophene-Surfactant Self-Assembly Complexes: Phase Transitions, Optical Response, and Sensing. *Langmuir* 2012, 28, 12348-56; Knaapila, M.; Evans, R. C.; Garamus, V. M.; Almasy, L.; Szekely, N. K.; Gutacker, A.; Scherf, U.; Burrows, H. D. Structure and "Surfactochromic" Properties of Conjugated Polyelectrolyte (Cpe): Surfactant Complexes between a Cationic Polythiophene and Sds in Water. *Langmuir* 2010, 26, 15634-43; Pinto, S. M.; Burrows, H. D.; Pereira, M. M.; Fonseca, S. M.; Dias, F. B.; Mallavia, R.; Tapia, M. J. Singlet-Singlet Energy Transfer in Self-Assembled Systems of the Cationic Poly{9,9-Bis[6-N,N,N-Trimethylammonium)Hexyl]Fluorene-Co-1,4-Phenylene} with Oppositely Charged Porphyrins. *J. Phys. Chem. B* 2009, 113, 16093-100). The electrostatic coupling leads to strong interactions, while controlling the charge density allows for tuning the cooperative strength of this interaction. Furthermore, the strong influence of the backbone microstructure on its optoelectronic properties, as well as sensitivity to the local electric field, allows one to tune the environment to control EET, akin to how the polypeptide scaffolding environment can tune the energy levels of natural pigments. Using CPEs in light-harvesting assemblies largely obviates the need for an optically inactive scaffolding, thereby raising the density of subunits that directly contribute to excited state generation.

Herein, we describe assembly of oppositely charged CPEs as LHA with complementary electronic absorption and emission spectra, resulting in thermodynamically-allowed EET between the complexed CPEs. To the best of our knowledge, this is the first time that a multi-CPE complex assembly in solution has been studied. We show that both in solution and the solid state, oppositely-charged CPEs readily form ionic complexes that undergo inter-CPE EET. Further, we show that complex formation drastically modulates the nature of the emitting excitonic wavefunction relative to isolated CPEs. Our results demonstrate that oppositely charged complexes of donor/acceptor CPEs display rich photophysics and intriguing assembly behavior, underscoring the ability of these materials to function as tunable exciton relays for LHA applications.

Experimental Methods

Sample Preparation

The cationic conjugated polyelectrolyte poly([fluorene]-alt-co-[phenylene]) (PFPI) with an average molecular weight (MW) of 21,000 Da and polydispersity index (PDI) of 1.2 was obtained from Solaris Chem Inc. The anionic conjugated polyelectrolyte poly(alkylcarboxythiophene) derivative (PTAK) with an MW of 16,000 Da and a PDI of 2.2 was obtained from Rieke Metals. Both materials were used as received.

Stock Solutions of PFP3I and PTAK (10.0 mg/mL) were prepared in Milli-Q water and then mixed in desired molar ratios to form CPECs. The PTAK stock solution was stirred at ~70° C. for 24 hours. The PFPI stock solution was stirred at ~55° C. for 72 hours. Care was taken to minimize exposure to ambient lights. CPEC solutions with PFPI: PTAK charge ratios of PFPI to PTAK (1:0.01, 1:0.05, 1:0.25) were prepared based on the number of chargers per monomer unit. The PFPI monomer carries a charge of 2+, and the ionized PTAK monomer carries a 1-charge. The PFPI concentration was fixed at 1 mg/mL for all CPEC solutions. The forward addition method is as follows. PFPI from the stock solution was added to Milli-Q water, after which PTAK stock was added dropwise to the solution while stirring at room temperature to achieve the desired charge ratio. The order of CPE addition is switched in the reverse order. CPEC solutions were then stirred at ~55° C. for 24 hours. In solutions with a solid/liquid phase coexistence, mixtures were centrifuged at 3400 rpm for 30 minutes, after which the phases were separated for further measurements.

Steady-State Spectroscopy

Optical density measurements were taken in 1.0 nm increments with a Shimadzu UV-2700 Spectrophotometer with an integration time of 0.1 seconds and a 2.0 nm slit width over the range of 300-800 nm. Photoluminescence measurements were taken using a Horiba Fluromax-4 spectrofluorometer in a right-angle geometry in cuvettes with 1 mm pathlengths, with excitation wavelengths scanned in 5.0 nm increments and emissions measured in 1.0 nm increments over the range of 300-800 nm. Liquid samples were measured with a Rayleigh masking slit width of 5.0 nm and an integration time of 0.1 seconds. Solid samples were placed at an 87° angle relative to the incident beam and measured with a Rayleigh masking slit width of 2.0 nm and an integration time of 0.05 seconds.

Dynamic Light Scattering (DLS)

Solutions were filtered using 0.65 μm Millipore filter directly into borosilicate glass test tubes. Samples were immersed in decalin to match the index of refraction of glass (n~1.33). All DLS measurements were made on a Brookhaven BI-200SM goniometer system using a Turbo-Corr photon counter and digital correlator at room temperature. The light source was a CW Mini-L30 solid-state diode laser outputting 637 nm light with adjustable power limited to 35 mW. The laser power and optical density filter were adjusted in order not to exceed a signal intensity of 200 kilocounts per second. Scattered photons were detected by an avalanche photodiode detector. The normalized intensity correlation functions were transformed to the normalized electric-field field correlation function using the Siegert regulation. The field correlation functions were analyzed using CONTIN, which is a regularized inverse Laplace transform algorithm originally written in FORTRAN by Provencher and since emulated by Marino in MATLAB. Distribution of relaxation times were obtained for scattering angles of 20 and 90 degrees with the regulation parameter (a) set to 0.1. Various choices for a as well as various grid densities for the relaxation time space were explored. We found that relaxation times obtained with different choices of a were similar. A larger value of a was avoided so as to not overly smooth the relaxation time distribution. Hydrodynamic radius values were obtained using the Stokes-Einstein equation.

Small-Angle X-Ray Scattering (SAXS)

SAXS measurements were performed at beam line 4-2 at the Stanford Synchrotron Radiation Laboratory (SSRL) using a Rayonix MX225-HE detector. Samples in thin-wall quartz capillary cell were irradiated by a 11 keV X-ray (1.17 Å) at a sample to detector distance of 3.5 m. A set of 10 consecutive 1 second X-ray exposures were made on each sample at room temperature. The scattering of the background (Milli-Q water) was subtracted from solution scattering. To avoid degradation, the samples were oscillated during data collection. SasTool, a software package developed at SSRL, was used to convert collected 2D TIFF images to intensity vs. scattering vector and to subtract solvent scattering.

Time-Resolved Photoluminescence Spectroscopy

Time-correlated single photon counting (TCSPC) was carried out on a home-built apparatus. The excitation source was a pulsed Super K EXTREME (NKT Photonics) supercontinuum laser coupled to a Super K SELECT (NKT Photonics) acousto-optic filter and external RF driver (NKT Photonics) to select the wavelength of the excitation pulse. Measurements were carried out at a 78 MHz pulse repetition rate with either 15.4 µW (420 nm) or 97.6 µW (600 nm) power, as measured near the sample. Both excitation and emission beams were horizontally polarized by mounted Glan-Thompson polarizers (Thorlabs). Emission light was collimated and refocused by a set of achromatic doublets (Thorlabs). Long pass filters were used to minimize the influence of the reflected excitation beam. Emission wavelengths were selected by an Acton Spectra Pro SP-2300 monochromator (Princeton Instruments), on which two detectors were mounted for steady-state and time-resolved measurements. An air-cooled PIXIS 100 CCD (Princeton Instruments) was used to record the steady-state spectra on the fly. A hybrid PMT with minimal after-pulsing (Becker and Hickl) was used to record the time-resolved fluorescence decay. An SPC-130 photon counting module (Becker and Hickl) coupled to a Simple-Tau 130 table top TCSPC system was used for photon counting. Emitted photons were collected for 5 seconds, and each measurement was repeated 50 times prior to averaging and subsequent analysis.

Results and Discussion

Figure 12A:
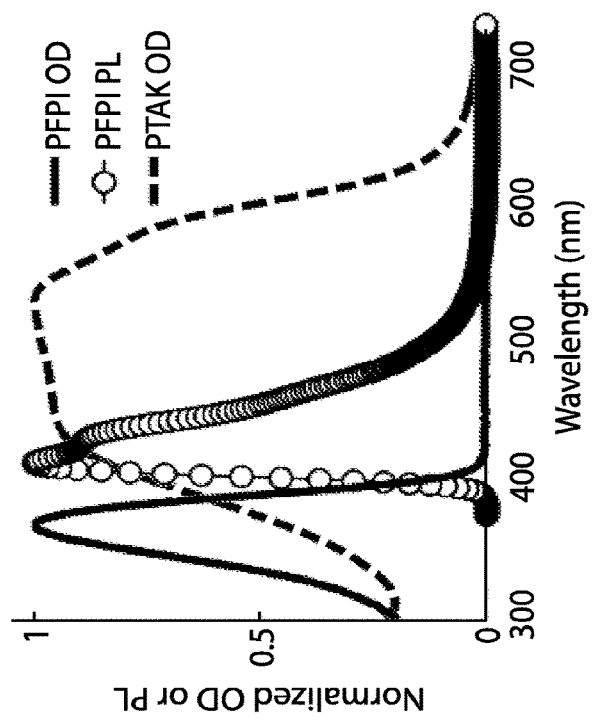
FIG. 12A-FIG. 12B depicts, in accordance with an embodiment of the invention, FIG. 12A chemical structures of PFPI (left) and PTAK (right).
Figure 12B:
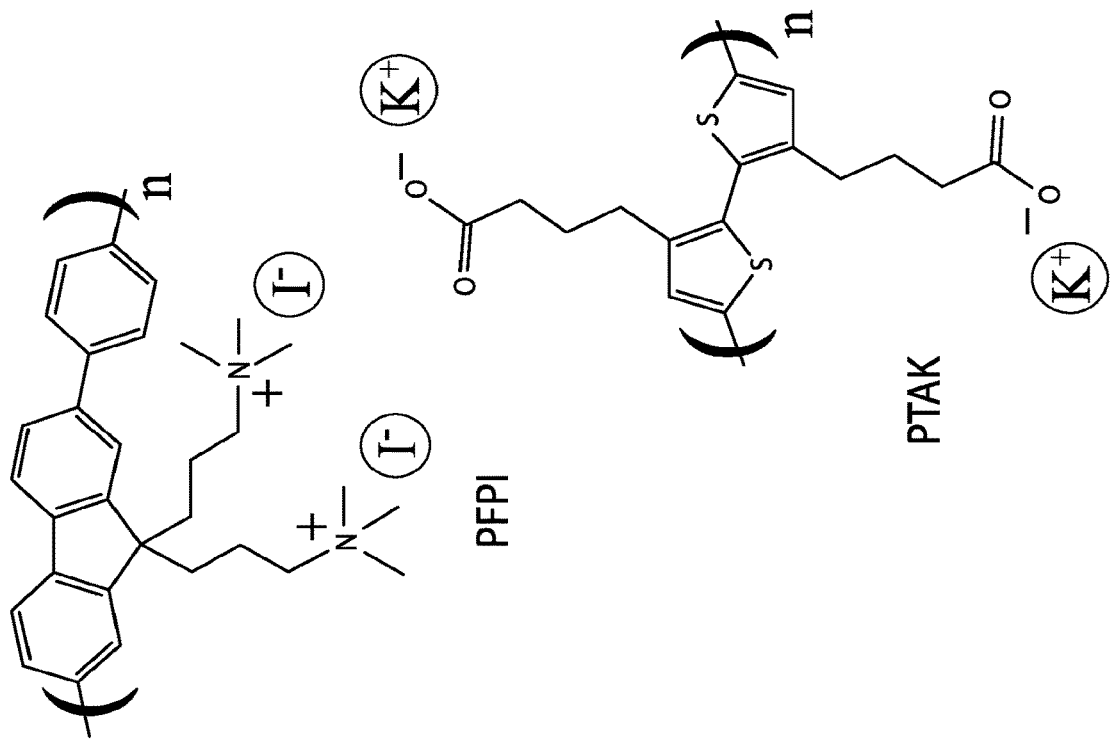

This investigation focuses on an oppositely charged pair of CPEs, the chemical structures of which are shown in FIG. 12A. The iodide salt of the cationic poly(fluorene-co-phenylene) (PFPI) derivative serves as the excitonic donor, and the potassium salt of an anionic, regioregular poly(thiophene) (PTAK) derivative acts as the energy acceptor. FIG. 12B shows that the emission spectrum of PFPI spectrally overlaps the optical density (OD) of PTAK, indicating that energy transfer is thermodynamically allowed. Since both CPEs emit readily detectable photoluminescence (PL), and because the chain microstructure is strongly coupled to the polymer photophysics, PL spectroscopy forms the basis for this investigation. Aqueous CPE concentrations were chosen to be large enough so as to observe phase separation beyond a critical polycation/polyanion charge ratio, allowing us to compare the photophysics of the liquid and solid phases.

FIG. 13A-FIG. 13D shows steady-state PL contour maps with excitation and emission wavelengths plotted vertically and horizontally, respectively, of both isolated CPE solutions and their mixed solutions. The PL map of 1 mg/mL PFPI is shown in FIG. 13A. The PL intensity is concentrated in the region that corresponds to strong PFPI absorption, as shown in FIG. 12B. However, because of the very large extinction coefficient of PFPI, at these concentrations the PL map appears as two PL bands as a function of excitation wavelength ($\lambda_{ex}$). This is a consequence of the fact that PL intensity was collected at 90° with respect to the excitation beam, resulting in imperfect spatial overlap of PL signal due to excitations near the OD peak with the capture cross-section of the detector.

FIG. 13B shows PL due to an aqueous PTAK solution at a concentration matched to the PFPI:PTAK complex at the 1:0.25 molar charge ratio (FIG. 13D). A contrast scale that was different from the rest of the samples had to be used for this particular sample due its very low PL intensity; in fact, at these instrumental parameters, PL from lower concentration solutions was barely measurable. In addition to the observation that PTAK solutions fluoresce weakly, it is important to note that there is negligible PL arising at $\lambda_{ex}$ that give rise to peak absorption. In this context, it is worth mentioning that the solution absorption spectrum of PTAK is quite similar to that of a thin film of neutral, regioregular poly(3-hexylthiophene)—a well-studied poly(thiophene) derivative, P3HT—which is also known to have low PL quantum yields. (Guo, S.; Ruderer, M. A.; Rawolle, M.; Korstgens, V.; Birkenstock, C.; Perlich, J.; Muller-Buschbaum, P. Evolution of Lateral Structures During the Functional Stack Build-up of P3ht:Pcbm-Based Bulk Heterojunction Solar Cells. *ACS Appl. Mater. Interfaces* 2013, 5, 8581-90; Roehling, J. D.; Arslan, I.; Moulé, A. J. Controlling Microstructure in Poly(3-Hexylthiophene) Nanofibers. *J. Mater. Chem.* 2012, 22, 2498-2506; Yamagata, H.; Spano, F. C. Interplay between Intrachain and Interchain Interactions in Semiconducting Polymer Assemblies: The HJ-Aggregate Model. *J. Chem. Phys.* 2012, 136, 184901; Clark, J.; Chang, J.-F.; Spano, F. C.; Friend, R. H.; Silva, C. Determining Exciton Bandwidth and Film Microstructure in Polythiophene Films Using Linear Absorption Spectroscopy. *Appl. Phys. Lett.* 2009, 94, 163306).

FIG. 13C and FIG. 13D show PL maps from solutions of oppositely-charged CPE complexes (CPECs) at the specified polycation:polyanion molar charge ratios. Here, the PFPI concentration has been fixed at 1 mg/mL, and the charge ratio is varied by varying the concentration of PTAK. The 2D PL map for the 1:0.01 CPEC (FIG. 13C) shows the characteristic PFPI emission band, but in addition, the PTAK region at emission wavelengths ($\lambda_{em}$)>550 nm now also shows several PL bands. First, there is PTAK PL peaked in a narrow $\lambda_{ex}$ range corresponding to the excitation of low-energy PFPI chromophores; as such, this PTAK band falls on the same horizontal line ($\lambda_{ex}$=constant) as PFPI, labeled with a red dashed line. Second, there is measurable PL coming from PTAK throughout its absorption band. Control PTAK solution at this concentration do not show any intensity on this contrast scale.

When the charge ratio is further increased to 1:0.25, the solution phase separates into a liquid phase and a dense CPE network phase, which resembles a loose precipitate. The PL map of the solid phase is shown herein. FIG. 13D shows the PL of the solution phase at this charge ratio. The FIG. 13D shows that PFPI PL has been substantially quenched. Concomitantly, PTAK PL is substantially enhanced both over the $\lambda_{ex}$ that give rise to PFPI PL. Additionally, PTAK PL arising from the bulk of its absorption ($\lambda_{ex}$>450 nm) is now quite strong, in stark contrast to the weak PL from the control PTAK solution at the same nominal concentration (FIG. 13B).

Figure 14B:
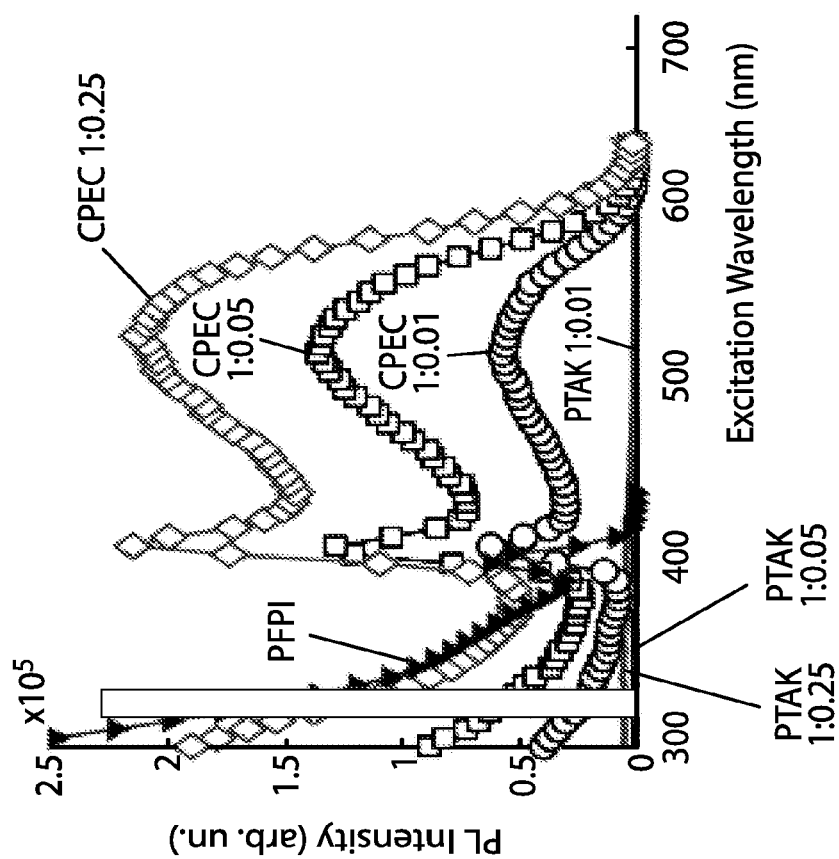
FIG. 14A-FIG. 14B depicts, in accordance with an embodiment of the invention, FIG. 14A OD of isolated PTAK and PTAK complexed to PFPI (CPEC) at the same nominal PTAK concentrations.
Figure 14A:
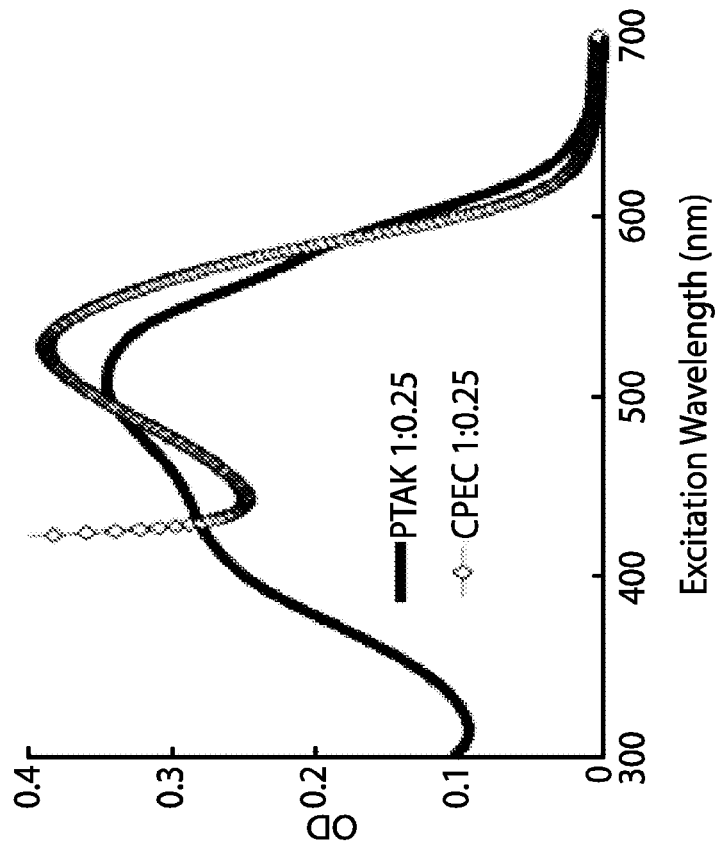

To understand the difference between the steady-state PTAK photophysics in isolation vs. as part of a CPEC, we have displayed representative OD spectra of PTAK in isolation vs. in the complexed state in FIG. 14A. Both samples show comparable OD magnitudes; however, there are notable differences. The isolated PTAK spectrum is slightly red-shifted relative to the CPEC, and the latter has enhanced oscillator strength over the main excitonic absorption band.

To quantify differences in PL intensities between the different PTAK samples, FIG. 14B shows the PL excitation (PLE) spectrum for different charge ratios exclusively in the PTAK emission region, generated by plotting the PL intensity at $\lambda_{em}$ close to the peak of the PTAK emission spectrum as a function of $\lambda_{ex}$. In the CPEC, there is clear enhancement in PTAK PL precisely at $\lambda_{ex}$ that give rise to strong PL from PFPI (also seen in FIG. 13A and FIG. 13C), both at the relatively sharp band at $\lambda_{ex}$~420 nm and at lower wavelengths. This enhancement in PTAK's PL precisely at $\lambda_{ex}$ that give rise to strong PFP PL is even more clear at lower concentrations, due to a more uniform spatial distribution of excited states; this is shown herein. Without being bound by theory, the combination of the following observations constitutes strong evidence of EET from PFPI to PTAK: a) PTAK PL enhancement tracks the PFPI PLE intensity as a function of $\lambda_{ex}$; b) PFPI emission is progressively quenched with increasing PTAK concentrations. Without being bound by theory, this then directly implies that oppositely-charged PFPI and PTAK readily form a supramolecular complex in aqueous solution, leading to efficient EET from the donor to the acceptor CPE. Without being bound by theory, photoexcited electron transfer from PFPI to PTAK can be ruled out as a primary quenching mechanism for PFPI PL, as this would produce electron polarons on PTAK that would not give rise to enhanced PL.

Closer inspection of FIG. 14B shows a striking result: The PTAK PL intensity in isolation is approximately two orders of magnitude lower than that of PTAK in a CPEC solution. To elucidate what is responsible for such a drastic difference in PL quantum yields, in FIG. 15A we have plotted normalized PTAK emission spectra exciting at $\lambda_{ex}$=450 nm. This $\lambda_{ex}$ was chosen because at longer wavelengths, the very weak PL signal to noise ratio of isolated PTAK becomes too low for quantitative analysis, though the same trends persist regardless of $\lambda_{ex}$.

Figures 15A, 15B:
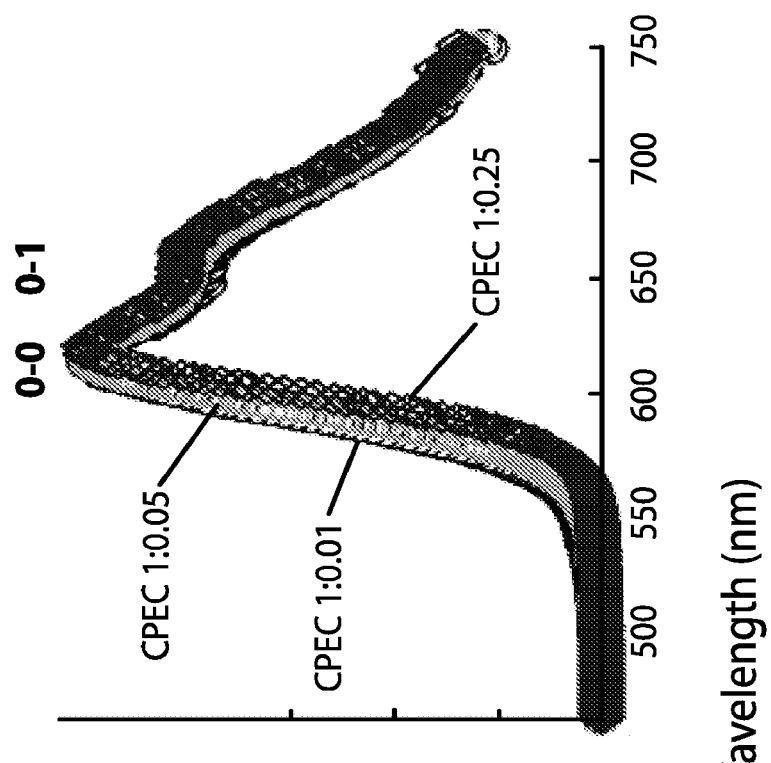
FIG. 15A-FIG. 15B depicts, in accordance with an embodiment of the invention, normalized PL of PTAK in isolated aqueous solution FIG. 15A vs. that of the CPEC FIG. 15B exciting at 450 nm. The data show that the apparent 0-0/0-1 vibronic ratio differs substantially between the same CPE in different environments: <1 in isolation and >1 in the CPEC.

FIG. 15A shows PL spectra of control PTAK solutions, and FIG. 15B shows emission spectra from CPEC solutions corresponding to the same nominal PTAK concentrations as the controls in (A). 0-0 and 0-1 vibronic peak positions are labeled in bold. FIG. 15A demonstrates that the apparent 0-0/0-1 peak ratio is less than unity for all three PTAK concentrations (corresponding to the three CPEC charge ratios), and the ratio progressively decreases with concentration. Without being bound by theory, we interpret the peak red shift with increasing concentration as a signature of enhanced inter-chain π-stacking. In stark contrast, the apparent 0-0/0-1 ratio is larger than unity for PTAK when it is complexed to PFPI (FIG. 15B), with a negligible change as the PTAK concentration is increased.

To understand emission spectra from conjugated polymers, the molecular exciton model, developed for dye aggregates by Kasha (Spano, F. C.; Silva, C. H- and J-Aggregate Behavior in Polymeric Semiconductors. *Annu. Rev. Phys. Chem.* 2014, 65, 477-500) and extended to polymers by others has been found to be particularly useful. Within this model, the 0-0/0-1 vibronic ratio <1 in chromophore aggregates is associated with H-type excitons, which have low emission quantum yields. Without being bound by theory, we interpret the weak emission from isolated PTAK solutions with a 0-0/0-1 ratio <1 as arising from predominantly H-like emitting states, which are primarily physically associated with π-stacked inter-chain species. (Schwartz, B. J. Conjugated Polymers as Molecular Materials: How Chain Conformation and Film Morphology Influence Energy Transfer and Interchain Interactions. *Annu. Rev. Phys. Chem.* 2003, 54, 141-172). Without being bound by theory, the latter might arise due to interactions between separate chains or between two or more distinct segments of the same coiled chain. Without being bound by theory, this interpretation is consistent with the observation that the absorption spectrum of isolated PTAK is similar to that of a P3HT film. Such absorption in P3HT has previously been shown to give rise to H-like emitting states. (Clark, J.; Chang, J.-F.; Spano, F. C.; Friend, R. H.; Silva, C. Determining Exciton Bandwidth and Film Microstructure in Polythiophene Films Using Linear Absorption Spectroscopy. *Appl. Phys. Lett.* 2009, 94, 163306; Spano, F. C.; Clark, J.; Silva, C.; Friend, R. H. Determining Exciton Coherence from the Photoluminescence Spectral Line Shape in Poly(3-Hexylthiophene) Thin Films. *J. Chem. Phys.* 2009, 130, 074904).

On the other hand, a 0-0/0-1 ratio approximately equal to or greater than unity is primarily associated with excitons having substantial J-like character, and which give rise to strongly allowed light emission. (Yamagata, H.; Spano, F. C. Vibronic Coupling in Quantum Wires: Applications to Polydiacetylene. *J. Chem. Phys.* 2011, 135, 054906). Without being bound by theory, when complexed to PFPI, the fact that PTAK PL spectra show nominal 0-0/0-1 ratios ~1, and the fact that the PL intensity is several orders of magnitude larger in the complexed state, leads us to conclude that within a CPEC, PTAK excitons are primarily J-like. Without being bound by theory, thus, oppositely-charged complex formation leads to emergent excitonic states in the regioregular PTAK that are wholly absent for the EET acceptor CPE in isolation.

Figures 16A, 16B, 16C:
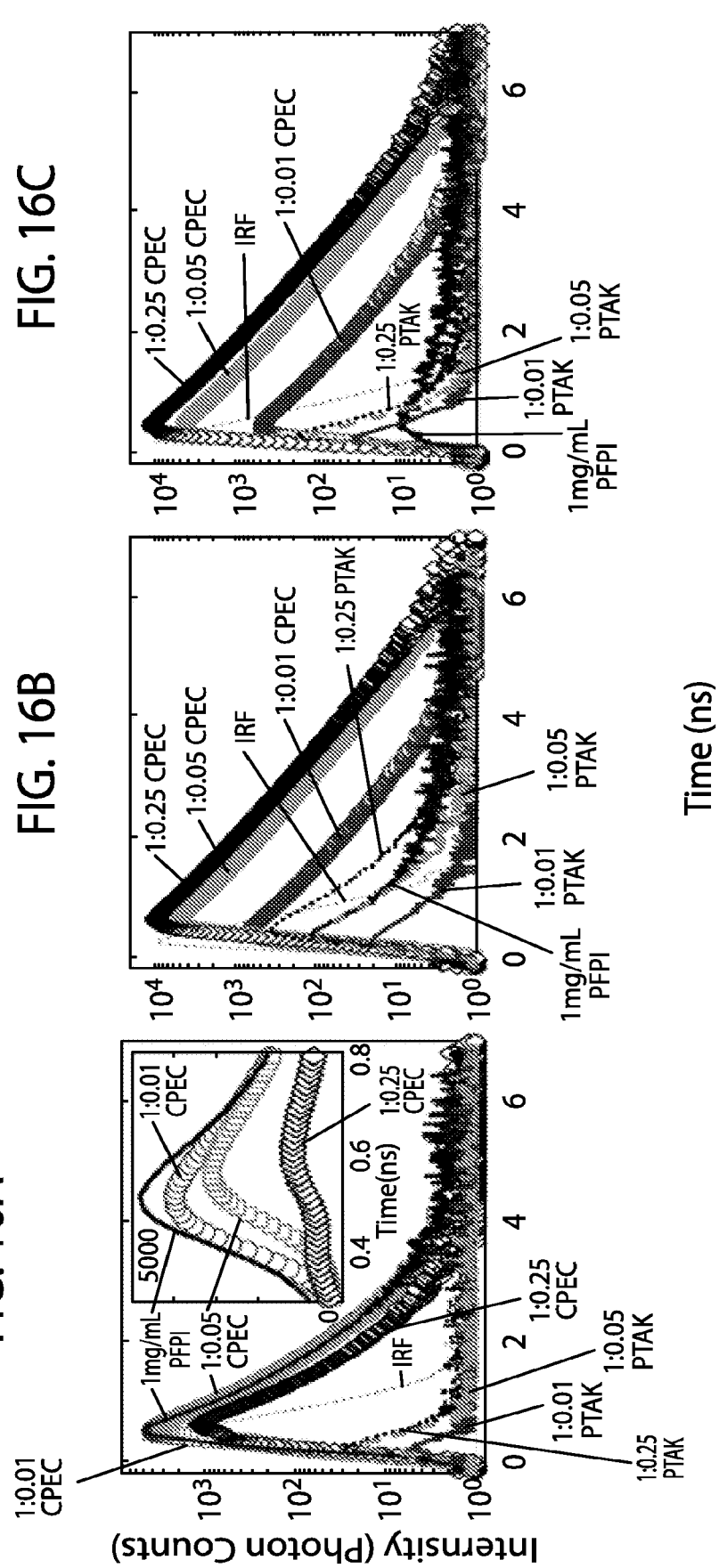
FIG. 16A-FIG. 16C depicts, in accordance with an embodiment of the invention, time-resolved PL decays (collected for the same duration) of CPECs at varying polyion charge ratios as well as pure CPE solution controls prepared at concentrations corresponding to their respective CPEC solutions. The pure PTAK controls are labeled with the corresponding CPEC charge ratio. The instrument response function (IRF) is labeled in all panels.

To further test this interpretation, we have measured time-resolved PL (TRPL) via time-correlated single-photon counting. FIG. 16A shows the TRPL decays on a semi-logarithmic scale of a pure PFPI solution along with CPECs and PTAK controls excited at 420 nm with emission collected at 442 nm, which corresponds to the peak of the PL spectrum of PFPI. We find that for the lowest charge ratio CPEC, there is a moderate yet significant drop in intensity, which tracks the steady state PL. A blowup of this data on a linear scale is shown in the inset.

At the two higher ratios, there is pronounced quenching of the PFPI emission, consistent with steady-state results. FIG. 16B shows TRPL decays excited at the same $\lambda_{ex}$ but with emission detected at 615 nm, strictly corresponding to PTAK PL. This panel shows that across all PTAK concentrations, there is a drastic increase in the intensity of emission from the CPEC relative to the corresponding PTAK controls. The increase in fluorescence is several times greater than what would be expected just from the increase in total polymer concentration in solution. While this change in total fluorescence intensity tracks the decrease in CPEC fluorescence at 442 nm (quenching of PFPI emission), the fractional changes in the magnitudes are not similar. In fact, the increase in fluorescence at 615 nm between concentrations is approximately 5-10 times larger than the associated decrease in PFPI emission, depending on the sample. Thus, in addition to EET, the increase in the PL lifetime of PTAK bound to PFPI is again consistent with emission from J-like states.

Finally, to better understand the PL that comes from PTAK excitons generated in the red tail of the CPEC absorption—corresponding to the most delocalized excited states—FIG. 16C displays TRPL curves collected at $\lambda_{ex}$=600 nm and $\lambda_{em}$=680 nm. As in FIG. 16B, we again see that the total fluorescence of the CPECs far exceeds what would be expected just by increasing the total polyelectrolyte concentration. Without being bound by theory, this suggests that whether excited by energy transfer from PFPI or excited directly, PTAK excitons are relaxing through the same highly emissive J-like excitons. Therefore, without being bound by theory, complexation appears to preclude strong formation of intra- and inter-chain H-aggregation, leading to J-like states instead.

Figure 17:
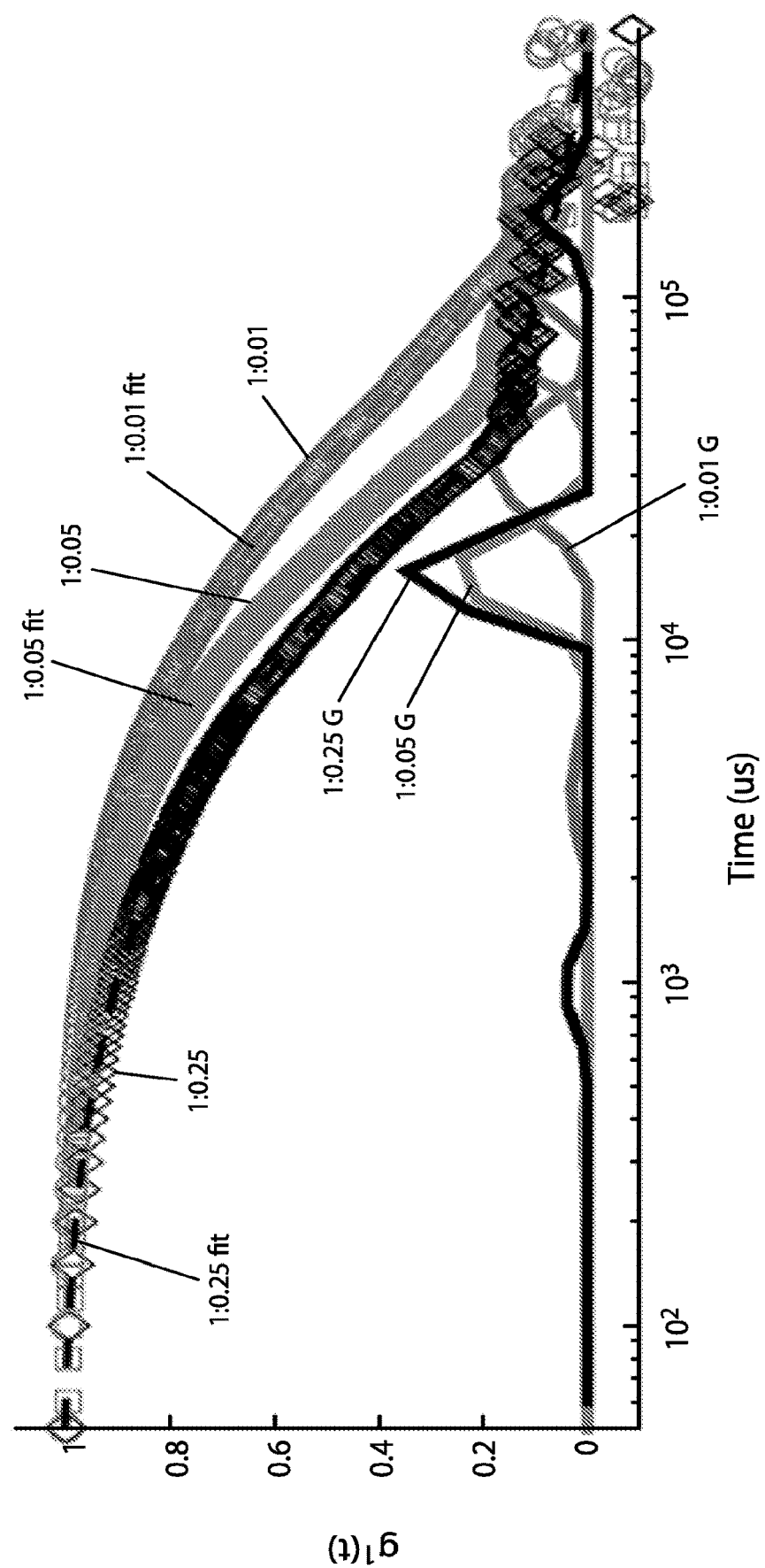
FIG. 17 depicts, in accordance with an embodiment of the invention, normalized DLS electric field autocorrelation functions for CPEC solutions collected at a 20° scattering angle. Hollow markers correspond to data, dashed lines to CONTIN-generated fits labeled with corresponding "fit", and solid lines to relaxation time distribution times obtained from CONTIN, labeled with corresponding "G".

In an effort to connect the photophysics to the physical structure of the complexes, we have characterized CPECs at varying charge ratios using both dynamic (visible) light scattering (DLS) (Chu, B.; Wang, Z.; Yu, J. Dynamic Light Scattering Study of Internal Motions of Polymer Coils in Dilute Solution. *Macromolecules* 1991, 24, 6832-6838; Tsunashima, Y.; Nemoto, N.; Kurata, M. Dynamic Light Scattering Studies of Polymer Solutions. 2. Translational Diffusion and Intramolecular Motions of Polystyrene in Dilute Solutions at the Θ Temperature. *Macromolecules* 1983, 16, 1184-1188; Sedlák, M. The Ionic Strength Dependence of the Structure and Dynamics of Polyelectrolyte Solutions as Seen by Light Scattering: The Slow Mode Dilemma. *J. Chem. Phys.* 1996, 105, 10123) and small-angle X-ray scattering (SAXS) (Combet, J.; Lorchat, P.; Rawiso, M. Salt-Free Aqueous Solutions of Poly electrolytes: Small Angle X-Ray and Neutron Scattering Characterization. *Eur. Phys. J.: Spec. Top.* 2012, 213, 243-265; Glatter, O.; Kratky, O. Small Angle X-Ray Scattering; Academic Press, 1982). In DLS measurements, we collected self-beating intensity autocorrelation functions (ACFs) $g^1(t)$ at scattering angles of 20° (Berne, B. J.; Pecora, R. *Dynamic Light Scattering: With Applications to Chemistry, Biology, and Physics*; Dover Publications, 2013). FIG. 17 shows a composite ACF plot of CPEC solutions at varying charge ratios, as well as relaxation time distribution functions obtained using the CONTIN algorithm, which performs a regularized inverse Laplace transform. (Scotti, A.; Liu, W.; Hyatt, J. S.; Herman, E. S.; Choi, H. S.; Kim, J. W.; Lyon, L. A.; Gasser, U.; Fernandez-Nieves, A. The Contin Algorithm and Its Application to Determine the Size Distribution of Microgel Suspensions. *J. Chem. Phys.* 2015, 142, 234905).

DLS relaxation times, associated diffusion coefficients and mean hydrodynamic radii are summarized in Table 1. Inspection of FIG. 17 demonstrates that the mean relaxation time for the lowest charge ratio is longest, which means that the mean size is largest. The 1:0.01 charge ratio yielded a predominantly bimodal distribution with two characteristic particle sizes, the smaller of which was 87 nm. Particles corresponding to the smaller of the two sizes shrank progressively with increasing charge ratio to 46 nm at 1:0.05 and 42 nm at 1:0.25. Additionally, we find that for all three charge ratios, we observe large particle sizes in excess of 100 nm. Without being bound by theory, these results imply that as more PTAK is added to PFPI, the mean complex size progressively shrinks as charges on one polymer are compensated by its oppositely charged partner. Without being bound by theory, this is possibly due to a propensity to lower the interfacial area between the hydrophobic conjugated backbones of the CPEs and the highly polar solvent as the effective charge density of the complex diminishes. Without being bound by theory, the decrease in size is consistent with a slight red shift in PTAK PL when complexed to PFPI (FIG. 15B), which we attribute with a mild increase in inter-chain π-stacking

TABLE 1

CONTIN fit results of DLS autocorrelation functions of CPEC solutions at 20° scattering angle.

| PFP3I:PTAK Molar Charge Ratio | Relaxation time (us) | RH (nm)$^a$ | Relative Size Distribution (%) |
|---|---|---|---|
| 1:0.01 | $3.3 \times 10^4$ | 87 | 47.4 |
|  | $3.7 \times 10^3$ | 10 | 7.9 |
|  | $1.3 \times 10^5$ | 342 | 44.7 |
| 1:0.05 | $1.7 \times 10^4$ | 46 | 55.6 |
|  | $6.8 \times 10^4$ | 180 | 44.4 |
| 1:0.25 | $1.6 \times 10^4$ | 42 | 76.4 |
|  | $1.7 \times 10^5$ | 462 | 23.7 |

$^a$Intensity-weighted hydrodynamic radius from dynamic light scattering.

Figure 18:
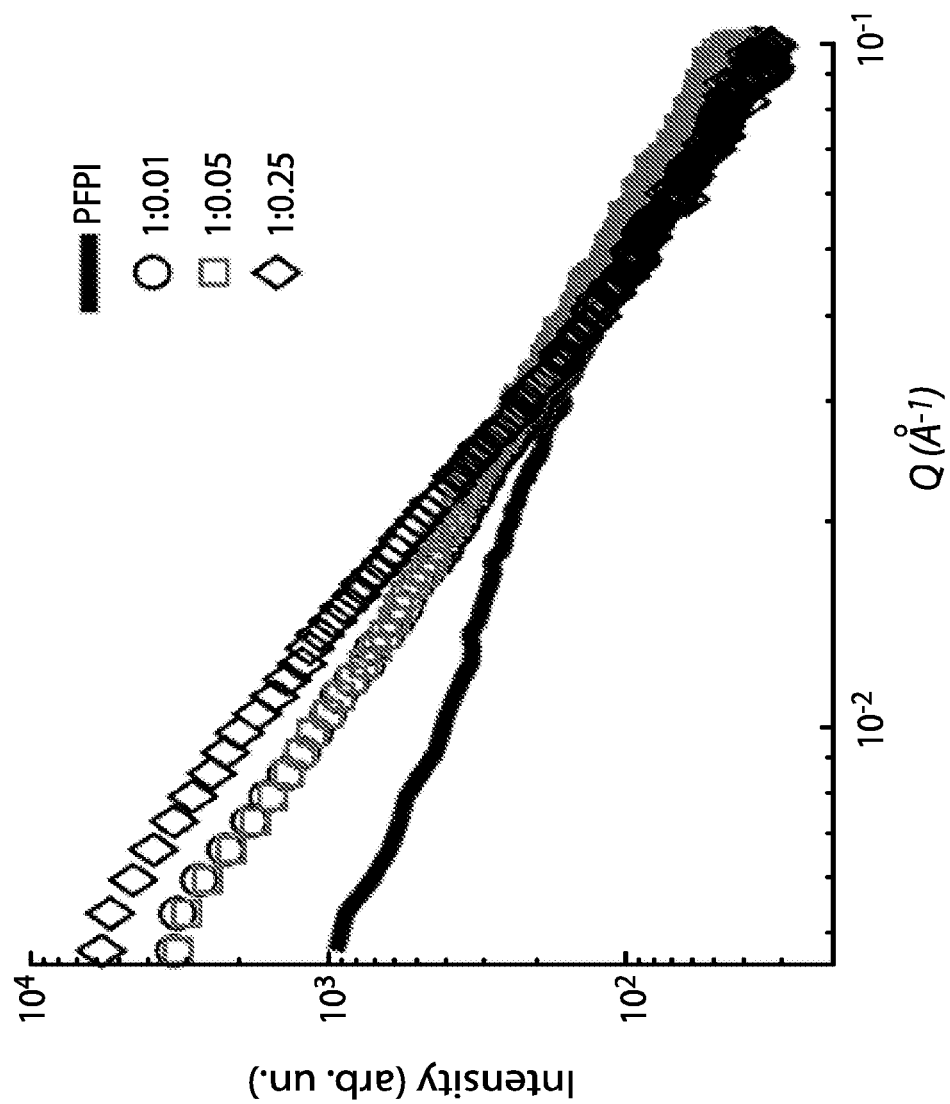
FIG. 18 depicts, in accordance with an embodiment of the invention, SAXS intensities vs. scattering vector Q for 1 mg/mL PFPI solution (solid black line) and CPEC solutions at 1:0.01 (circles), 1:0.05 (squares) and 1:0.25 (diamonds) charge ratios.

To characterize the electron density contrast between water and CPECs as a function of charge ratio, we carried out synchrotron solution SAXS measurements. These results are shown in FIG. 18 on a double logarithmic plot, where we compare pure PFPI to that of the CPECs for both addition orders. We find that all the curves except the 1:0.25 CPEC exhibit similar limiting power law exponents at high Q, suggesting, that without being bound by theory, that interfaces internal to the CPE coil do not differ substantially between pure PFPI and CPECs at the lower charge ratio. At 1:0.25, without being bound by theory, the decrease in the slope could possibly be due to a more fractal internal geometry, though a more systematic investigation of this observation is beyond the scope of this paper.

At low Q, however, all CPEC curves show an excess in scattering intensity relative to pure PFPI. This is reasonable, since when the oppositely charged CPEC forms, we expect that the electron density contrast between pure solvent and the complex will be larger than that of the isolated CPE. Curves for 1:0.01 CPECs can be roughly captured with a single power law decay. In 1:0.05 CPECs curves begin to depart from a power law as they show signs of a developing (yet relatively poorly-defined) Guinier region at low Q. At the 1:0.25 ratio, the SAXS curve displays a hint of Guiner behavior, indicating formation of a more well-defined CPEC particle shape relative to pure PFPI and the lowest charge ratio complex. Without being bound by theory, taken together with DLS results, this suggests that the decrease in mean particle size at larger charge ratios leads to solution complexes with greater packing density, as implied by the rise in scattering intensity at low Q.

Figure 19A:
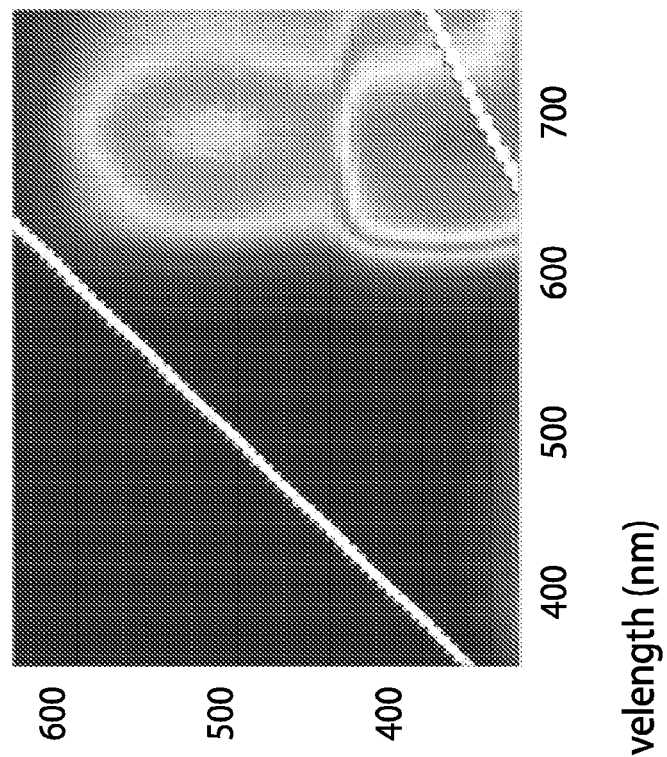
FIG. 19A-FIG. 19B depicts, in accordance with an embodiment of the invention, 2D PL maps of the solid CPEC dense phase isolated from CPEC solutions of varying polycation/polyanion charge ratios.
Figure 19B:
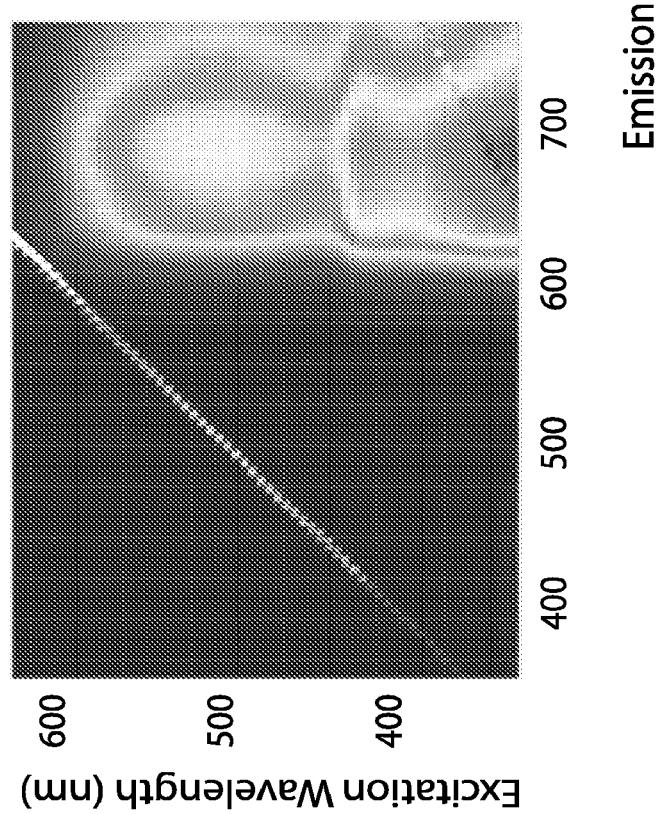

Having characterized CPEC solutions, we now turn to examining the dense CPEC network phase. Phase separation occurs at charge ratios exceeding 1:0.05. The dense phase was spread on a glass substrate as a paste and allowed to dry prior to collecting PL, which is shown in FIG. 19A-FIG. 19B for two charge ratios. The first striking feature is that PL from PFPI is effectively absent, save for a weak band at the PFPI:PTAK charge ratio of 1:0.25. There is a pronounced enhancement in PL from PTAK when exciting between ~320 and 420 nm. This corresponds well to the OD of PFPI; however, PTAK has (relatively low) absorption in this region as well, and isolated PTAK solutions also showed PL when exciting in this region. It is worth noting that a pure spin-coated PTAK film does not give rise to measurable PL (not shown), which is in contrast to the CPEC films shown in FIG. 19A-FIG. 19B.

Without being bound by theory, although we cannot rule out direct excitation of PTAK and its subsequent emission as contributing to PTAK's PL in the 320-420 nm excitation region, there are several observations that suggest that this PL at least partially contains emission from PTAK excitons that are populated directly as a result of EET from PFPI in the solid state. First, the enhancement of PTAK PL at these $\lambda_{ex}$ differs qualitatively from the solution PL shown in FIG. 14B. Second, if this PL was simply due to pure PTAK, we would expect strong self-quenching, as we observed in spin-coated PTAK films; this is not the case. Third, FIG. 19A shows that there is an additional enhancement in PTAK PL in the 1:0.063 ratio film at $\lambda_{ex}$~410 nm, which resembles solution behavior. Without being bound by theory, taken together, we believe that a fairly significant fraction of PTAK PL originating from $\lambda_{ex}$ between 320 nm and 420 nm is due to direct EET from PFPI to PTAK.

In both films shown in FIG. 19A-FIG. 19B, $\lambda_{ex}$ between 450 nm and 600 nm corresponds to a PL band that appears to roughly track the absorption spectrum of CPEC thin films. Without being bound by theory, the fact that this PL persists for both charge ratios suggests that these PTAK chains are strongly associated with PFPI. Without being bound by theory, these observations again suggest that PTAK chains preferentially associate with PFPI, and inter-PTAK π-stacking is not prevalent.

Figure 20A:
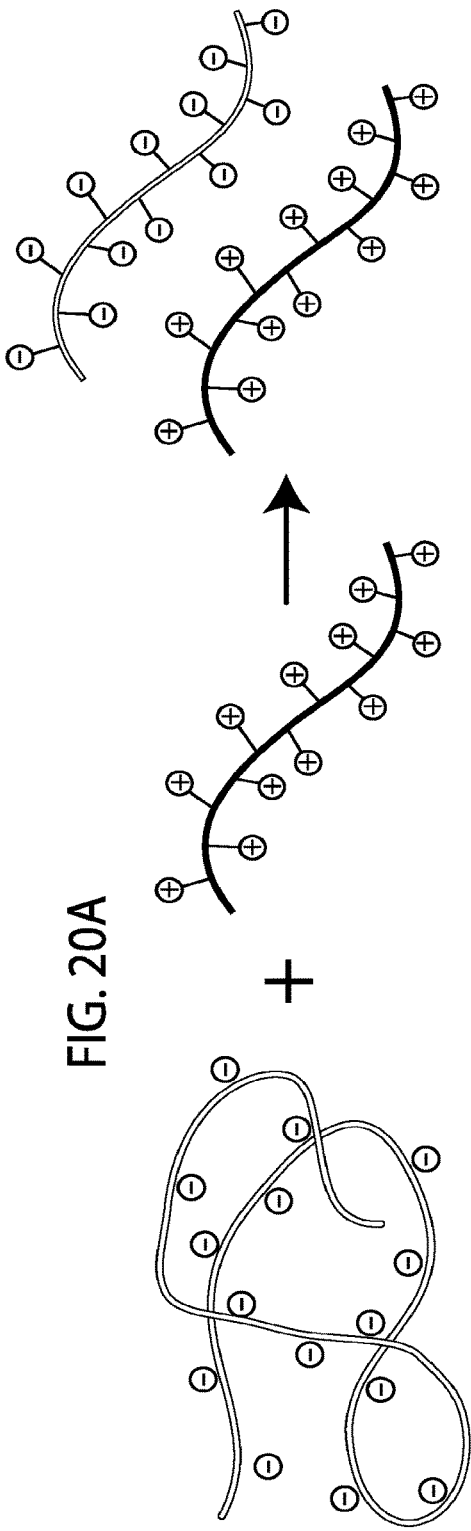
FIG. 20A-FIG. 20B depicts, in accordance with an embodiment of the invention, FIG. 20A cartoon illustrating the change in PTAK chain microstructure going from isolated solution to the CPEC. The result is a planarization of the PTAK backbone relative to isolated solutions.
Figure 20B:
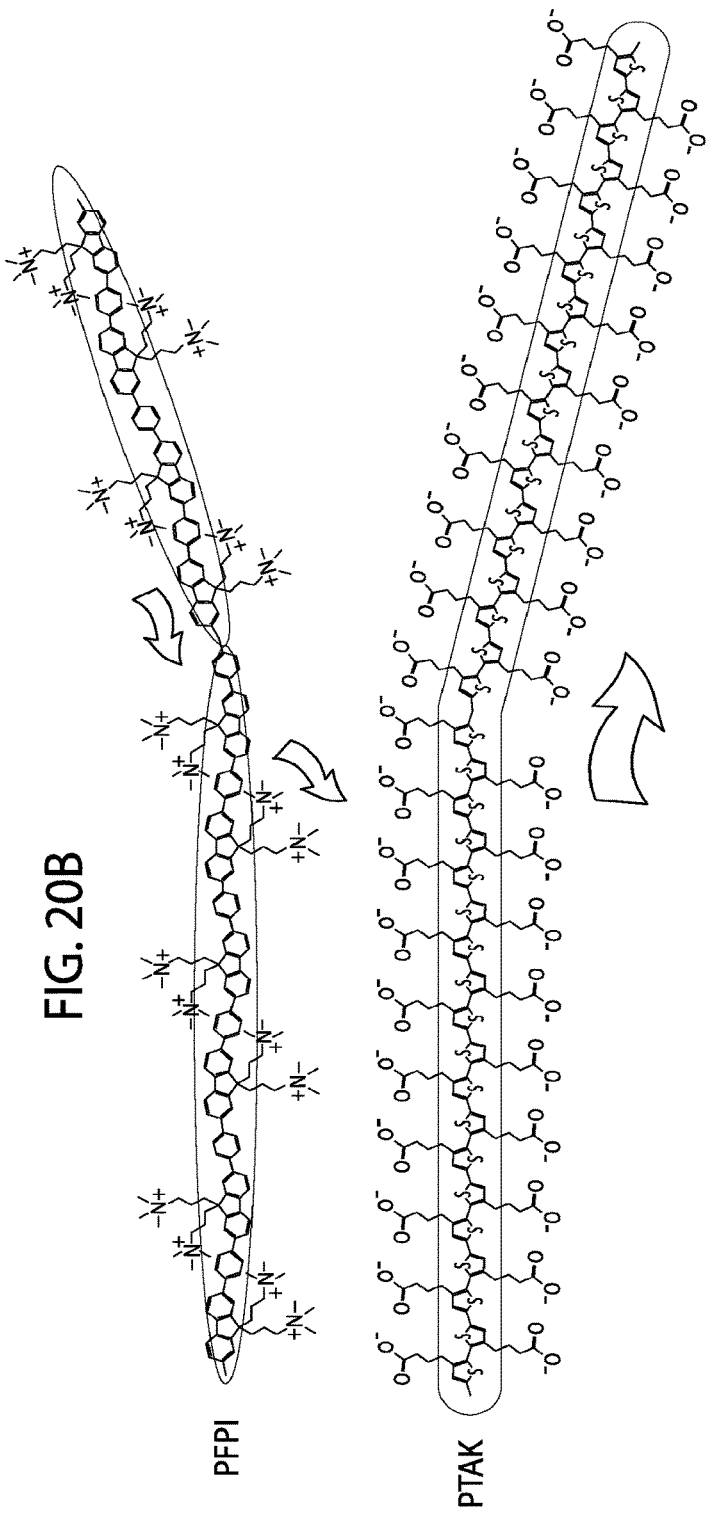

Thus it is clear that both solution and the solid state, PFPI and PTAK readily form ionically bound complexes, which exhibit EET from PFPI to PTAK. We have also shown that in solution, PTAK excitons are converted from H-like to J-like in the process of complexation with PFPI. With increasing charge ratio, the average complex size shrinks, but the primary J-like excitonic states remain. According to work by Spano et al. and Barford et al., J-like excitons in conjugated polymers are primarily viewed as arising from head-to-tail arrangements of transition dipoles localized on each monomer unit, which together add in phase. (Yamagata, H.; Spano, F. C. Interplay between Intrachain and Interchain Interactions in Semiconducting Polymer Assemblies: The HJ-Aggregate Model. *J. Chem. Phys.* 2012, 136, 184901; Spano, F. C.; Silva, C. H- and J-Aggregate Behavior in Polymeric Semiconductors. *Annu. Rev. Phys. Chem.* 2014, 65, 477-500; Yamagata, H.; Spano, F. C. Vibronic Coupling in Quantum Wires: Applications to Polydiacetylene. *J. Chem. Phys.* 2011, 135, 054906; Barford, W.; Marcus, M. Theory of Optical Transitions in Conjugated Polymers. I. Ideal Systems. *J. Chem. Phys.* 2014, 141, 164101; Marcus, M.; Tozer, O. R.; Barford, W. Theory of Optical Transitions in Conjugated Polymers. II. Real Systems. *J. Chem. Phys.* 2014, 141, 164102). In the limit of vanishing disorder, this leads to excitons highly delocalized over a single polymer chain. If multiple relatively straight chains are in proximity, excitons are expected to exhibit both J-like and H-like character. In the context of this model, we interpret J-like emission from PTAK within a CPEC as arising from excitons largely delocalized over a single chain akin to a 1D molecular wire in the low disorder limit. A cartoon of this is shown in FIG. 20A-FIG. 20B. This result is very intriguing, as the highly delocalized nature of the intra-chain J-like exciton will lead to facile electronic energy migration down the chain and may additionally result in an interplay between coherent and incoherent EET. The former has been observed for conjugated polymers in room temperature solution. (Collini, E.; Scholes, G. D. Coherent Intrachain Energy Migration in a Conjugated Polymer at Room Temperature. *Science* 2009, 323, 369-373). Such a combination of EET mechanisms has been invoked as possibly being essential for efficient directional funneling of excitons in natural light harvesting systems. (Blankenship, R. E. *Molecular Mechanisms of Photosynthesis*; Wiley, 2014).

Photoluminescence Excitation of a Dilute CPEC Solution.

Figure 21:
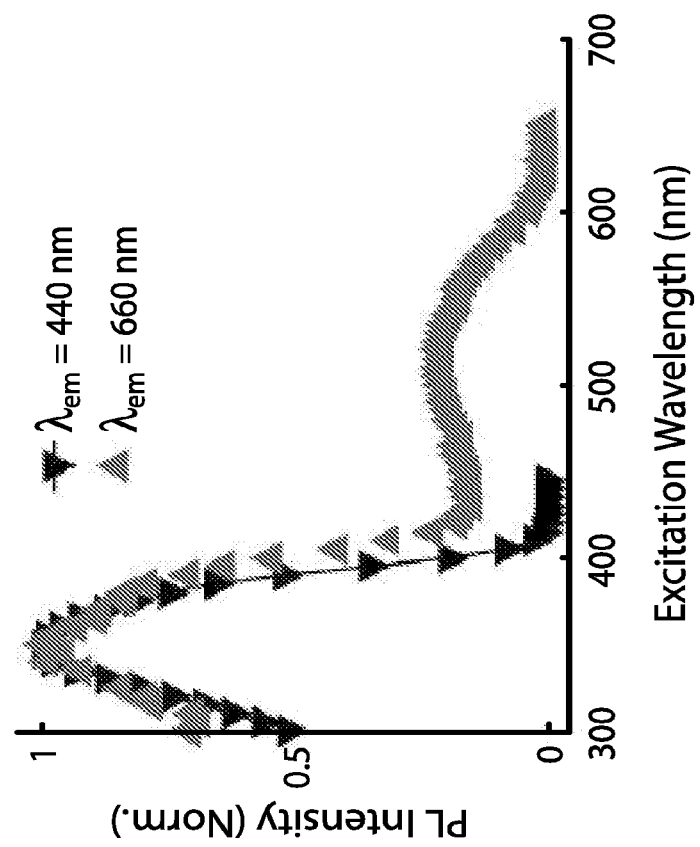
FIG. 21 depicts, in accordance with an embodiment of the invention, normalized PLE of a 1:0.25 charge ratio CPEC. Black triangles with line show PL collected at 440 nm, corresponding to PFPI PL. Gray triangles without line show PL collected at 660 nm, corresponding to PTAK.

FIG. 21 shows photoluminescence excitation (PLE) plots for a 1:0.25 charge ratio CPEC at a PFPI concentration of 0.1 mg/mL. At this concentration, the PFPI exciton density as a function of position in the cuvette along the beam direction is significantly more uniform relative to the 1 mg/mL solution. This leads to much improved spatial overlap of emitted light with the cross section of the detector. Black triangles with line show the PLE spectrum collected at $\lambda_{em}$=440 nm, which corresponds to PFPI emission. The gray triangles without line show PLE collected at $\lambda_{em}$=660 nm, where PTAK exclusively emits. PFPI PL largely follows its OD (FIG. 12B). Without being bound by theory, the fact that PTAK shows substantial enhancement in PL precisely at the wavelengths that give rise to PFPI PL constitutes strong evidence of EET from photoexcited to PFPI to PTAK.

Fits to PL Spectra.

In order to put a comparison of PL spectra between isolated PTAK control solutions and the corresponding CPEC solutions on a more quantitative footing, we have fit spectra on a photon energy scale to a vibronic progression. First, spectra were transformed from wavelength to energy space by scaling the measured intensity with a factor of $1/E^2$, where E is the photon energy. Intensities were further divided by a factor of $E^3$ to eliminate the energy dependence of the photon density of states. The resulting spectral intensities I were fit to a sum of Gaussian functions to represent the different vibronic contributions to the PL envelope as $$I = \sum_{n=0}^{3} a_n \exp[-(E - E_0 + nE_{vib})^2 / \sigma^2)] + const.$$

where the a's are the Gaussian amplitudes, $E_0$ is the electronic origin, $E_{vib}$ is the energy of the vibrational normal mode coupled to the electronic transition, and σ is the width. A constant background offset was also included. The 0-0/0-1 vibronic intensity ratio ($I_{0-0}/I_{0-1}$) was calculated as the ratio of the first and second Gaussian amplitudes. The width was constrained to be constant for each vibronic peak but allowed to vary between samples. The fit results are summarized below in Table 2, along with the goodness-of-fit parameter $R^2$.

TABLE 2

Gaussian fits to PL line shape in energy space.

| Sample | $E_0$ (eV) | $E_{vib}$ (eV) | σ (eV) | $I_{0-0}/I_{0-1}$ | $R^2$ |
|---|---|---|---|---|---|
| PTAK* (1:0.05) | 2.16 | 0.23 | 0.17 | 0.26 | 0.996 |
| CPEC (1:0.05) | 2.01 | 0.13 | 0.10 | 0.91 | 0.999 |

*PTAK is the control for the corresponding CPEC
(the charge ratio is indicated to the right).

CONCLUSIONS

To conclude, to the best of our knowledge we have reported on the very first preparation and characterization of an oppositely charged conjugated polyelectrolyte complex in aqueous solution capable of electronic energy transfer. We found that the oppositely-charged complex undergoes EET both in solution and the solid state. Importantly, we have also found that the excitonic wavefunction of the acceptor polyelectrolyte changed qualitatively in the complex compared to the polyelectrolyte in isolation.

Example 6

Below we discuss our work to date with a pair of model CPEs: a cationic poly(fluorene-co-phenylene) derivative (PFPI) as the EET donor, and an anionic, regioregular poly(thiophene) derivative (PTAK) as the EET acceptor. Without being bound by theory, our results provide strong evidence that: 1) CPEs self-assemble into oppositely-charged complexes in solution that readily undergo EET, 2) complex formation simultaneously leads to emergence of new, delocalized excitonic states that are completely absent in the isolated CPE solution, 3) the CPE complex microstructure and EET rates can controllable via the charge ratio, use of ionic surfactants and excess ions, and 4) CPE complexes can be encapsulated within lipid vesicles.

Figure 22A:
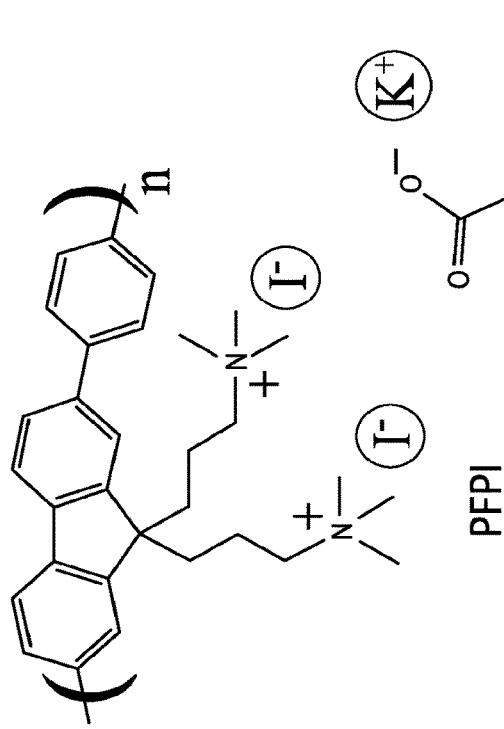
FIG. 22A-FIG. 22C depicts, in accordance with an embodiment of the invention, FIG. 22A structures of cationic PFPI and anionic PTAK.
Figure 22B:
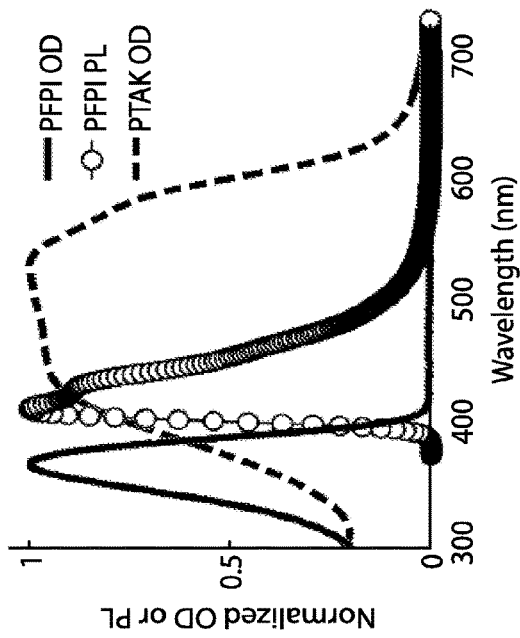
Figure 22C:
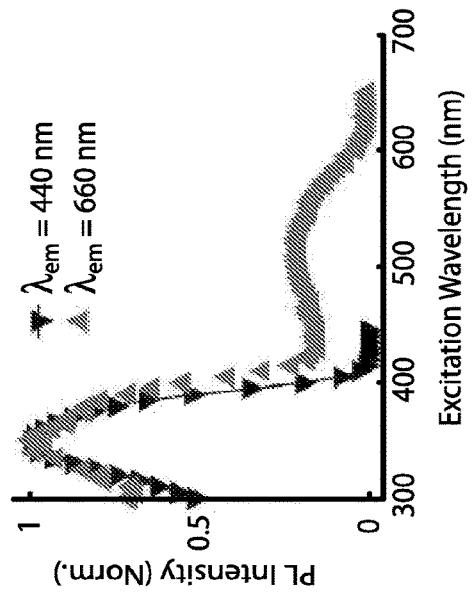

The chemical structures of PFPI and PTAK are shown in FIG. 22A. FIG. 22B makes it clear that there is spectral overlap between PFPI photoluminescence and PTAK optical density, making EET thermodynamically allowed. FIG. 22C shows photoluminescence excitation spectra of an aqueous PFPI:PTAK complex at a 1:0.25 molar charge ratio at two fixed emission wavelengths corresponding exclusively to emission from PFPI and PTAK. Without being bound by theory, the fact that the PTAK photoluminescence excitation spectrum closely tracks absorption of PFPI is very strong evidence of EET from PFPI to PTAK in solution. As the charge ratio is increased by keeping the PFPI concentration fixed and by increasing the PTAK concentration, PFPI fluorescence is progressively quenched.

Without being bound by theory, further evidence of EET from PFPI to PTAK is shown in FIG. 23A, which displays time-resolved PL decays primarily exciting in the PFPI absorption band and collecting emission where only PTAK emits. We find that complexed PTAK emission increases by two orders of magnitude relative to in isolation. Without being bound by theory, this implies that photoinduced electron transfer from PFPI to PTAK can be ruled out as the quenching mechanism for PFPI emission, as anionic states of PTAK would not give rise to increased emission in the complex. However, without being bound by theory the drastic increase in PTAK PL quantum yield cannot be explained by EET from PFPI alone. Without being bound by theory, the implication is that complex formation leads to emergent excitonic states in PTAK that are wholly absent in isolation. To further characterize this change, we have plotted normalized photoluminescence spectra of PTAK in isolation (FIG. 23B) and when complexed to PFPI (FIG. 23C) as a function of relative charge ratio. The nominal vibronic 0-0/0-1 intensity ratio is <1 for isolated PTAK and is >1 for PTAK complexed to PFPI. Without being bound by theory, together with the change in the photoluminescence quantum yield, the molecular exciton model implies that complex formation for PTAK leads to conversion of primarily H-like (inter-chain) to J-like (intra-chain) excitons. Without being bound by theory, the intra-chain exciton delocalized along the PTAK chain has the potential to participate in coherent EET; electronic coherence has previously been demonstrated for single conjugated polymer chains in solution. Without being bound by theory, coherence leads to rapid EET; we hypothesize that highly delocalized intra-chain states may significantly increase EET rates.

Without being bound by theory, we may reasonably hypothesize that the complex formation, microstructure, and thus the EET efficiency may depend on the excess ion concentration and thus the average local electric field. We have measured EET efficiencies for an aqueous PFPI:PTAK complex at a 1:0.25 charge ratio as a function of KF concentration, shown in FIG. 24. What we find is that the efficiency can vary significantly for small excess ion concentrations, and that this change is sensitive to the thermal history of complex formation. We have also found that the type of simple excess anion across the halogen series can be used to vary the EET rate (not shown).

Figure 25A:
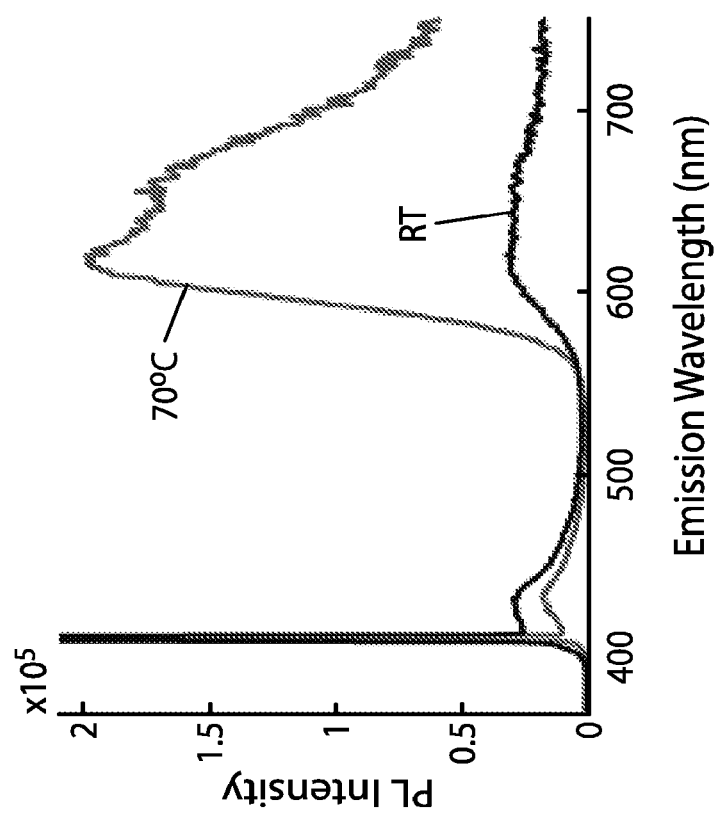
FIG. 25A-FIG. 25B depicts, in accordance with an embodiment of the invention, FIG. 25A PL of both PFPI (left) and PTAK (right) in 1:0.25 CPE complexes prepared at room temperature (RT) and 70° C.
Figure 25B:
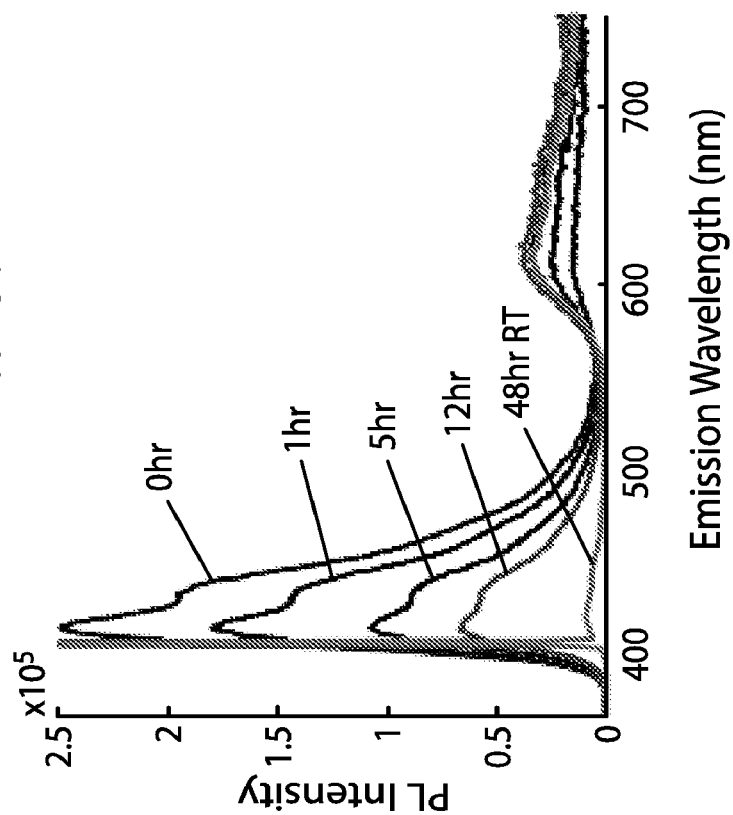

The observation that the thermal history has a strong effect on complex formation led us to investigate this further. FIG. 25A shows the PL of two CPE complexes prepared at room temperature and at 70° C. The data show that, although there is a strong enthalpic and entropic driving force to polyelectrolyte complex formation, there is a significant activation free energy barrier. Specifically, heating the complex leads to additional quenching of the PFPI (which is already quenched relative to isolated PFPI), and PTAK PL undergoes a drastic increase. Further, FIG. 25B shows that complexation exhibits relatively slow dynamics. Without being bound by theory, this suggests that we can influence the assembly process and likely the complex microstructure with a ternary agent introduced during a specific time point along the complex evolution trajectory. We note that the complex in FIG. 25B was heated for a shorter duration than in FIG. 25A, which explains the difference in PTAK PL intensity.

Figure 26A:
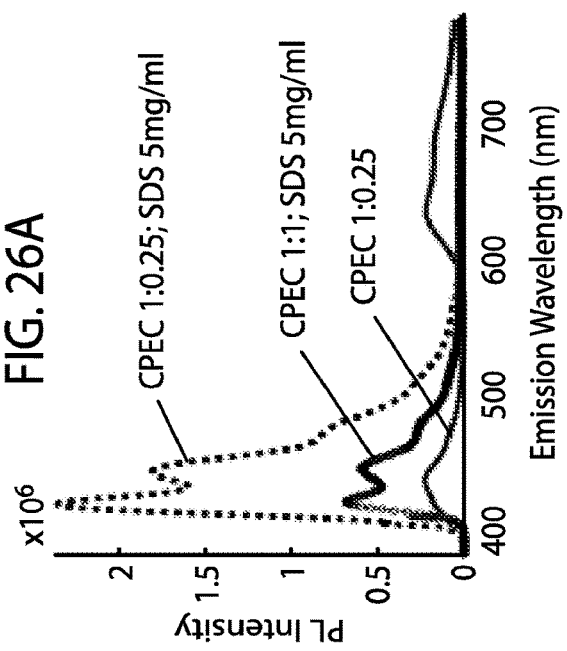
FIG. 26A-FIG. 26C depicts, in accordance with an embodiment of the invention, FIG. 26A PL of a CPE complex solution in the absence (CPEC 1:0.25) and presence (CPEC 1:0.25; SDS 5 mg/ml and CPEC 1:1; SDS 5 mg/ml) of anionic surfactant, SDS, above the critical micelle concentration. The micelle—CPE interaction can disrupt CPE complex formation, leading to highly structured PFPI PL. Raising the polyanion/polycation charge ratio partially reforms the complex, as seen via PFPI PL quenching.
Figure 26C:
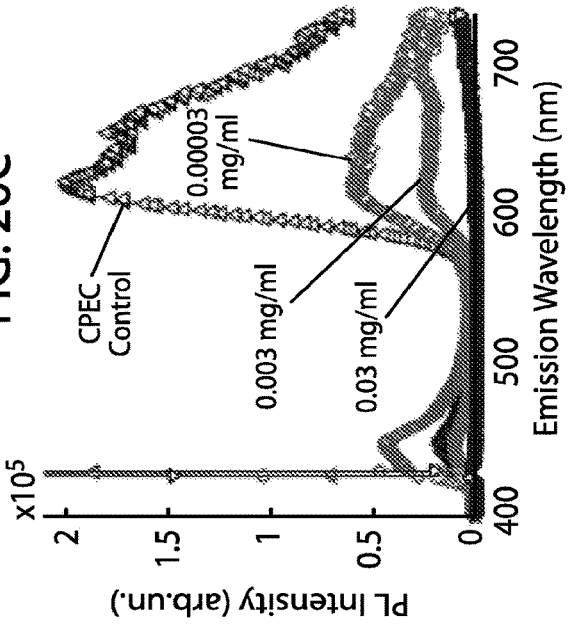
Figure 26B:
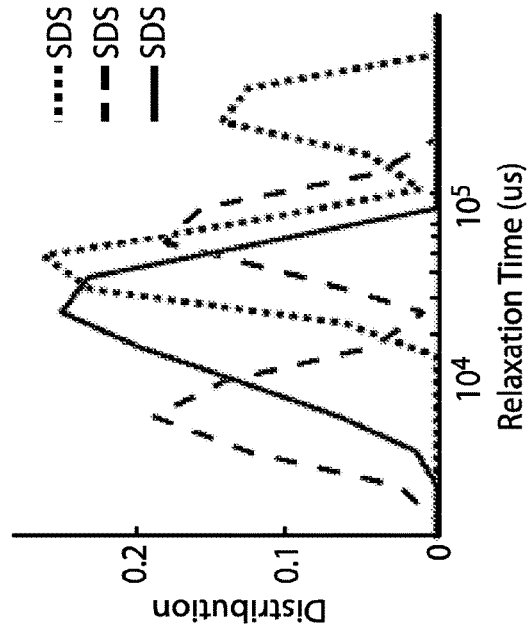

Since we are interested in assembly of panchromatic, multi-component supramolecular complexes, we have investigated ternary macromolecular interactions. Our work has focused on the influence of self-assembling ionic surfactants and dye molecules on CPE complex formation. FIG. 26A shows that micelles based on anionic surfactants can be used to decouple the CPE complex, and that the polycation/polyanion charge ratio can be used to tune the relative strength of CPE-CPE and CPE-micelle interactions. FIG. 26B shows the evolution of the macromolecular relaxation time distribution and thus complex structure extracted from dynamic light scattering (DLS) measurements using CONTIN as we pass through the micelle phase transition. We have also studied ternary complexes of two oppositely charged CPEs and a phthalocyanine-based ionic dye, which, due to its lower bandgap, serves as a natural energy acceptor relative to PTAK, thus extending the downhill EET funnel. FIG. 26C shows that varying the dye concentration for a fixed PFPI:PTAK ratio leads to nonmonotonic quenching of both PFPI and PTAK PL. Without being bound by theory, at larger concentrations, all PL is quenched presumably due to EET to the dye, which emits weakly due to H-aggregation.

Figure 27:
FIG. 27 depicts, in accordance with an embodiment of the invention, photoluminescence microscope image of 1:0.25 CPE complex encapsulated by ~ micrometer-sized vesicles. Bright white color represents fluorescence from CPEs.

Finally, we have also demonstrated the ability to encapsulate oppositely-charged CPE complexes using phospholipid-based vesicles. FIG. 27 shows a photoluminescence microscope image of a PFPI:PTAK complex at a 1:0.25 charge ratio enveloped by membranous vesicles. Spatial localization of a CPE complex constitutes the first step to encapsulation of a CPE-based artificial photosystem.

The various methods and techniques described above provide a number of ways to carry out the application. Of course, it is to be understood that not necessarily all objectives or advantages described can be achieved in accordance with any particular embodiment described herein. Thus, for example, those skilled in the art will recognize that the methods can be performed in a manner that achieves or optimizes one advantage or group of advantages as taught herein without necessarily achieving other objectives or advantages as taught or suggested herein. A variety of alternatives are mentioned herein. It is to be understood that some preferred embodiments specifically include one, another, or several features, while others specifically exclude one, another, or several features, while still others mitigate a particular feature by inclusion of one, another, or several advantageous features.

Furthermore, the skilled artisan will recognize the applicability of various features from different embodiments. Similarly, the various elements, features and steps discussed above, as well as other known equivalents for each such element, feature or step, can be employed in various combinations by one of ordinary skill in this art to perform methods in accordance with the principles described herein. Among the various elements, features, and steps some will be specifically included and others specifically excluded in diverse embodiments.

Although the application has been disclosed in the context of certain embodiments and examples, it will be understood by those skilled in the art that the embodiments of the application extend beyond the specifically disclosed embodiments to other alternative embodiments and/or uses and modifications and equivalents thereof.

Preferred embodiments of this application are described herein, including the best mode known to the inventors for carrying out the application. Variations on those preferred embodiments will become apparent to those of ordinary skill in the art upon reading the foregoing description. It is contemplated that skilled artisans can employ such variations as appropriate, and the application can be practiced otherwise than specifically described herein. Accordingly, many embodiments of this application include all modifications and equivalents of the subject matter recited in the claims appended hereto as permitted by applicable law. Moreover, any combination of the above-described elements in all possible variations thereof is encompassed by the application unless otherwise indicated herein or otherwise clearly contradicted by context.

All patents, patent applications, publications of patent applications, and other material, such as articles, books, specifications, publications, documents, things, and/or the like, referenced herein are hereby incorporated herein by this reference in their entirety for all purposes, excepting any prosecution file history associated with same, any of same that is inconsistent with or in conflict with the present document, or any of same that may have a limiting affect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

It is to be understood that the embodiments of the application disclosed herein are illustrative of the principles of the embodiments of the application. Other modifications that can be employed can be within the scope of the application. Thus, by way of example, but not of limitation, alternative configurations of the embodiments of the application can be utilized in accordance with the teachings herein. Accordingly, embodiments of the present application are not limited to that precisely as shown and described.

Various embodiments of the invention are described above in the Detailed Description. While these descriptions directly describe the above embodiments, it is understood that those skilled in the art may conceive modifications and/or variations to the specific embodiments shown and described herein. Any such modifications or variations that fall within the purview of this description are intended to be included therein as well. Unless specifically noted, it is the intention of the inventors that the words and phrases in the specification and claims be given the ordinary and accustomed meanings to those of ordinary skill in the applicable art(s).

The foregoing description of various embodiments of the invention known to the applicant at this time of filing the application has been presented and is intended for the purposes of illustration and description. The present description is not intended to be exhaustive nor limit the invention to the precise form disclosed and many modifications and variations are possible in the light of the above teachings. The embodiments described serve to explain the principles of the invention and its practical application and to enable others skilled in the art to utilize the invention in various embodiments and with various modifications as are suited to the particular use contemplated. Therefore, it is intended that the invention not be limited to the particular embodiments disclosed for carrying out the invention.

While particular embodiments of the present invention have been shown and described, it will be obvious to those skilled in the art that, based upon the teachings herein, changes and modifications may be made without departing from this invention and its broader aspects and, therefore, the appended claims are to encompass within their scope all such changes and modifications as are within the true spirit and scope of this invention.

The invention claimed is:

1. A method of conducting photosynthesis, comprising:
    providing a light-harvesting antenna (LHA), including a conjugated polyelectrolyte (CPE) complex (CPEC) having a donor CPE and an acceptor CPE, wherein the donor CPE and acceptor CPE are an electronic energy transfer (EET) donor/acceptor pair, wherein the acceptor CPE is at least one of a regiorandom poly(alkyl-carboxythiophene) (PTAK), regioregular PTAK, or a benzodithiophene derivative of PTAK; and
    using the LHA in a photosynthetic process, thereby conducting photosynthesis.

2. The method of claim 1, wherein the photosynthesis is artificial photosynthesis.

3. The method of claim 1, wherein the photosynthetic process is an artificial photosynthetic process.

4. A method of conducting photosynthesis, comprising:
    providing an artificial photosystem including one or more light-harvesting antennas (LHA) each of which having a conjugated polyelectrolyte (CPE) complex (CPEC) having a donor CPE and an acceptor CPE, wherein the donor CPE and acceptor CPE are an electronic energy transfer (EET) donor/acceptor pair, wherein the acceptor CPE is at least one of a regiorandom poly(alkyl-carboxythiophene) (PTAK), regioregular PTAK, or a benzodithiophene derivative of PTAK; and
    using the artificial photosystem in a photosynthetic process, thereby conducting photosynthesis.

5. The method of claim 4, wherein the photosynthesis is artificial photosynthesis.

6. The method of claim 4, wherein the photosynthetic process is an artificial photosynthetic process.

\* \* \* \* \*